(12) United States Patent
Nishi et al.

(10) Patent No.: US 8,916,918 B2
(45) Date of Patent: Dec. 23, 2014

(54) SEMICONDUCTOR DEVICE HAVING FIN-SHAPED FIELD EFFECT TRANSISTOR AND MANUFACTURING METHOD THEREOF

(75) Inventors: Hiroo Nishi, Tokyo (JP); Hiromitsu Oshima, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 20 days.

(21) Appl. No.: 13/439,274

(22) Filed: Apr. 4, 2012

(65) Prior Publication Data

US 2013/0264621 A1  Oct. 10, 2013

(51) Int. Cl.
*H01L 27/108* (2006.01)

(52) U.S. Cl.
USPC ...... 257/296; 257/301; 257/330; 257/E21.41; 257/E21.646

(58) Field of Classification Search
USPC .......... 257/296, 301, 330; 438/239, 257, 259, 438/270
See application file for complete search history.

(56) References Cited

U.S. PATENT DOCUMENTS

| 2005/0001252 A1* | 1/2005 | Kim et al. ...................... 257/296 |
| 2008/0079070 A1* | 4/2008 | Seo et al. ...................... 257/333 |
| 2010/0240180 A1* | 9/2010 | Jeon et al. ...................... 438/239 |
| 2011/0143509 A1 | 6/2011 | Fujimoto |
| 2011/0147834 A1 | 6/2011 | Taniguchi |

FOREIGN PATENT DOCUMENTS

| JP | 2011-129566 | 6/2011 |
| JP | 2011-129711 | 6/2011 |

\* cited by examiner

*Primary Examiner* — Fernando L Toledo
*Assistant Examiner* — Lawrence-Linh T Nguyen
(74) *Attorney, Agent, or Firm* — Young & Thompson

(57) ABSTRACT

Disclosed is a semiconductor device including: an active region defined by an element isolation region; a gate trench going across the active region to define source/drain regions on both sides thereof, respectively, and to define, between the source/drain regions, the channel region having a first, second, and third protruding portions which are arranged in a gate width direction; and a gate electrode formed in the gate trench so as to cover the channel region through a gate insulating film.

17 Claims, 37 Drawing Sheets

SEMICONDUCTOR DEVICE HAVING FIN-SHAPED FIELD EFFECT TRANSISTOR AND MANUFACTURING METHOD THEREOF

BACKGROUND OF THE INVENTION

1. Field of the Invention

The present invention relates to a semiconductor device having a fin field-effect transistor and a manufacturing method thereof.

2. Description of Related Art

Along with recent miniaturization of transistors, it becomes difficult for a conventional planer transistor to suppress short channel effect. To solve this problem, a DRAM cell transistor for which a higher level of integration is required uses so-called a trench gate transistor (buried gate transistor), as disclosed in Japanese Patent Application Laid-Open No. 2011-129566 and No. 2011-129771, in which a gate electrode is formed in a trench formed in a semiconductor substrate with an intervention of a gate insulating film, and the gate electrode is buried below the surface of the semiconductor substrate.

In the buried gate transistor as described above, forming the gate electrode in the trench and at a portion below the surface of the semiconductor substrate allows three surfaces (bottom and both side surfaces of the trench) to serve as channels. Thus, as compared to a planer transistor in which only one surface serves as the channel, a longer channel length can be obtained with a smaller area. As a result, an occupation area of the transistor can be reduced while suppressing the short channel effect. Further improvement of characteristics of such a buried gate transistor is now demanded.

SUMMARY

A semiconductor device according to the present invention includes: an active region defined by an element isolation region; a gate trench crossing the active region to define source and drain regions on both sides thereof, respectively, and to define a channel region between the source and drain regions, the channel region having a first, second, and third protruding portions arranged in a gate width direction; and a gate electrode formed in the gate trench so as to cover the channel region with an intervention of a gate insulating film.

DETAILED DESCRIPTION OF THE EMBODIMENTS

Figure 1A:
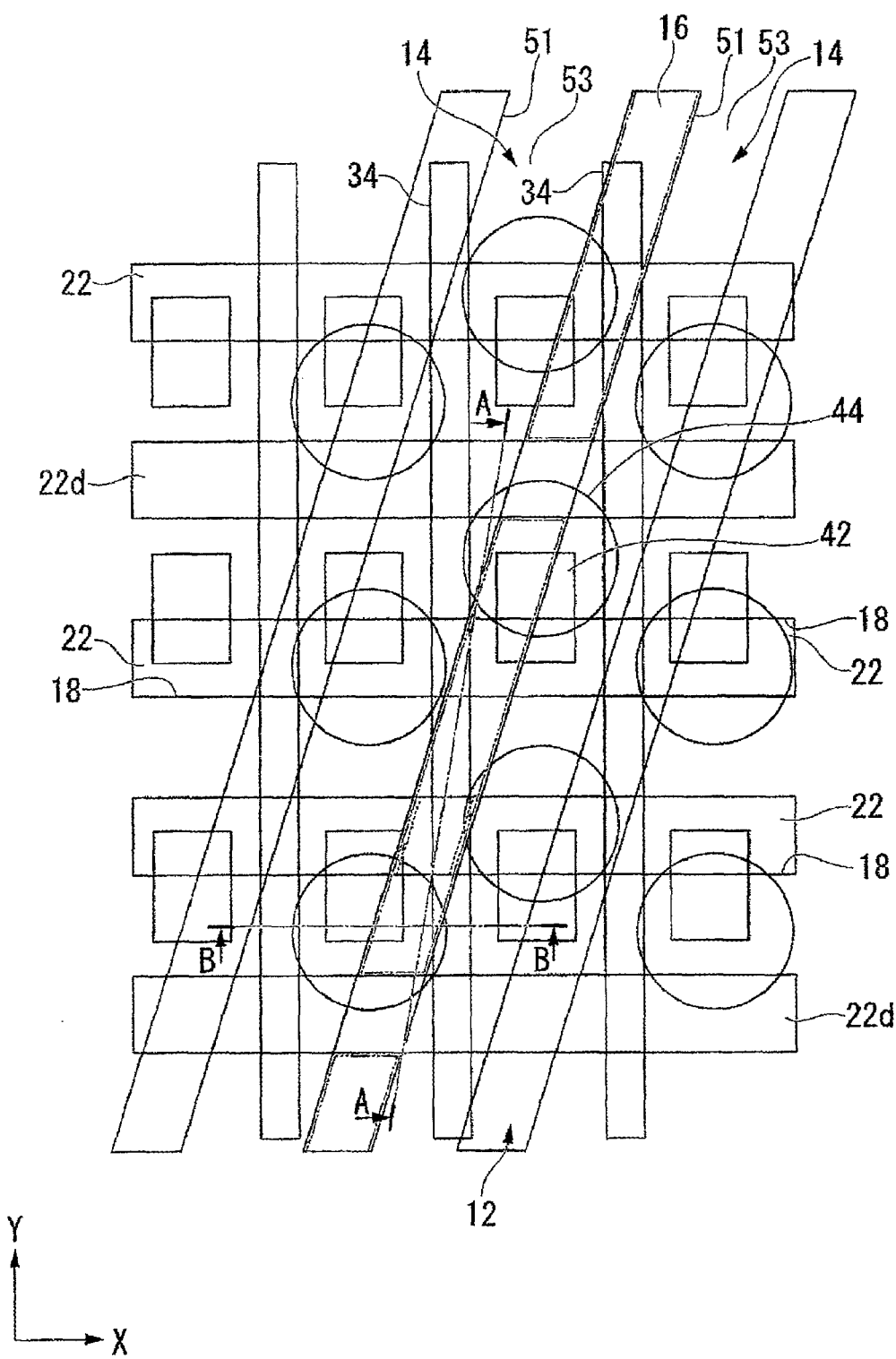
FIG. 1A is a schematic plan view of a semiconductor device according to the first embodiment of the present invention.

A semiconductor device and manufacturing method thereof of the present invention will be explained below in detail with reference to the accompanying drawings.

In the drawings used in the following description, specific parts may be enlarged for convenience to easily represent characteristics. Dimensions, ratios, and the like of constituent elements may not be equal to the actual ones. Materials, dimensions, and the like in the following description are examples, and the present invention is not limited thereto. The present invention may be appropriately modified within the scope of the invention.

Various types of fin transistors (Fin FET) having a fin-shaped channel portion have been proposed in order to achieve further suppression of the short channel effect. The following describes a semiconductor device having a fin transistor previously examined by the present inventors with reference to FIGS. 20A to 20D.

Figure 20A:
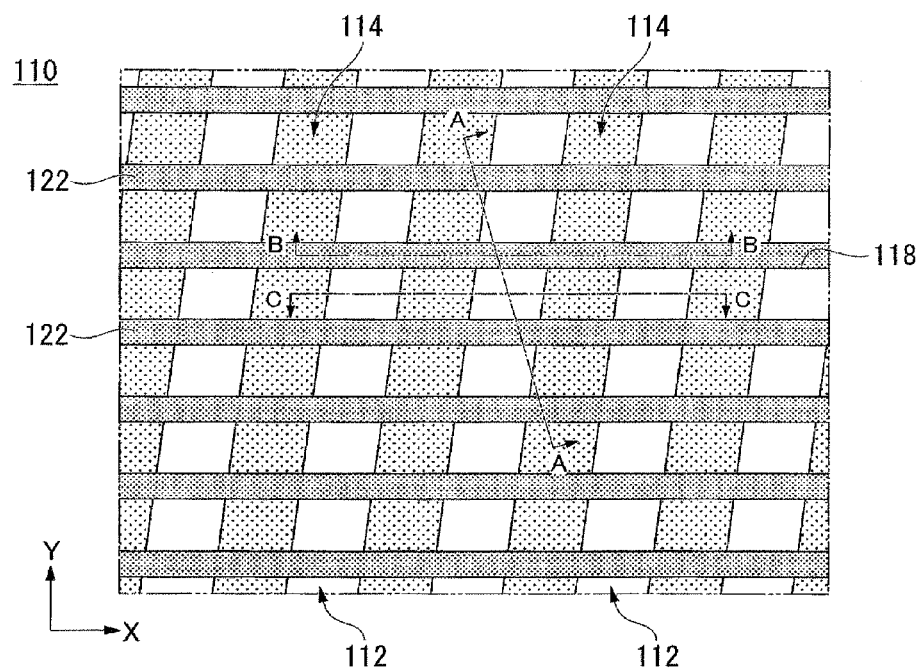
FIG. 20A is a schematic plan view of a semiconductor device that the inventors have conceived in advance.
Figure 20B:
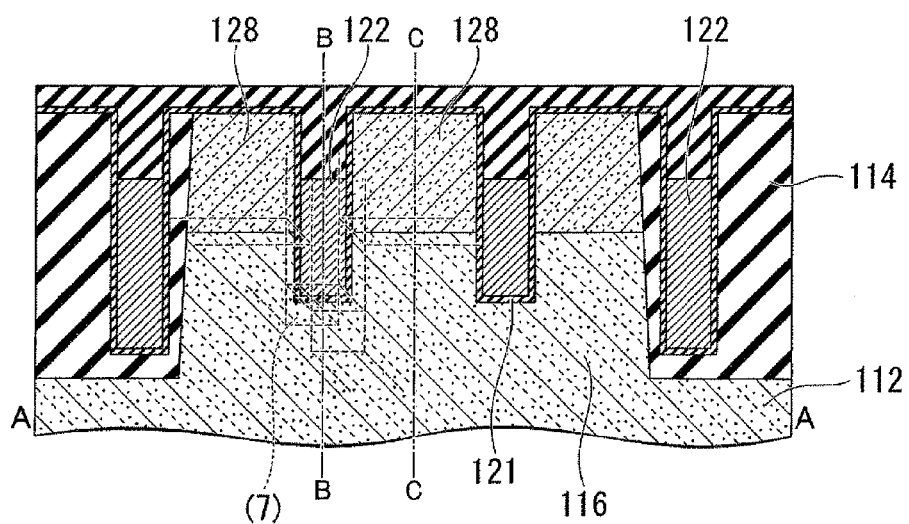
FIG. 20B is a schematic cross-sectional view taken along line A-A of FIG. 20A.

FIG. 20A is a schematic plan view of a semiconductor device 110 having a fin transistor. FIG. 20B is a schematic cross-sectional view taken along line A-A of FIG. 20A, and FIG. 20C is a schematic cross-sectional view taken along line B-B of FIG. 20A, and FIG. 20D is a schematic cross-sectional view taken along line C-C of FIG. 20A.

As illustrated in FIG. 20A, the semiconductor device 110 has an element isolation region 114 which linearly extends on a main surface of a semiconductor substrate 112 and an active region 116 which is defined by the element isolation region 114. Gate trenches 118 are formed so as to cross a direction in which the active region 116 extends. A gate electrode 122 is buried in each of the gate trench 118 with an intervention of a gate insulating film 121.

As illustrated in FIG. 20B, impurity diffusion regions 128 are formed on the main surface of the semiconductor substrate 112, and the adjacent impurity diffusion regions 128 are defined by the gate trenches 118. These impurity diffusion regions each constitute a source/drain region of a field-effect transistor.

Figure 20C:
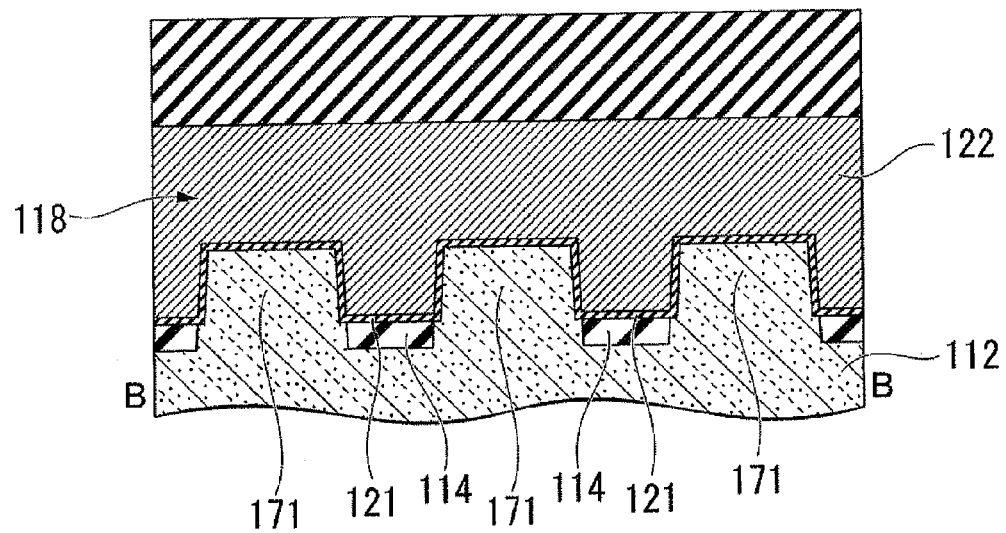
FIG. 20C is a schematic cross-sectional view taken along line B-B of FIG. 20A.
Figure 20D:
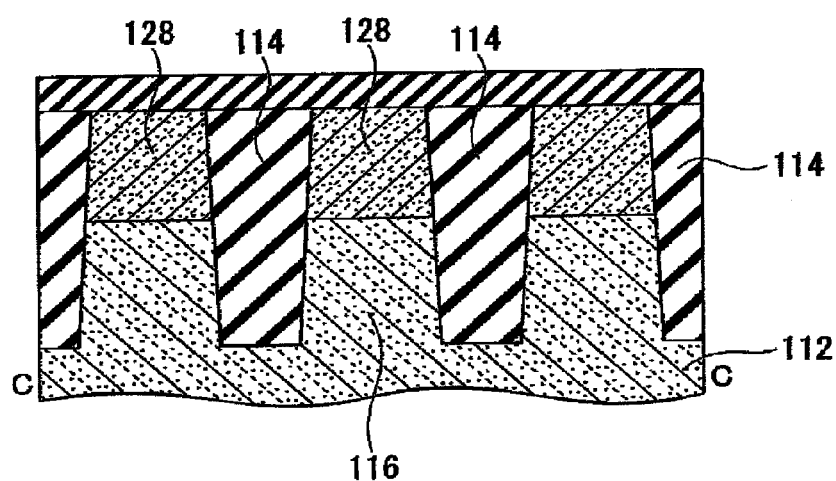
FIG. 20D is a schematic cross-sectional view taken along line C-C of FIG. 20A.

As illustrated in FIG. 20C, the semiconductor device 110 has fin-shaped channel portions 171 which are formed by utilizing a part of the semiconductor substrate 112. Each of the fin-shaped channel portions 171 is formed at a bottom portion of the gate trench 118 in a region at which the gate trench 118 and active region 116 cross each other. Each fin-shaped channel portion 171 is formed between the adjacent element isolation regions 114 at the bottom portion of the gate trench 118 and has a fin shape in which the active region 116 protrudes upward from upper surfaces of the adjacent element isolation regions 114. Upon formation of the gate trenches 118 by etching the element isolation region 114 formed of an oxide film and semiconductor substrate 112, the etching is performed at a high selection ratio for the oxide film to allow the device isolation region 114 to be formed deeper than the active region 116, thereby obtaining the fin-shaped channel portion 171.

Figure 21A:
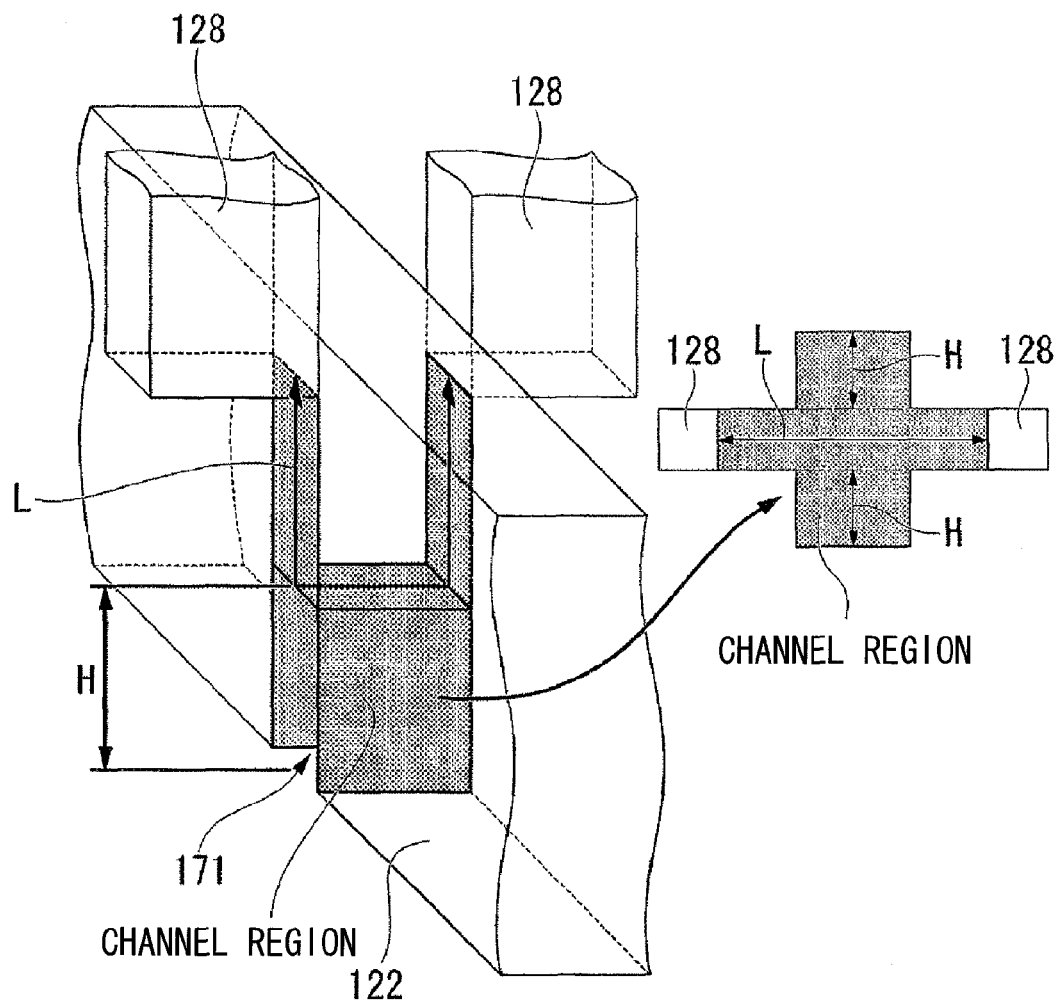
FIG. 21A is schematic perspective view illustrating a shape of the channel portion and its surrounding portion of the fin transistor constituting the semiconductor device that the inventors have conceived in advance.
Figure 21B:
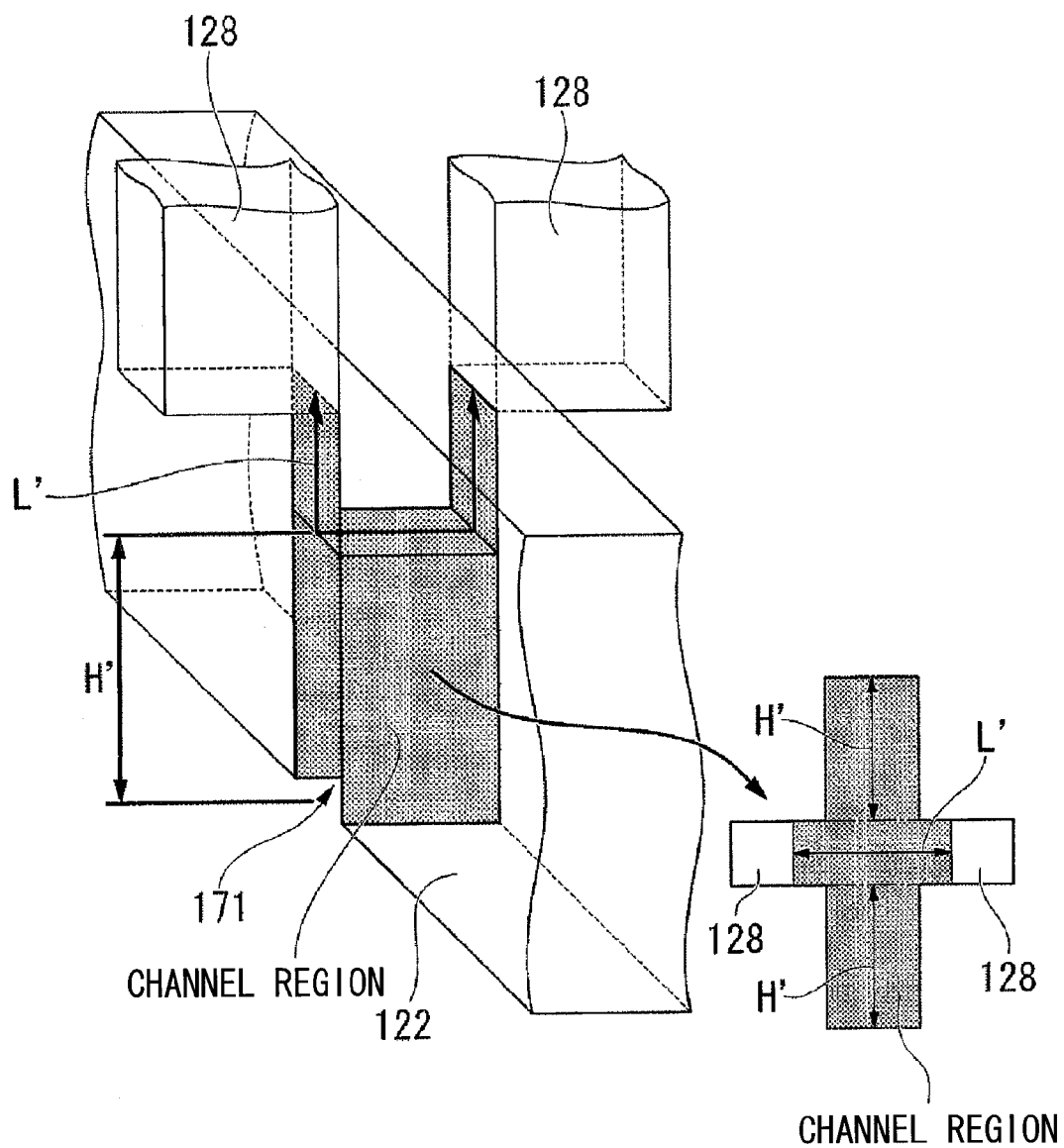
FIG. 21B is schematic perspective view illustrating a shape of the channel portion and its surrounding portion of the fin transistor constituting the semiconductor device that the inventors have conceived in advance.

FIGS. 21A and 21B are schematic perspective views each illustrating a shape of the channel portion 171 of the fin transistor constituting the semiconductor device 110 described using FIGS. 20A to 20D and its surrounding portion. In FIGS. 21A and 21B, for convenience of easy understanding, only the gate electrode 122, impurity diffusion region 128, and channel portion 171 constituting the characterizing portion of the present invention are extracted from the constituent elements described in FIGS. 20A to 20D and partly enlarged for illustration.

In a MIS-type field-effect transistor, a gate width as viewed in a carrier drift direction at operating time corresponds to a channel width. Increasing this channel width is effective for increasing operating current of the field-effect transistor.

In a planer transistor, the gate electrode is formed on a substrate surface, so that the channel region is defined by one planar surface. On the other hand, in the fin transistor as illustrated in FIG. 21A, the channel portion 171 having the fin-shaped substrate which protrudes upward in a convex shape is formed. In addition to the upper surface of the channel portion 171, side surfaces thereof assume an MIS structure to constitute the channel region. FIG. 21A also illustrates a developed view of the portion (shaded part in the drawing) serving as the channel region including the MIS structure part. As is clear from the developed view, in the fin transistor, not only a region corresponding to a gate length L, i.e., a region spanning from the bottom portion of the impurity diffusion region 128 to the upper surface of the channel portion 171, but also a region corresponding to a height H of the channel portion 171, i.e., side surfaces of the channel portion 171 serve as the channel region. In other words, in the cross-sectional view of the gate electrode 122 illustrated in FIG. 20C, the longer a boundary of an interface between the gate electrode film 121 and active region 116 becomes, the wider the channel width is. That is, in the fin transistor previously examined by the present inventors, the boundary is longer by an amount corresponding to the sidewalls of the channel portion 171. The transistor having a wider channel width can increase the operating current. Thus, use of such a fin field-effect transistor allows improvement of driving capability.

The examination of the present inventors have clarified that there exist in the semiconductor device as described above the following problems to be solved in order to further improve the driving capability of the fin transistor.

According to the examination of the present inventors, it has been found effective for further improvement of the operating current of the fin transistor to increase the height of the fin-shaped channel portion (increasing the length of the channel portion side wall) and to ensure a wide channel width. However, as illustrated in FIG. 21B, only the increase in the height of the channel portion (for example, a height H of the channel portion in FIG. 21A is increased to H') brings the top of the channel portion close to the source/drain region (impurity diffusion region 128), thereby reducing the channel length (channel length L>L'), which results in an increase in an S-factor due to the short channel effect. The increase in the S-factor may disadvantageously cause a reduction in a transistor switching rate or an increase in an off-leak current.

The present inventors have further examined a structure in which the lower end of the channel portion side wall is disposed at a deeper position with the position of the channel portion top unchanged (in other words, with the channel length unchanged) so as to increase the height of the fin. However, in this method, the lower end of the channel portion side wall is separated further away from the source/drain region 128. The examination of the present inventors has revealed the following problems related to such a structure. That is, when the transistor is switched from an ON state to an OFF state, carriers generated in a strong inversion region (channel region) directly below the gate electrode transiently drift or diffuse to the adjacent source/drain region to be collected. However, some of the carriers that have been generated in the strong inversion region separated away from the source/drain region are not collected in the source/drain region but diffuse into a well (well-implantation carriers). It has been found that such carriers may cause characteristics of other elements in the same well to vary. For example, it has been found that, in a case of a DRAM having a storage capacitor in the same active region, the carriers implanted into the well can be a factor inverting a storage state of the capacitor.

Thus, extending downward the lower end of the channel portion side wall as described above so as to increase the height of the channel portion and channel width results in an increase in the number of channel regions formed in positions further away from the source/drain region, which may cause a variation in the element characteristics.

As described above, it has been found that there is room for improvement in further enhancing the driving capability of the previously examined fin field-effect transistor having an advantage in increasing the operating current.

(Semiconductor Device)

A structure of a DRAM to be formed by employing a semiconductor device according to a first embodiment of the present invention will be described with reference to FIGS. 1A to 1D.

Figure 1B:
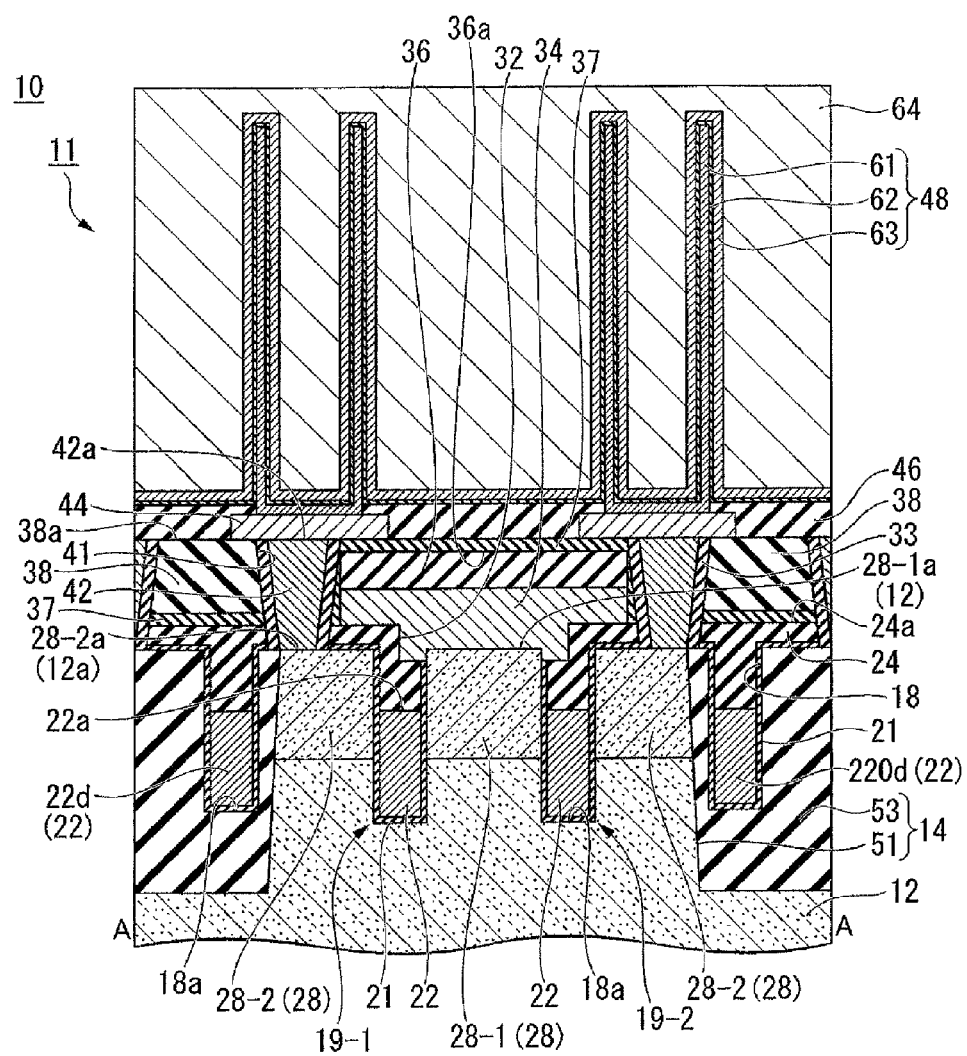
FIG. 1B is a schematic cross-sectional view taken along line A-A of FIG. 1A.
Figure 1C:
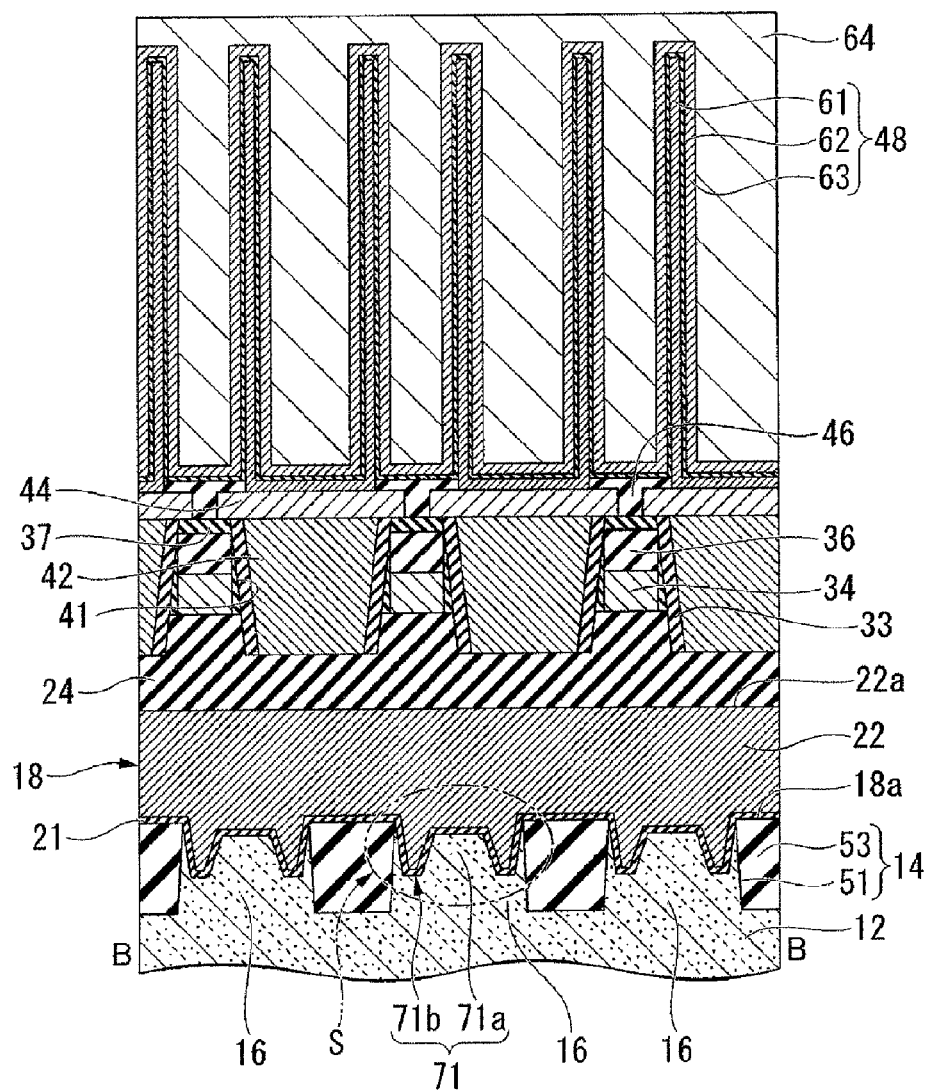
FIG. 1C is a schematic cross-sectional view taken along line B-B of FIG. 1A.
Figure 1D:
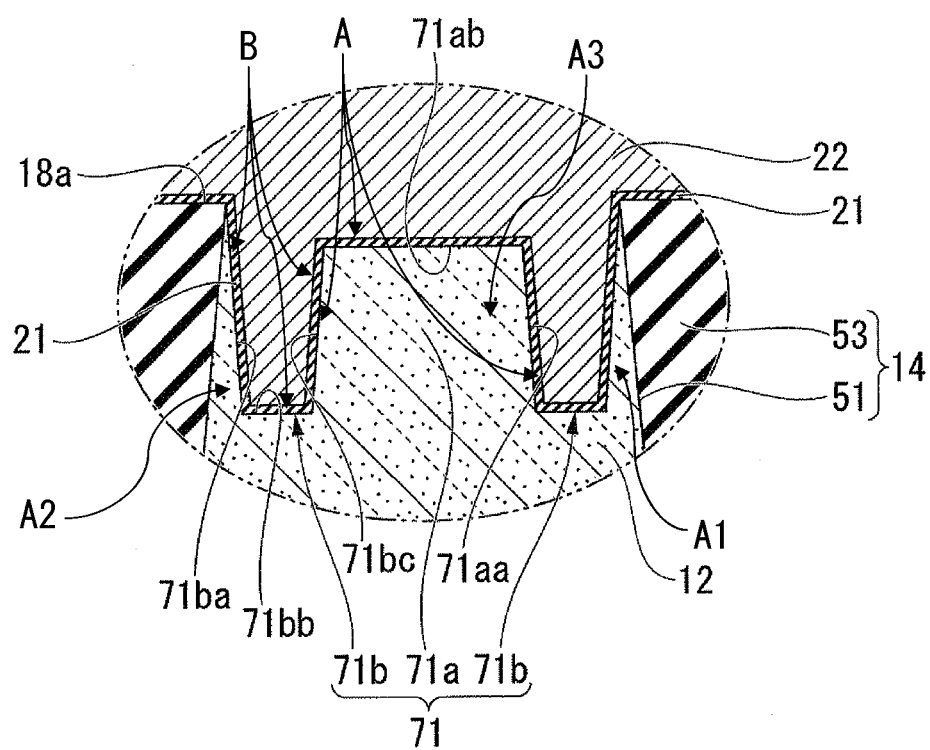
FIG. 1D is an enlarged view of structures of a bottom portion of a gate trench illustrated in FIG. 1C and its surrounding portion (portion enclosed by circle S of FIG. 1C)

FIG. 1A is a schematic plan view of the DRAM to be formed by employing the semiconductor device according to the first embodiment of the present invention. FIG. 1B is a schematic cross-sectional view taken along line A-A of FIG. 1A. FIG. 1C is a schematic cross-sectional view taken along line B-B of FIG. 1A. FIG. 1D is an enlarged view of structures of a bottom portion of a gate trench illustrated in FIG. 1C and its surrounding portion (portion enclosed by circle S of FIG. 1C).

In FIGS. 1A, 1C, and 1D, components are partly omitted for an easy view of characterizing part of the semiconductor device.

As illustrated in FIGS. 1A to 1D, a semiconductor device 10 of the present embodiment has a field-effect transistor. The field-effect transistor includes: an active region 16 which is defined by element isolation regions 14 so as to extend in a first direction on a main surface 12a of a semiconductor substrate 12; gate trenches 18 that traverse the active region 16 along the first direction on an upper surface of the active region 16 so as to divide the active region 16 into two source/drain regions and each have a bottom portion whose cross-sectional shape has a downward protruding portion and an upward protruding portion which are continuously formed as viewed along the first direction; and gate electrodes 22 that are buried in each of the gate trenches 18 included in the active region 16 through a gate insulating film 21.

Some of the gate electrodes 22, which are referred to as gate electrode 22d, are disposed so as not to overlap capacitive contact plugs 42 to be described later as viewed from above. The gate electrodes 22 each have a function of element isolation on the active region 16 extending in the first direction and receive application of a voltage different from a voltage to be applied to the buried gate electrodes 22 at operating time.

In FIGS. 1A to 1D, a DRAM (Dynamic Random Access Memory) is taken as an example of the semiconductor device of the present embodiment. FIG. 1A illustrates an example of a layout of a memory cell array 11 of the DRAM. The DRAM to be described in the present embodiment is provided in $6F^2$ cell disposition (F is a minimum processing dimension), as illustrated in FIG. 1A.

In FIG. 1A, Y-direction represents an extending direction of a bit line 34, and X-direction represents an extending direction (second direction) of the gate electrode perpendicular to Y-direction. The gate electrode 22 extending in X-direction functions as a word line.

For descriptive convenience, FIG. 1A illustrates, on the same planar surface, only the semiconductor substrate 12, the element isolation region 14, the active region 16, the gate trench 18, the gate electrode 22, a bit line 34, the capacitive contact plug 42, and a capacitive contact pad 44 and omits illustration of constituent elements of the memory cell array 11 other than the above. FIG. 1B schematically illustrates the bit line 34 of FIG. 1A.

The semiconductor device 10 in the present embodiment has a memory cell region in which the memory cell array 11 of FIGS. 1A and 1B is formed and a surrounding structure (surrounding circuit) region (not illustrated) arranged around the memory cell region.

As illustrated in FIGS. 1A and 1B, the memory cell array provided in the semiconductor device 10 has the semiconductor substrate 12, the element isolation region 14, the active region 16, the gate trench 18, transistors 19-1 and 19-2, the gate insulating film 21, the gate electrode 22 which is a buried gate electrode, a buried insulating film 24, the source/drain region including an impurity diffusion region 28, an opening portion 32, the bit line 34, a cap insulating film 36, a liner film 37, an interlayer insulating film 38, a capacitive contact hole 41, the capacitive contact plug 42, the capacitive contact pad 44, an etching stopper film 46, and a capacitor 48.

As illustrated in FIG. 1A, the semiconductor substrate 12 is a substrate formed into a plate-like shape. For example, a p-type monocrystalline silicon substrate may be used as the semiconductor substrate 12.

The following description will be made by taking the p-type monocrystalline silicon substrate as an example of the semiconductor substrate 12.

As illustrated in FIG. 1A, in the memory cell region, an element isolation trench 51 is formed on the semiconductor substrate 12. The element isolation trench 51 is formed so as to extend in a line in a direction (first direction) having a predetermined angle with respect to Y-direction of FIG. 1A. Further, the element isolation trench 51 is formed in multiple numbers at a predetermined interval along X-direction of FIG. 1A. The depth of the element isolation trench 51 may be, e.g., 250 nm to 300 nm.

An element isolation insulating film 53 is buried into the element isolation trench 51 and whereby the element isolation region 14 including the element isolation insulating film 53 and element isolation trench 51 is formed. That is, the element isolation region 14 is formed in a line so as to extend in the first direction. The element isolation region 14 is formed in multiple numbers at a predetermined interval along X-direction. The active region 16 is defined in X-direction by the linearly formed element isolation region 14.

As the element isolation insulating film 53, a silicon oxide film and a silicon nitride film formed by a CVD (Chemical Vapor Deposition) method or an HDP (High Density Plasma) method or a silicon oxide film formed by a spin-coating method may be used in a single-layer or multiple-layer structure.

Further, as illustrated in FIG. 1A, a plurality of the gate trenches 18 are formed on the semiconductor substrate 12 so as to extend in X-direction. The gate trenches 18 are each formed so as to go across a plurality of the active regions 16 as viewed from above and to extend in a line. Further, each gate trench 18 traverses the active region 16 along the first direction on the upper surface of the active region 16 so as to divide the active region 16 into two source/drain regions. The interval between adjacent gate trenches 18 is set to a predetermined value. That is, the gate trenches 18 are periodically arranged in Y-direction.

As illustrated in FIG. 1B, the gate electrodes 22 are provided in the respective gate trenches 18 periodically arranged in Y-direction. Among the plurality of gate electrodes 22, the gate electrodes 22 each arranged at a position partly overlapping the capacitive contact plug 42 as viewed from above function as the gate electrodes of the transistors 19-1 and 19-2 and the gate electrodes 22d each arranged at a position not overlapping the capacitive contact plug 42 as viewed from above do not function as the gate electrodes of the transistors. That is, the gate electrodes 22d are each provided as a dummy gate electrode for element isolation on the active region 16 in the first direction and each receive application of a voltage different from a voltage to be applied to the gate electrodes 22 at operating time. Thus, the active region 16 has an island structure whose X-direction is defined by the element isolation region 14 and whose first direction in which the active region 16 extends is defined by the electrode 22d.

The depth of the gate trench 18 is shallower than that of the element isolation trench 51. In a case where the depth of the element isolation trench 51 is 250 nm to 350 nm, the depth of the gate trench 18 may be set to, e.g., 150 nm to 200 nm.

Further, as illustrated in FIG. 1B, the gate insulating film 21 is formed so as to cover the side and bottom surfaces of the gate trench 18 and a part of an upper surface 12a of the semiconductor substrate 12. For example, as the gate insulating film 21, a single-layered silicon oxide film ($SiO_2$ film), a single-layered silicon oxynitride film (SiON film), a laminated film obtained by laminating the silicon nitride film (SiN film) on the silicon oxide film ($SiO_2$ film), or the like may be used.

In a case where the single-layered silicon oxide film is used as the gate insulating film 21, the thickness of the gate insulating film 21 may be set to, e.g., 3 nm to 10 nm.

Further, as illustrated in FIG. 1B, the gate electrode 22 is formed so as to fill a lower part of the gate trench 18 therewith through the gate insulating film 21. As a result, an upper surface 22a of the gate electrode 22 is located at a lower position than the main surface 12a of the semiconductor substrate 12.

The gate electrode 22 may have a configuration obtained by sequentially laminating a first conductive film (not illustrated) and a second conductive film (not illustrated). In this case, a titanium nitride film and a tungsten film may be used as the first and second conductive films, respectively.

As illustrated in FIG. 1B, the transistors 19-1 and 19-2 of the present embodiment are each a buried gate transistor and each roughly include the gate insulating film 21, the gate electrode 22, the buried insulating film 24, and the source/drain region including the impurity diffusion region 28.

The transistors 19-1 and 19-2 are disposed adjacent to each other. A bit line to be described later is electrically connected to one source/drain region of each of the field-effect transistors 19-1 and 19-2.

Further, as illustrated in FIG. 1B, the buried insulating film 24 is provided so as to fill therewith the gate trench 18 in which the gate insulating film 21 and gate electrode 22 are formed and to cover the main surface 12a of the semiconductor substrate 12. As a result, the buried insulating film 24 covers the upper surface 22a of the gate electrode 22.

The buried insulating film 24 need not necessarily cover the main surface 12a. In such a case, a configuration may be employed in which the upper end of the buried insulating film 24 is made to protrude slightly from the main surface 12a and is set at substantially the same level as the upper surface of the gate insulating film 21 formed on the main surface 12a. A silicon nitride film may be used as the buried insulating film 24.

Further, as illustrated in FIG. 1B, the impurity diffusion region 28 is formed in the main surface 12a of the semiconductor substrate 12 at a portion between the adjacent gate trenches 18. More specifically, the impurity diffusion region 28 is formed on both sides of the gate electrode 22 at an upper portion within the active region 16. An upper surface 28a of the impurity diffusion region 28 is set at substantially the same level as the main surface 12a of the semiconductor substrate 12.

In a case where the semiconductor substrate 12 is the p-type monocrystalline silicon substrate, the impurity diffusion region 28 is formed by ion-implanting an n-type impurity into the semiconductor substrate 12.

The capacitive contact plug constituting a capacitor to be described later is electrically connected to the other source/drain region of each of the field-effect transistors 19-1 and 19-2.

Hereinafter, the impurity diffusion region 28 which is connected from below to the bit line 34 and functions as a common source region for the transistors 19-1 and 19-2 is referred to as a first impurity diffusion region 28-1, and the impurity diffusion region 28 which is connected from below to the capacitive contact plug 42 and functions as a common drain region for the transistors 19-1 and 19-2 is referred to as a second impurity diffusion region 28-2.

As illustrated in FIG. 1B, the interlayer insulating film 38 is formed so as to cover an upper surface 24a of the buried insulating film 24 through the liner film 37. For example, as the interlayer insulating film 38, a silicon oxide film (SiO$_2$ film) formed by a CVD method or an SOG (Spin on Grass) film (silicon oxide film) formed by a spin-coating method may be used.

Further, as illustrated in FIG. 1B, the opening portion 32 is formed above the first impurity diffusion region 28-1 by penetrating the interlayer insulating film 38 and a part of the buried insulating film 24 formed on the main surface 12a. As a result, an upper surface 28-1a of the first impurity diffusion region 28-1 is exposed. The opening portion 32 is formed in a line perpendicular to the extending direction (X-direction of FIG. 1A) of the gate trench 18.

Further, as illustrated in FIG. 1B, the bit line 34 is partly buried in the opening portion 32 so as to form a bit line contact portion and extends in Y-direction, contacting the upper surface 24a of the buried insulating film 24 and the upper surface of the element isolation region 14. A bottom surface of the bit line 34 at the bit line contact portion contacts the upper surface 28-1a of the first impurity diffusion region 28-1. As a result, the bit line 34 is electrically connected to the first impurity diffusion region 28-1.

Examples of a material of the bit line 34 include: a laminated film obtained by sequentially laminating a polysilicon film, a titanium silicide film, a nitride titanium film, a tungsten silicide film, and a tungsten film; a laminated film obtained by sequentially laminating the above metal films without forming the polysilicon film; and the like.

Further, as illustrated in FIG. 1B, the cap insulating film 36 is formed so as to cover an upper surface of the bit line 34. The cap insulating film 36 protects the upper surface of the bit line 34 and functions as an etching mask used when a base material (conductive film) is subjected to patterning by anisotropic etching (more specifically, dry etching). As the cap insulating film 36, a laminated film obtained by sequentially laminating a silicon nitride film (SiN film) and a silicon oxide film (SiO$_2$ film) may be used. An upper surface 36a of the cap insulating film 36 is set at substantially the same level as an upper surface 38a of the interlayer insulating film 38.

Further, as illustrated in FIG. 1B, the liner film 37 is formed so as to cover a side surface of the bit line 34, the cap insulating film 36, and buried insulating film 24. The liner film 37 also has a function of protecting the side wall of the bit line 34. As the liner film 37, a single-layered silicon nitride film (SiN film) or a laminated film obtained by sequentially laminating the silicon nitride film and silicon oxide film (SiO$_2$ film) may be used.

Further, as illustrated in FIG. 1B, the capacitive contact hole 41 is formed so as to penetrate the interlayer insulating film 38, the liner film 37, and the buried insulating film 24 to expose a part of an upper surface 28-2a of the second impurity diffusion region 28-2.

The capacitive contact plug 42 is buried in the capacitive contact hole 41 through a side wall nitride film formed of nitride silicon. A bottom surface of the capacitive contact plug 42 contacts a part of the upper surface 28-2a of the second impurity diffusion region 28-2.

As a result, the capacitive contact plug 42 is electrically connected to the second impurity diffusion region 28-2. An upper surface 42a of the capacitive contact plug 42 is set at substantially the same level as the upper surface 38a of the interlayer insulating film 38 and the upper surface 36a of the cap insulating film 36. The capacitive contact plug 42 may have a laminated structure obtained by sequentially laminating a nitride titanium film and a tungsten film.

Further, as illustrated in FIG. 1B, the capacitive contact pad 44 is formed on the upper surface 38a of the interlayer insulating film 38 so as to be partly connected to the upper surface 42a of the capacitive contact plug 42. Further, the capacitive contact pad 44 is connected with a lower electrode 61 constituting a capacitor 48 to be described later. As a result, the capacitive contact pad 44 electrically connects the capacitive contact plug 42 and the lower electrode 61.

As illustrated in FIG. 1A, the capacitive contact pads 44 each have substantially a disk shape as viewed from above and are arranged at staggered positions with respect to the capacitive contact plug 42 in X-direction. The capacitive contact pads 44 are periodically arranged in Y-direction between the adjacent bit lines 34.

That is, the capacitive contact pads 44 are repeatedly arranged in X-direction at staggered positions in such a manner that the centers thereof are positioned alternately on the gate electrode 22 and above the side surface of the gate electrode 22. In other words, the capacitive contact pads 44 are arranged in a zigzag pattern in X-direction.

As illustrated in FIG. 1B, the etching stopper film 46 which is a silicon nitride film is formed on the upper surface 38a of the interlayer insulating film 38 so as to surround the outer periphery of the capacitive contact pad 44.

The capacitor 48 is provided for each capacitive contact pad 44. One capacitor 48 has one lower electrode 61, a common capacitive insulating film 62 for a plurality of the lower electrodes 61, and an upper electrode 63 which is a common electrode for the plurality of lower electrodes 61. The capacitor 48 and one field-effect transistor constitute the memory cell.

In the present embodiment, a plurality of the memory cells are arranged in an array on the main surface 12a of the semiconductor substrate 12 along the first direction and the second direction intersecting the first direction. The plurality of memory cells arranged in the first direction are electrically connected to each other by the bit line 34, and the plurality of memory cells arranged in the second direction share the gate electrode 22 of the field-effect transistor.

The lower electrode 61 is formed on the capacitive contact pad 44 to be connected thereto. The lower electrode 61 is has a crown shape. The capacitive insulating film 62 is formed so as to cover surfaces of the plurality of lower electrodes 61 exposed from the etching stopper film 46 and an upper surface of the etching stopper film 46. The upper electrode 63 is formed so as to cover a surface of the capacitive insulating film 62. A plate electrode 64 formed of Si is formed so as to fill therewith between the plurality of upper electrodes 63.

The capacitor 48 having the configuration described above is electrically connected to the second impurity diffusion region 28-2 through the capacitive contact pad 44.

In the present embodiment, a configuration may be adopted in which the upper electrode is formed so as to cover the surface of the capacitive insulating film 62 and disposed so as to fill therewith between the plurality of lower electrodes 61. The upper surface of the upper electrode is located above the upper ends of the plurality of lower electrodes 61. Further, in the case where the upper electrode is disposed so as to fill therewith between the plurality of lower electrodes 61, an interlayer insulating film covering the upper surface of the upper electrode, a contact plug provided in the interlayer insulating film, a wiring connected to the contact plug, and the like are additionally provided to constitute the DRAM.

The following describes in detail a gate structure that the field-effect transistor 19 of the semiconductor device according to the present embodiment has. The cross-section of FIG. 1C is a cross-section along the extending direction of the gate trench 18. In other words, the impurity diffusion regions 28 each serving as the source/drain region of the transistor is disposed on the near side and on the far side of FIG. 1C. In still other words, a boundary between the gate insulating film 21 and the active region 16 at a specific portion S of FIG. 1C represents the gate width direction of the field-effect transistor 19. The active region 16 below the boundary serves as the channel region.

A gate trench 18 of the semiconductor device according to the present embodiment goes across the active region 16 to define the impurity diffusion region 28 serving as the source/drain region on both sides thereof and to define, between the impurity diffusion regions 28 each serving as the source/drain region, the channel region having a first protruding portion A1, a second protruding portion A2, and a third protruding portion A3 which are arranged in the gate width direction. The gate electrode 22 is formed in the gate trench 18 so as to cover the channel region through the gate insulating film 21.

That is, of a bottom portion 18a of the gate trench 18, a region at which the active region 16 and the gate trench 18 intersect each other has a cross-sectional shape having a first protruding portion 71b protruding downward and a second protruding portion 71a protruding upward which are continuously-formed as viewed along a carrier drift direction (first direction) at operating time of the transistors 19-1 and 19-2 (when a potential difference is applied between the source and drain in a state where a potential is applied to the gate electrode 22 to generate an inversion layer in the active region 16).

Further, as illustrated in FIG. 1D, the channel region of the transistor according to the present embodiment has a structure in which the first and second protruding portions A1 and A2 are disposed on both sides of the third protruding portion A3, respectively. In other words, the first protruding portion A1, the third protruding portion A3, and the second protruding portion A2 are disposed in the order mentioned in the gate width direction. Instill other words, as viewed in the gate width direction, the third protruding portion A3 is formed between the first and second protruding portions A1 and A2. In yet still other words, in a sectional view, the channel portion is formed into substantially a W-like shape.

The third protruding portion A3 of the transistor according to the present embodiment corresponds to the fin-shaped channel portion 171 of the fin field-effect transistor previously examined by the present inventors which has been described using FIGS. 20A to 20D and FIGS. 21A and 21B. The channel region of the transistor according to the present embodiment has the first and second protruding portions A1 and A2 as well as the third protruding portion A3 corresponding to the fin-shaped channel portion. The transistor according to the present embodiment thus has the first and second protruding portions A1 and A2 in addition to the third protruding portion A3 corresponding to the fin-shaped channel region and whereby the channel width thereof can be increased even without changing the height of the third protruding portion A3. As described above, in the case where the channel width is increased only by increasing the height of the fin-shaped channel portion (third protruding portion A3 in the present embodiment), the channel length is reduced when the length of the top portion is reduced and the channel region is separated away from the source/drain region when the length of the foot portion is increased. In either case, there is a fear of degradation of element characteristics. On the other hand, in the semiconductor device according to the present embodiment, forming the first and second protruding portions A1 and A2 in addition to the third protruding portion A3 allows an increase in the channel region while maintaining the channel length (without reducing the depths of the protruding portions from the substrate surface) without increasing the distance between the channel portion and source/drain region 28. That is, as compared to the fin transistor having only the third protruding portion A3, the channel width can be increased without disadvantageously changing the element characteristics. Further, the channel width can be changed according to the shapes of the three protruding portions A1 to A3, so that it becomes easier to meet various demands on electric characteristics of the field-effect transistor.

In terms of avoiding the channel length from being reduced, the depth of the third protruding portion A3 contributing to the dimension of the channel length is preferably equivalent to or greater than the depths of the first and second protruding portions A1 and A2. In other words, it is preferable that the top portion of the third protruding portion A3 that is closest to the main surface 12a of the semiconductor substrate 12 is disposed at a position more away from the main surface 12a of the semiconductor substrate 12 than the lower surfaces of the impurity diffusion region 28 and disposed at a depth position equivalent to or deeper than the top portions of the first and second protruding portions A1 and A2. This prevents the channel length of the transistor from being reduced to thereby suppress an increase in the S-factor due to the short channel effect.

Further, in terms of preventing the distance between the channel portion and source/drain region 28 from being increased, the depths of the first and second protruding portions A1 and A2 are preferably equivalent to or smaller than the depth of the third protruding portion A3. In other words, it is preferable that the top portions of the first and second protruding portions A1 and A2 that are closest to the main surface 12a of the semiconductor substrate 12 are disposed at depths position equivalent to or shallower than the top portion of the third protruding portion A3. This can reduce the number of the channel regions disposed away from the source/drain region 28 of the transistor to make it easier for carriers transiently generated from the channel region when the transistor is switched from an ON state to an OFF state to be collected in the source/drain region, thereby suppressing a variation in the element characteristics.

Further, in the present embodiment, side wall portions of the first and second protruding portions A1 and A2 are preferably inclined. In other words, side surfaces 71ba of a pair of concaves 71b on the element isolation region 14 side are preferably inclined. In still other words, it is preferable that each of the side walls of the first and second protruding portions A1 and A2 and the main surface 12a of the semiconductor substrate 12 do not form right angles. Inclining the side wall portions of the first and second protruding portions A1 and A2 makes it easier for the active region 16 to be formed between each of the side wall portions and element isolation region 14, thereby making it easy to ensure a wide channel region.

Further, in the present embodiment, a cross-sectional shape of the concave 71b as viewed in the drift direction preferably has a U-like shape obtained by folding the side wall of the concave 71b at a minimum point corresponding to the bottom portion of concave 71b.

As described above, one of the features of the semiconductor device 10 according to the present embodiment resides in the cross-sectional shape of a boundary portion between the gate insulating film 21 and the active region 16 as viewed in the drift direction at the operating time of the field-effect transistor having the above configuration. That is, as illustrated in FIG. 1D which is a cross-sectional view as viewed in the drift direction, the boundary line between the gate insulating film 21 and the active region 16 (semiconductor substrate 12) includes not only a boundary line A (conventional fin-shaped channel portion) corresponding to a front surface of a convex 71a but also a boundary line B corresponding to a surface including a bottom portion 71bb and side surface 71ba of the concave 71b. The boundary lines A and B overlap each other at a portion corresponding to a side surface 71aa of the boundary line A and a convex-side side surface 71bc of the boundary line B.

Here, in a sectional view, it is preferable that not only the boundary line B has the minimum point but also the concave 71b has a shape obtained by folding the side wall thereof at the minimum point. In other words, it is preferable that the cross-sectional shape of the concave 71b is designed in such a way that not only an inclination of a tangent line of the boundary line B has a positive region but also a negative region. In still other words, it is preferable that the concave 71b has not only a region in which a distance between the boundary line B and substrate main surface 12a monotonically increases but also a region in which the distance therebetween monotonically decreases. In yet still other words, it is preferable that the boundary line B of the concave 71b has a U-like shape (including, in a broad sense, V-like shape). However, the bottom of the U-like shape need not be formed only a curved line.

The above description may be applied to the convex 71a by inverting the shape of the concave 71b.

As described above, the semiconductor device 10 according to the present embodiment has the fin field-effect transistor having a configuration in which the shape of the active region serving as the channel region in the gate width direction has the first, second, and third protruding portions. In other words, the cross-sectional shape of the boundary portion between the gate insulating film and the active region as viewed in the carrier drift direction has not only the upward protruding portion but also the downward protruding portion. Further, not only the third protruding portion, but also the first and second protruding portions can be used as the channel region. That is, the channel width can be increased by an amount corresponding to the first and second protruding portions, thereby improving current driving capability of the transistor.

In the previous examination, the present inventors has tried to increase the height of the fin-shaped channel region (third protruding portion in the present embodiment) in order to increase the channel width; however, in the channel portion according to the present embodiment, the foot portion of the third protruding portion extending toward the depth portion of the active region is folded at a middle portion thereof to form the first and second protruding portions, thereby increasing the channel width without need to increase the height of the third protruding portion. As a result, it is possible to increase the channel width without bringing an upper portion of the third protruding portion close to the source/drain region. Thus, the current driving capability can be improved while suppressing the short channel effect to reduce the S-factor. Further, the channel width can be increased without extending the channel region in the substrate depth direction. It follows that well-implantation carriers transiently generated upon turning OFF of the transistor become easier to be collected in the source/drain region to thereby reduce a variation in the characteristics which may be caused when the well-implantation carriers reach other elements formed in the active region as that for the transistor. For example, in the structure of the present embodiment illustrated in FIG. 1B, it is possible to reduce a possibility that carriers transiently generated from the transistor 19-1 when the transistor 19-1 connected to the left side capacitor is switched from an ON state to an OFF state may cause a storage state of a capacitor (right side capacitor) of another cell present in the same active region.

[Manufacturing Method of Semiconductor Device (First Embodiment)]

The following describes a manufacturing method of the semiconductor device 10 according to the first embodiment of the present invention with reference to FIGS. 2A to 13.

FIGS. 2A to 13 are process views for explaining an example of the manufacturing method of the semiconductor device 10 according to the first embodiment of the present invention. The semiconductor device illustrated in FIGS. 1A to 1D is manufactured through the processes illustrated in FIGS. 2A to 13.

First, a process of forming an element isolation trench 51 in the main surface 12a of the semiconductor substrate 12 will be described with reference to FIGS. 2A to 2D.

Figure 2A:
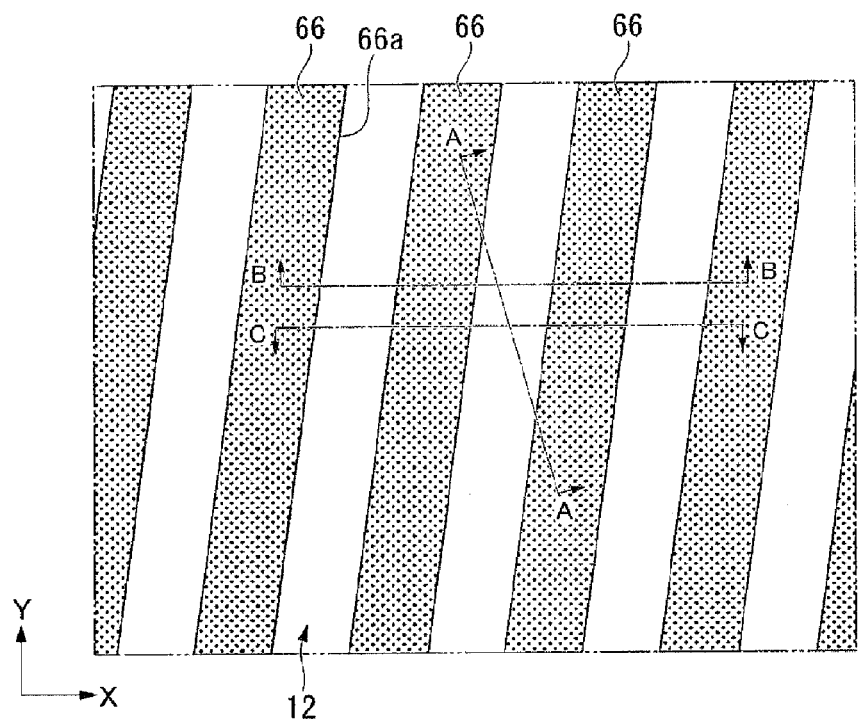
FIG. 2A is a schematic plan view for explaining the manufacturing method of the semiconductor device according to an embodiment.
Figure 2B:
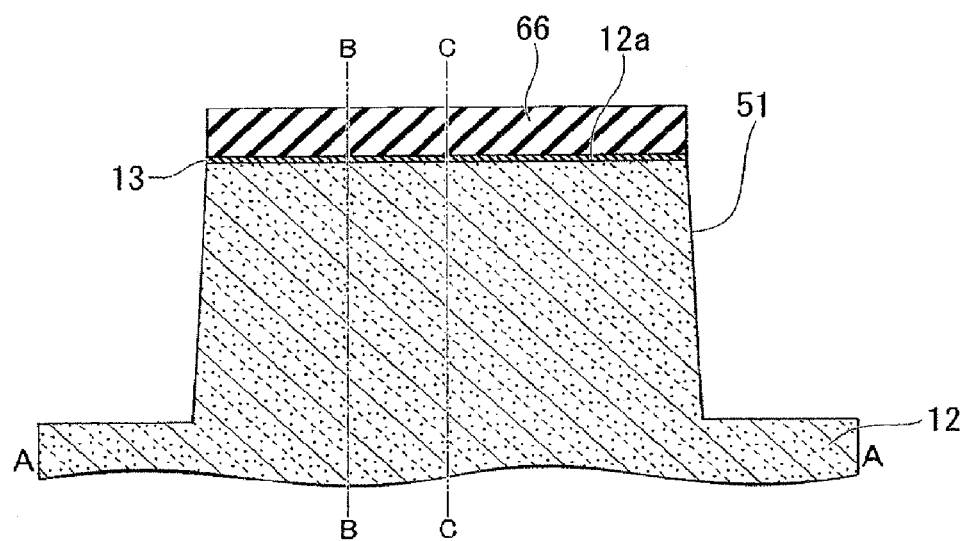
FIG. 2B is a schematic cross-sectional view taken along line A-A of FIG. 2A.
Figure 2C:
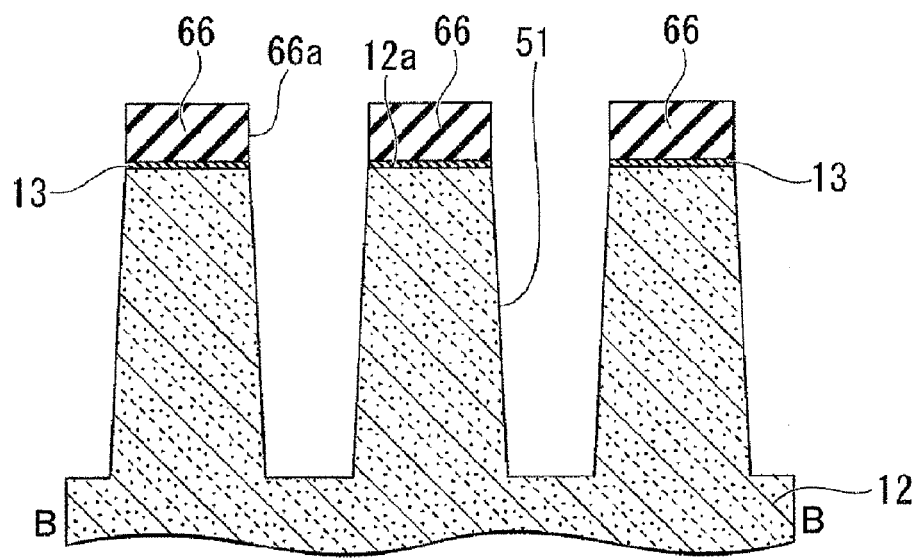
FIG. 2C is a schematic cross-sectional view taken along line B-B of FIG. 2A.
Figure 2D:
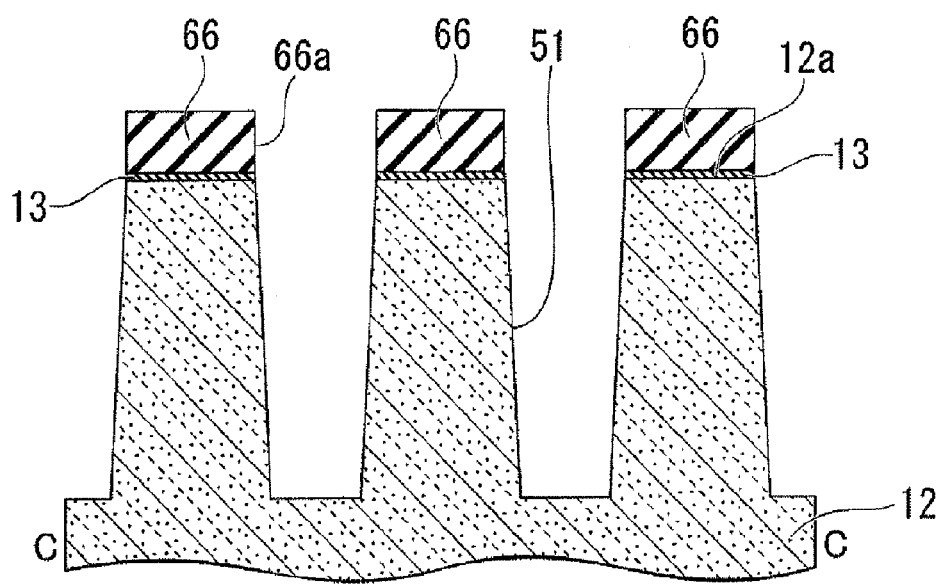
FIG. 2D is a schematic cross-sectional view taken along line C-C of FIG. 2A.

FIG. 2A is a schematic plan view for explaining the manufacturing method of the semiconductor device 10 according to the present embodiment. FIG. 2B is a schematic cross-sectional view taken along line A-A of FIG. 2A. FIG. 2C is a schematic cross-sectional view taken along line B-B of FIG. 2A. FIG. 2D is a schematic cross-sectional view taken along line C-C of FIG. 2A.

As illustrated in FIG. 2B, an unprocessed silicone substrate as the semiconductor substrate 12 is prepared, and a pad oxide film 13 is formed on the main surface 12a of the semiconductor substrate 12. Thereafter, as illustrated in FIGS. 2A, 2C, and 2D, a field nitride film 66 having a trench-shaped opening portion 66a is formed on the pad oxide film 13.

The pad oxide film 13 is formed of a silicon oxide film and has a thickness of, e.g., 3 nm to 10 nm. The field nitride film 66 is formed of a silicon nitride film and has a thickness of, e.g., 30 nm to 100 nm. The opening portion 66a is formed in multiple numbers so as to extend in a band in a direction (first direction) inclined at a predetermined angle relative to Y-direction and to be arranged at predetermined intervals in X-direction. The opening portion 66a is formed so as to expose therethrough an upper surface 13a of the pad oxide film corresponding to a formation region of the element isolation trench 51.

The opening portion 66a is formed by forming a photoresist (not illustrated) patterned on the field nitride film 66 and then applying anisotropic etching to the field nitride film 66 using the photoresist as a mask. The photoresist is removed after the formation of the opening portion 66a.

Subsequently, anisotropic dry etching is applied to the semiconductor substrate 12 using the field nitride film 66 having the opening portion 66a as a mask. As a result, the element isolation trench 51 extending in the first direction is formed as illustrated in FIGS. 2A to 2D. A depth (depth from the main surface 12a of the semiconductor substrate 12) of the element isolation trench 51 is, e.g., 250 nm to 300 nm.

Next, a process of forming the element isolation region 14 and defining the active region 16 extending in the first direction by the element isolation region 14 will be described with reference to FIGS. 3A to 3D. The first direction is a direction in which the active region 16 extends and a carrier drift direction at the operating time of transistors 19-1 and 19-2 to be described later (when a potential difference is applied between the source and drain in a state where a potential is applied to the gate electrode 22 to generate an inversion layer in the active region 16).

Figure 3A:
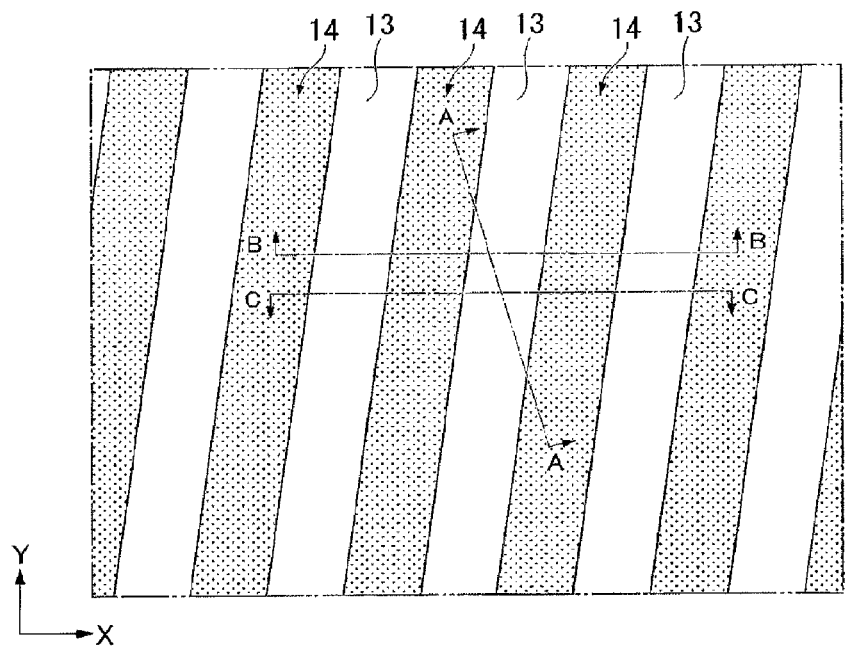
FIG. 3A is a schematic plan view for explaining the manufacturing method of the semiconductor device according to an embodiment of the present invention.
Figure 3B:
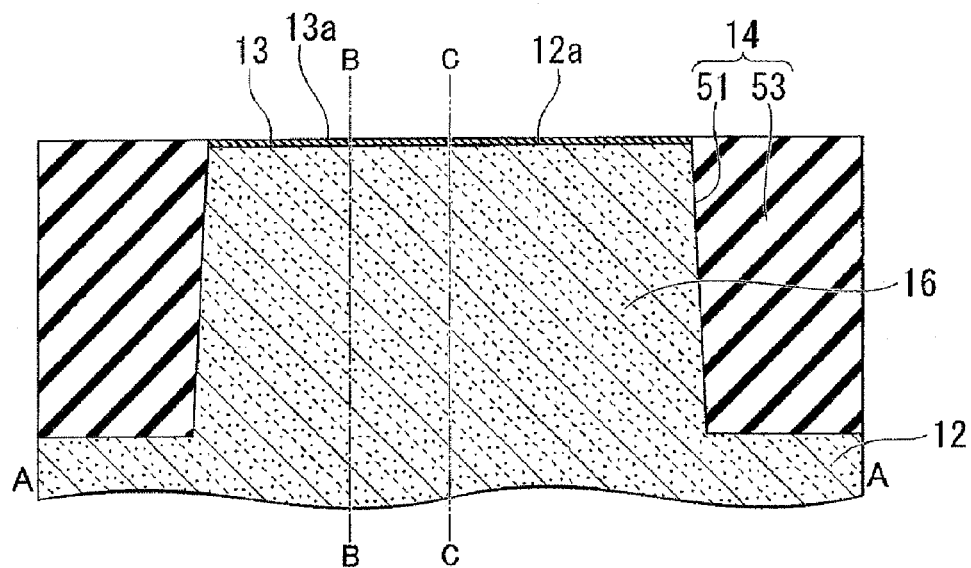
FIG. 3B is a schematic cross-sectional view taken along line A-A of FIG. 3A.
Figure 3C:
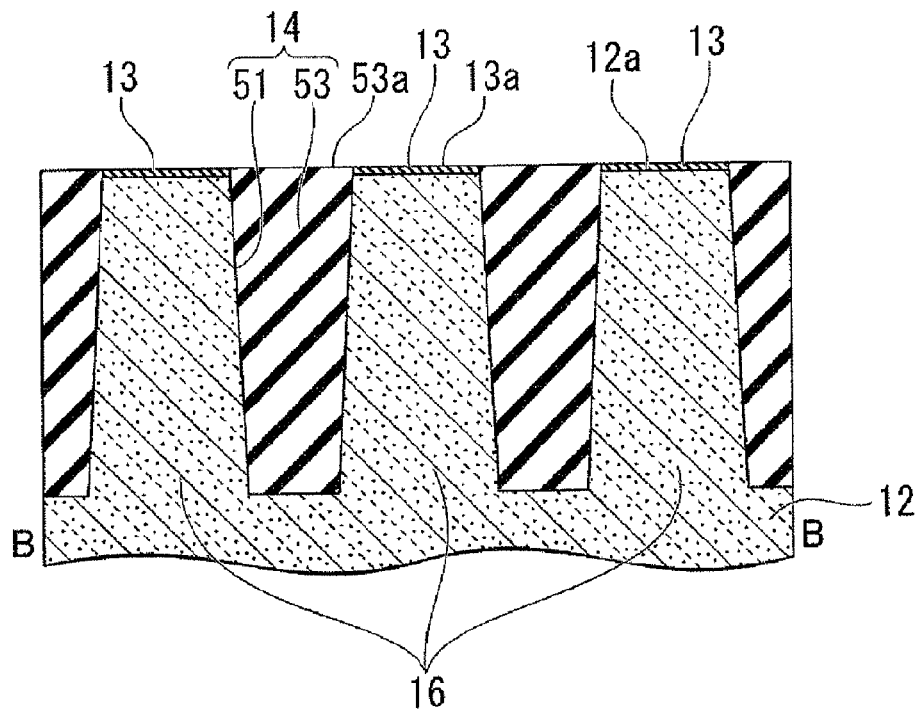
FIG. 3C is a schematic cross-sectional view taken along line B-B of FIG. 3A.
Figure 3D:
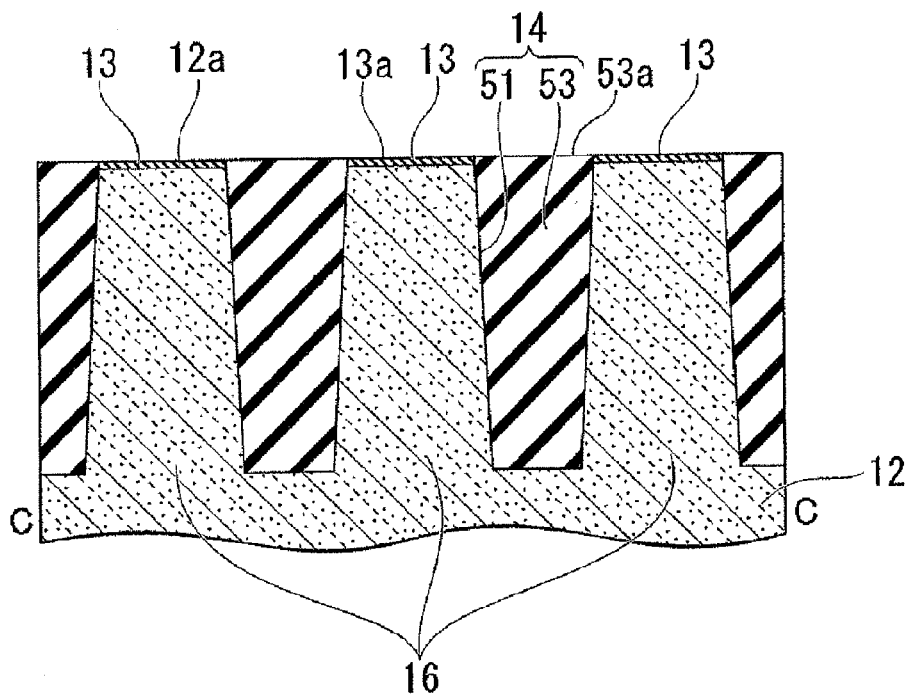
FIG. 3D is a schematic cross-sectional view taken along line C-C of FIG. 3A.

FIG. 3A is a schematic plan view for explaining the manufacturing method of the semiconductor device 10 according to the present embodiment. FIG. 3B is a schematic cross-sectional view taken along line A-A of FIG. 3A. FIG. 3C is a schematic cross-sectional view taken along line B-B of FIG. 3A. FIG. 3D is a schematic cross-sectional view taken along line C-C of FIG. 3A.

An insulating film is buried in the element isolation trench 51, and the element isolation insulating film 53 is formed in such a way that an upper surface 53a thereof is set at substantially the same level as the upper surface 13a of the pad oxide film 13. As a result, the element isolation region 14 including the element isolation insulating film 53 and the element isolation trench 51 is formed.

The following describes a concrete formation method of the element isolation region 14.

A silicon oxide film formed by a CVD method or an HDP method or application-type silicon-oxide film formed by an SOG method is buried in the element isolation trench 51 to thereby form the element isolation insulating film 53.

Subsequently, a CMP (Chemical Mechanical Polishing) method is used to remove the element isolation insulating film 53 formed on the upper surface of the field nitride film 66 for flattening. Further, an HF-containing solution is used to wet-etching the element isolation insulating film 53 to thereby form, in the element isolation trench 51, the element isolation insulating film 53 whose upper surface 53a has been set at substantially the same level as the upper surface 13a of the pad oxide film 13.

As a result, the element isolation region 14 including the element isolation trench 51 and the element isolation insulating film 53 and extending in a line in the first direction is formed. The active region 16 is defined by the element isolation region 14 in X-direction as illustrated in FIGS. 3A to 3D. Thereafter, wet-etching is applied to the field nitride film 66 to remove the same. As a result, the upper surface 13a of the pad oxide film 13 is exposed. The element isolation region 14 may be formed as a laminated insulating film including a thermally-oxidized film (silicon oxide film) (not illustrated) and the element isolation insulating film 53. In this case, the thermally-oxidized film is disposed between the inner surface of the element isolation trench 51 and the element isolation insulating film 53.

Forming the thermally-oxidized film so as to cover the inner surface of the element isolation trench 51 as described above allows a damage layer formed on the inner surface of the element isolation trench 51 to be incorporated into the thermally-oxidized film by dry etching upon formation of the element isolation trench 51, (that is, the damage layer formed on the inner surface of the element isolation trench 51 can be removed) so that a leak source can be eliminated.

As described above, the formation of the element isolation region 14 extending in the first direction allows the active region 16 extending in a line in the first direction to be defined.

Next, a process of forming the source/drain region including the impurity diffusion region 28 in the upper layer portion of the active region 16 will be described with reference to FIGS. 4A to 4D.

Figure 4A:
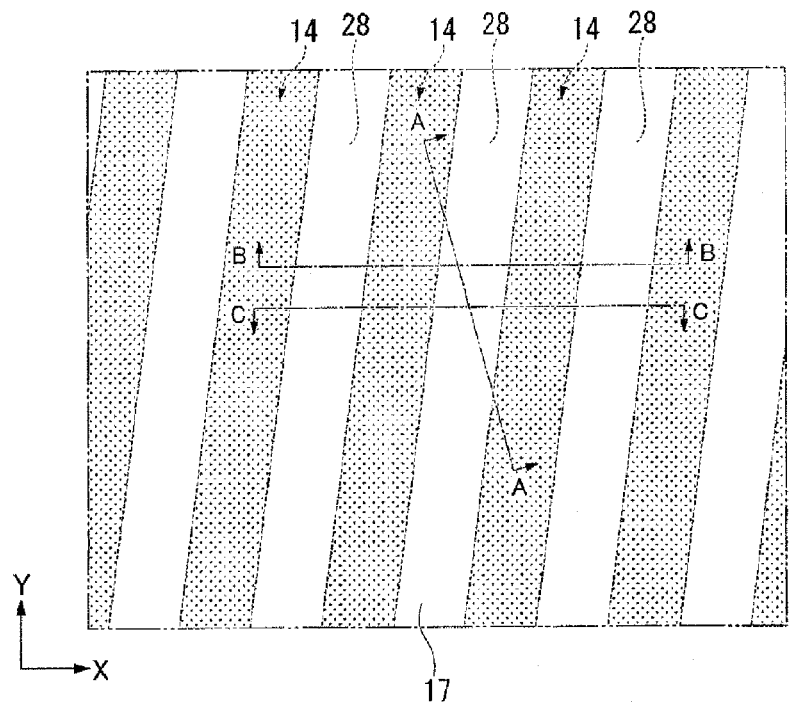
FIG. 4A is a schematic plan view for explaining the manufacturing method of the semiconductor device according to the embodiment of the present invention.
Figure 4B:
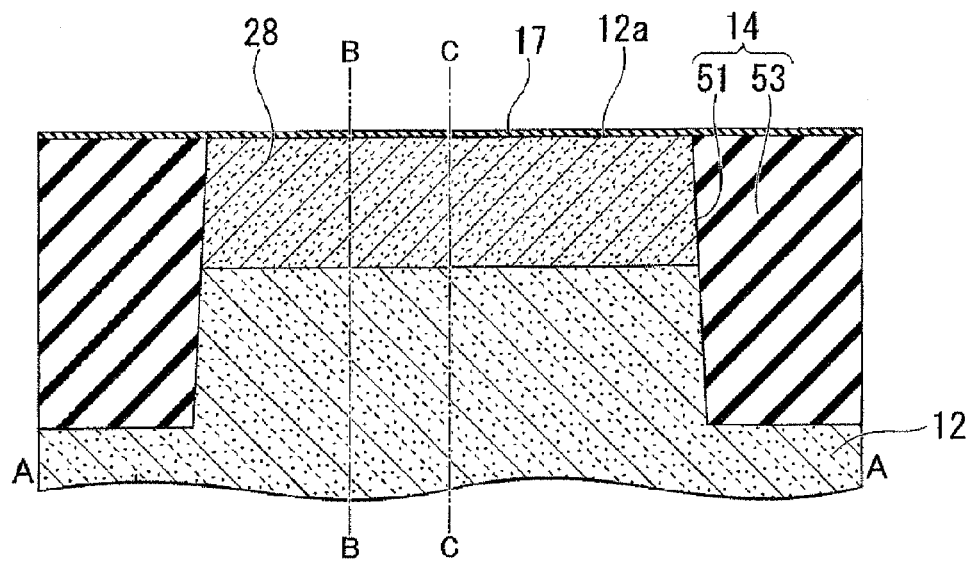
FIG. 4B is a schematic cross-sectional view taken along line A-A of FIG. 4A.
Figure 4C:
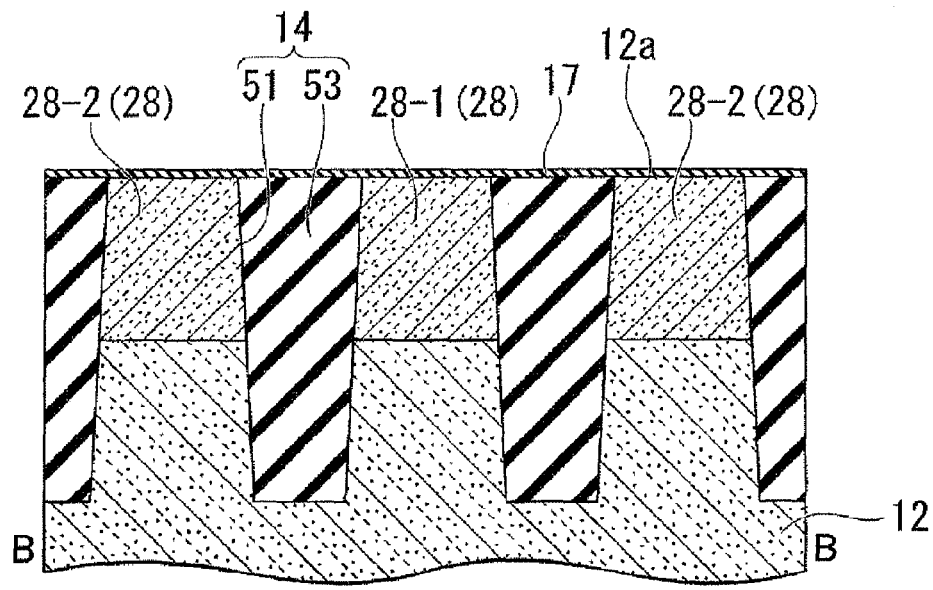
FIG. 4C is a schematic cross-sectional view taken along line B-B of FIG. 4A.
Figure 4D:
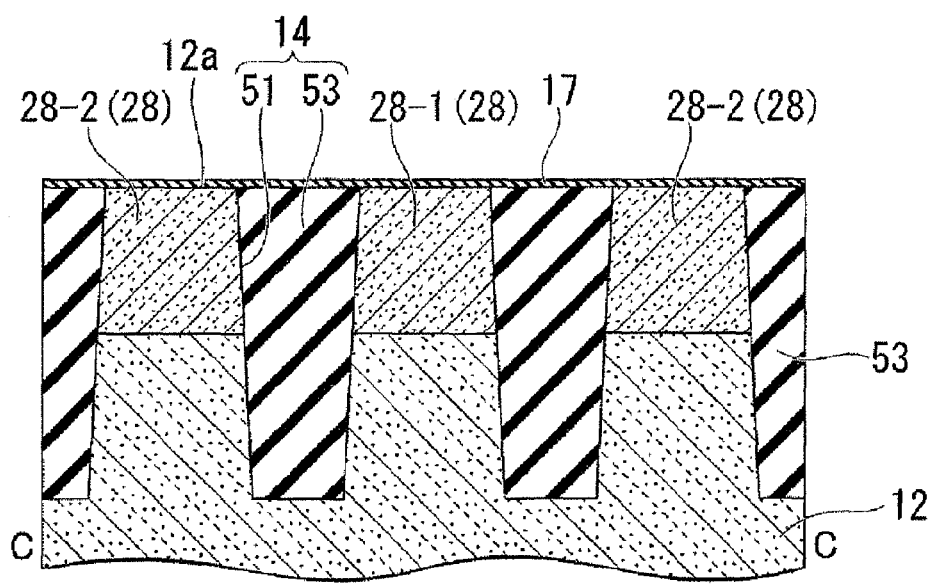
FIG. 4D is a schematic cross-sectional view taken along line C-C of FIG. 4A.

FIG. 4A is a schematic plan view for explaining the manufacturing method of the semiconductor device 10 according to the present embodiment. FIG. 4B is a schematic cross-sectional view taken along line A-A of FIG. 4A. FIG. 4C is a schematic cross-sectional view taken along line B-B of FIG. 4A. FIG. 4D is a schematic cross-sectional view taken along line C-C of FIG. 4A.

The upper surface of the element isolation region 14 is oxidized to form a silicon oxide film 17. Note that the pad oxide film 13 formed on the main surface 12a of the semiconductor substrate 12 is formed of the same material (silicon oxide), so that the pad oxide film 13 is included in the silicon oxide film 17 in this and subsequent processes.

An impurity (n-type impurity, in the present embodiment) having a conductivity type different from that of the semiconductor substrate 12 is ion-implanted into the main surface 12a of the semiconductor substrate 12 through the silicon oxide film 17. As a result, the impurity diffusion region 28 whose upper surface has been set at substantially the same level as the main surface 12a of the semiconductor substrate 12 is formed. More specifically, phosphorus (P) is ion-implanted as the n-type impurity into the main surface 12a of the semiconductor substrate 12 to form the impurity diffusion region 28.

The impurity diffusion region 28 thus formed is divided by the gate trench 18 to be described later into the source/drain region including the impurity diffusion region 28. The bit line to be described later is electrically connected to the source/drain region of one of the field-effect transistors 19-1 and 19-2, and the capacitive contact plug constituting the capacitor to be described later is electrically connected to the source/drain region of the other one of the field-effect transistors 19-1 and 19-2 (see FIG. 1B).

Hereinafter, in the present embodiment, the impurity diffusion region 28 which is connected from below to the bit line 34 and functions as a common source region for the transistors 19-1 and 19-2 is referred to as a first impurity diffusion region 28-1, and the impurity diffusion region 28 which is connected from below to the capacitive contact plug 42 and functions as a common drain region for the transistors 19-1 and 19-2 is referred to as a second impurity diffusion region 28-1. This is for the purpose of distinctive description of the functions of the individual impurity diffusion regions 28.

Next, a process of forming a first mask 67 having a pattern for forming the gate trench 18 and a process of performing first anisotropic etching using the first mask 67 to remove a part of the active region 16 and a part of the element isolation insulating film 53 will be described with reference to FIGS. 5A to 5D.

Figure 5A:
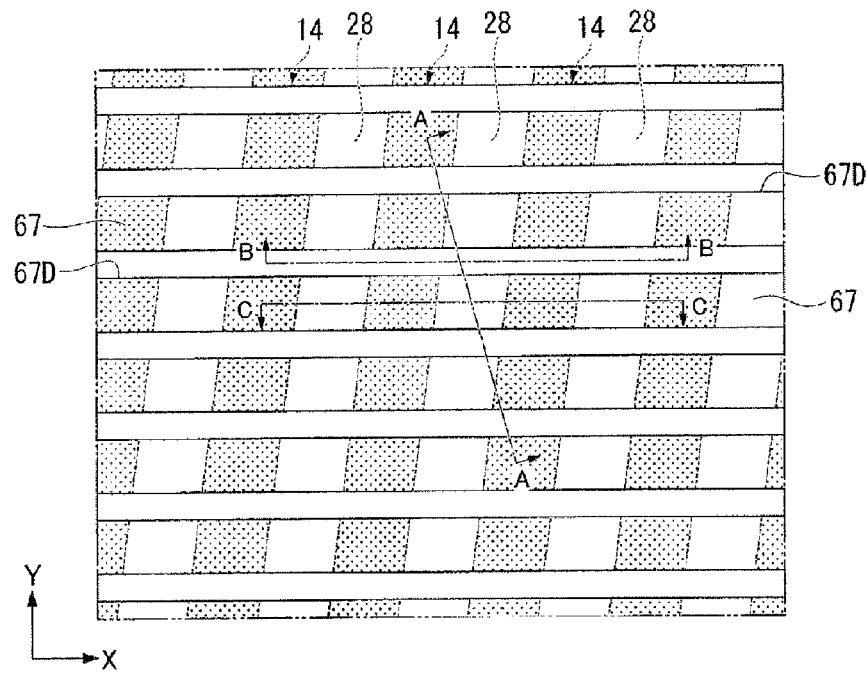
FIG. 5A is a schematic plan view for explaining the manufacturing method of the semiconductor device according to the embodiment of the present invention.
Figure 5B:
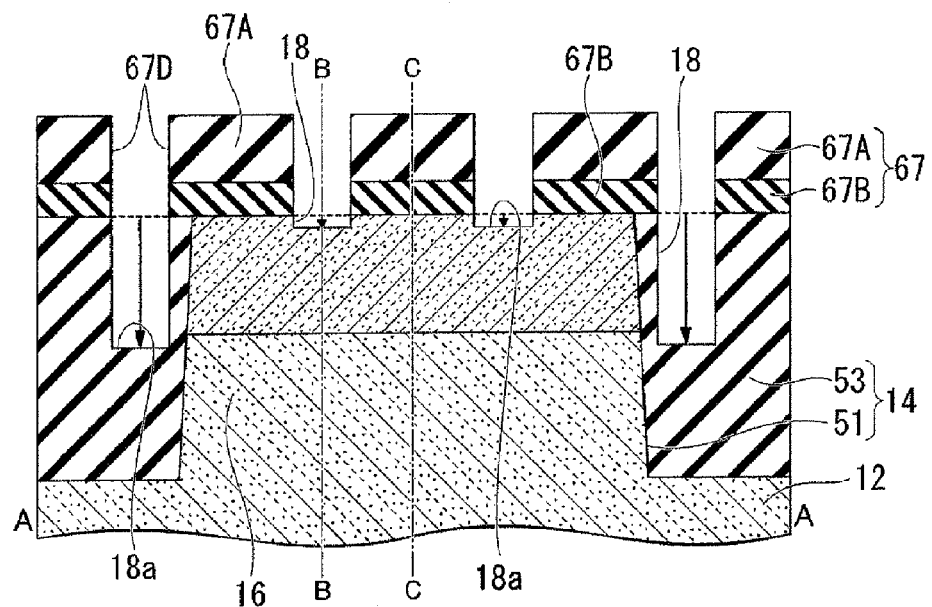
FIG. 5B is a schematic cross-sectional view taken along line A-A of FIG. 5A.
Figure 5C:
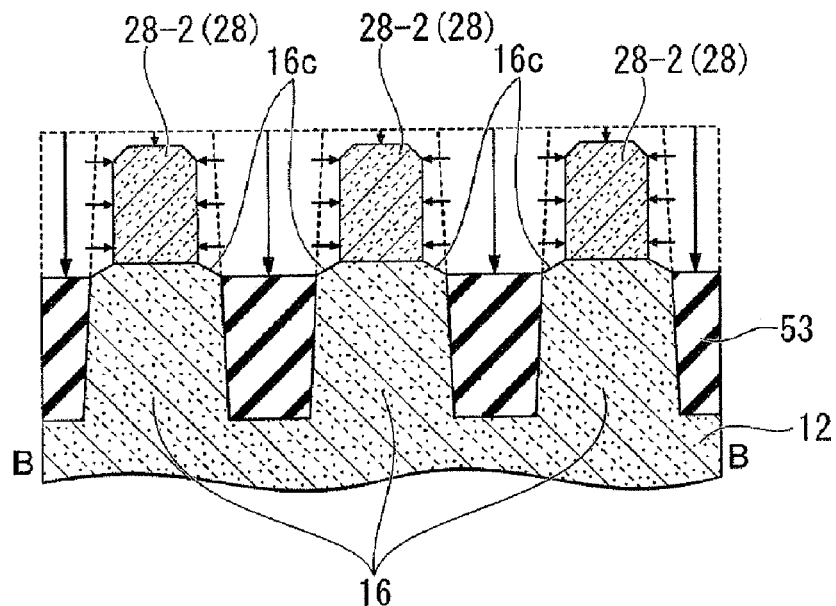
FIG. 5C is a schematic cross-sectional view taken along line B-B of FIG. 5A.
Figure 5D:
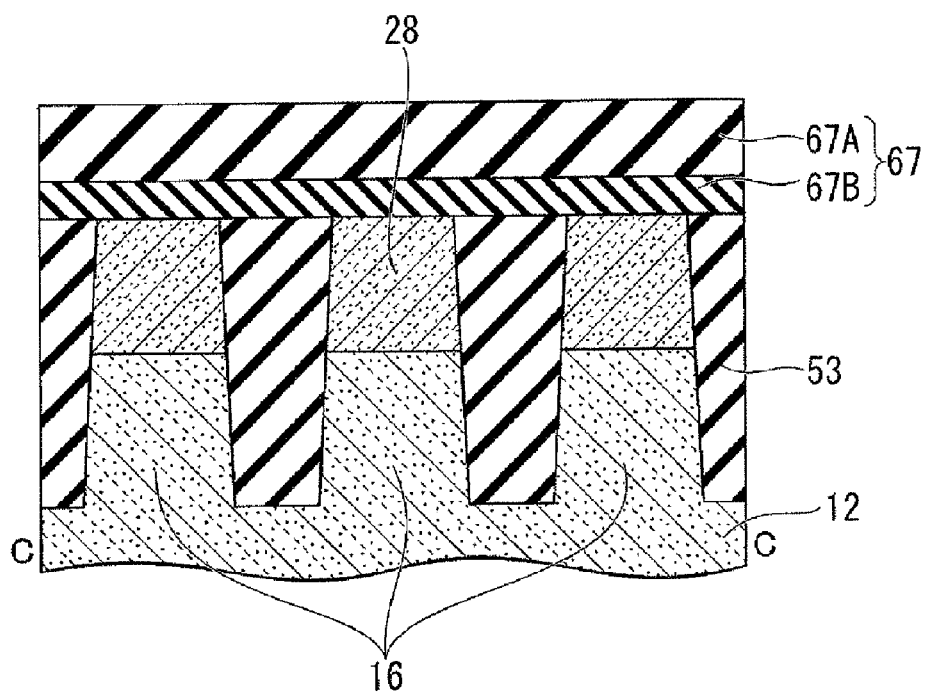
FIG. 5D is a schematic cross-sectional view taken along line C-C of FIG. 5A.

FIG. 5A is a schematic plan view for explaining the manufacturing method of the semiconductor device 10 according to the present embodiment. FIG. 5B is a schematic cross-sectional view taken along line A-A of FIG. 5A. FIG. 5C is a schematic cross-sectional view taken along line B-B of FIG. 5A. FIG. 5D is a schematic cross-sectional view taken along line C-C of FIG. 5A.

After removal of the silicon oxide film 17 including the pad oxide film 13 by etching, a silicon nitride film 67B is formed on the main surface 12a of the semiconductor substrate 12 and upper surface of the element isolation insulating film 53. Then, a resist mask (amorphous carbon film) 67A having a line-and-space pattern is formed by a photoresist technique. As a result, the first mask 67 including the amorphous carbon film 67A and silicon nitride film 67B which are sequentially laminated is formed.

Subsequently, the silicon nitride film 67B is etched using the amorphous carbon film 67A as a mask to form an opening portion 67D in the first mask 67. As a result, the main surface 12a of the semiconductor substrate 12 corresponding to a formation region of the gate trench 18 is exposed. As illustrated in FIG. 5A, the opening portion 67D is formed so as to extend in the second direction (X-direction in FIG. 5A) intersecting the first direction and to have a predetermined interval from its adjacent opening portion 67D.

Then, the first mask 67 having the opening portion 67D is used to perform the first anisotropic etching to etch the active region 16 and element isolation insulating film 53 to desired depths, respectively, while removing a part of the active region 16 and a part of the element isolation insulating film 53 as illustrated in FIGS. 5B and 5C.

More specifically, the first anisotropic etching in the present embodiment is performed at a higher etching rate for the element isolation insulating film 53 than for the semiconductor substrate 12 as denoted by arrows in FIGS. 5B and 5C. That is, the etching is performed at a higher selection ratio for the semiconductor substrate 12 than for the element isolation insulating film 53. Thus, as illustrated in FIGS. 5B and 5C, the element isolation insulating film 53 is etched more selectively than the semiconductor substrate 12, thereby allowing the upper surface of the element isolation region 14 to be formed below the upper surface of the active region 16.

The above-described first anisotropic etching is preferably performed using plasma containing a high-order freon gas as a mixture gas. More specifically, the first anisotropic etching is preferably performed under conditions that $CHF_3+C_4F_8+O_2+Ar$ is used as the etching mixture gas, a pressure of an etching chamber is set to 10 Pa to 20 Pa, and an RF bias power is set to a range of 700 W to 1200 W.

Further, the first anisotropic etching in the present embodiment is preferably performed under a condition that side etching can be applied to the active region 16. That is, it is preferable that the first anisotropic etching is performed under a condition that both the element isolation insulating film 53 and active region 16 are partly etched down in the depth direction and, at the same time, the active region 16, which is an Si substrate, is side-etched as illustrated in FIG. 5C. In particular, making the bottom of the active region 16 thin as much as possible, that is, etching the side wall of the active region 16 on the element isolation region 14 side allows an inner wall oxide film on the side wall of the active region 16 to completely be removed. Further, side-etching the active region 16 exposes a part of the active region 16 positioned at the side wall bottom portion of the removed part. Hereinafter, the exposed part is referred to as an exposed portion 16c.

An amount of the side-etching to be applied to the active region 16 can be controlled by a pressure within the etching chamber. For example, a shift to a low pressure side reduces the side-etching amount, and a shift to a high pressure side increases the side-etching amount.

Following the first anisotropic etching, the first mask 67 is used to perform second anisotropic etching to remove a part of the active region 16 and a part of the element isolation insulating film 53 to thereby form the gate trench in such a way that the upper surface of the active region 16 has the first, second, and third protruding portions A1 to A3 which are arranged in the first direction. This process will be described with reference to FIGS. 6A to 6D.

Figure 6A:
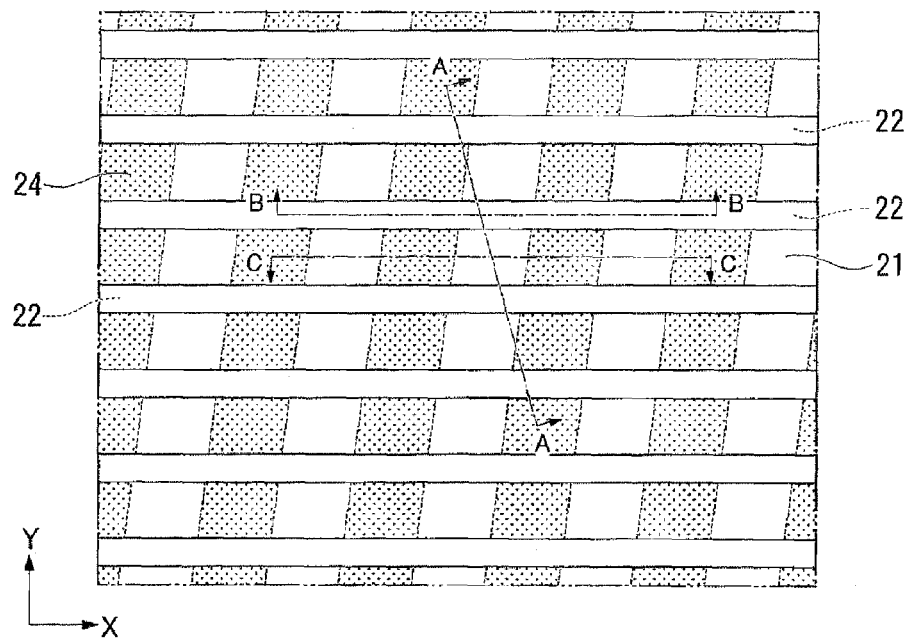
FIG. 6A is a schematic plan view for explaining the manufacturing method of the semiconductor device according to the embodiment of the present invention.
Figure 6B:
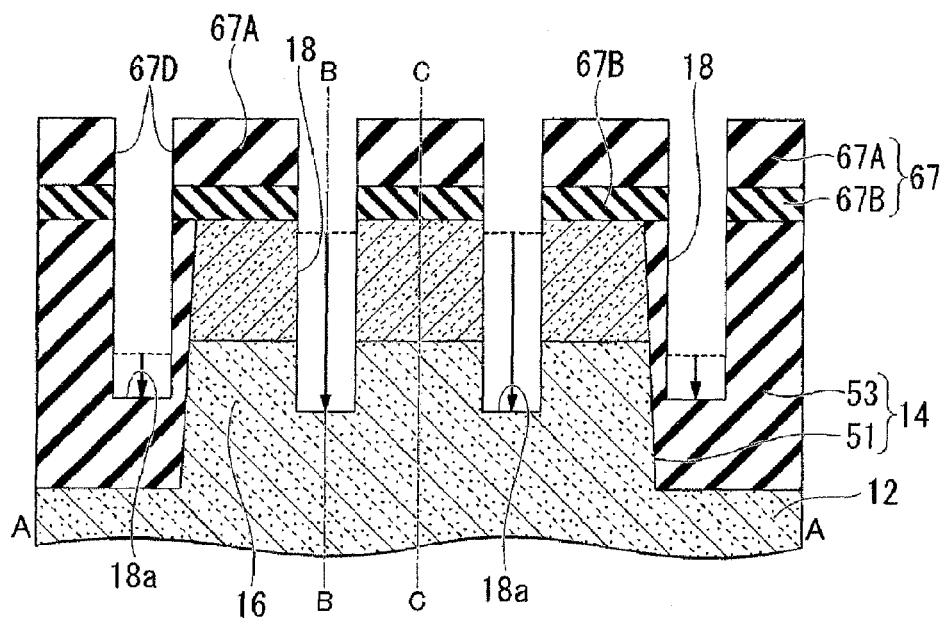
FIG. 6B is a schematic cross-sectional view taken along line A-A of FIG. 6A.
Figure 6C:
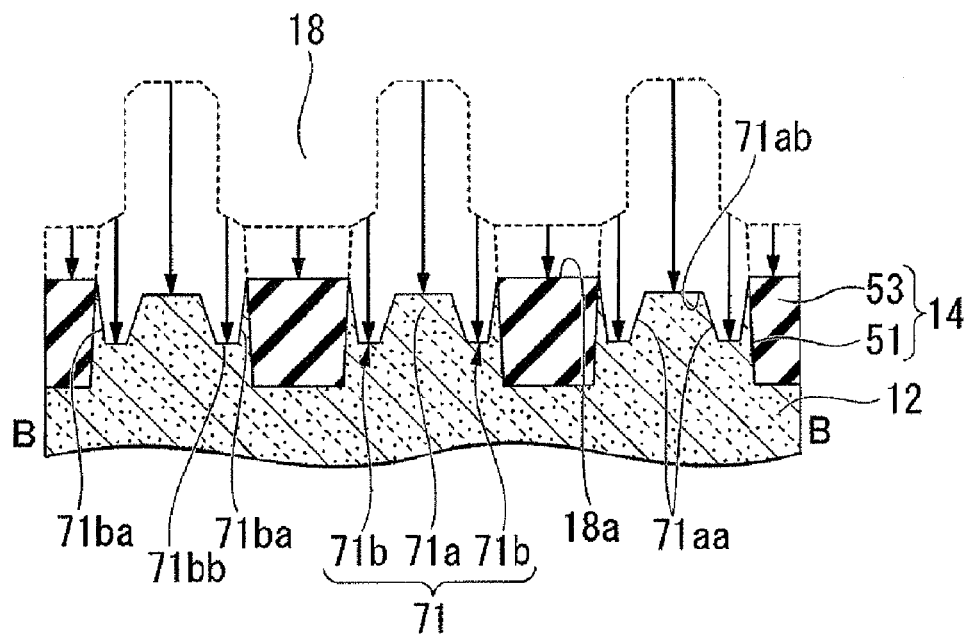
FIG. 6C is a schematic cross-sectional view taken along line B-B of FIG. 6A.
Figure 6D:
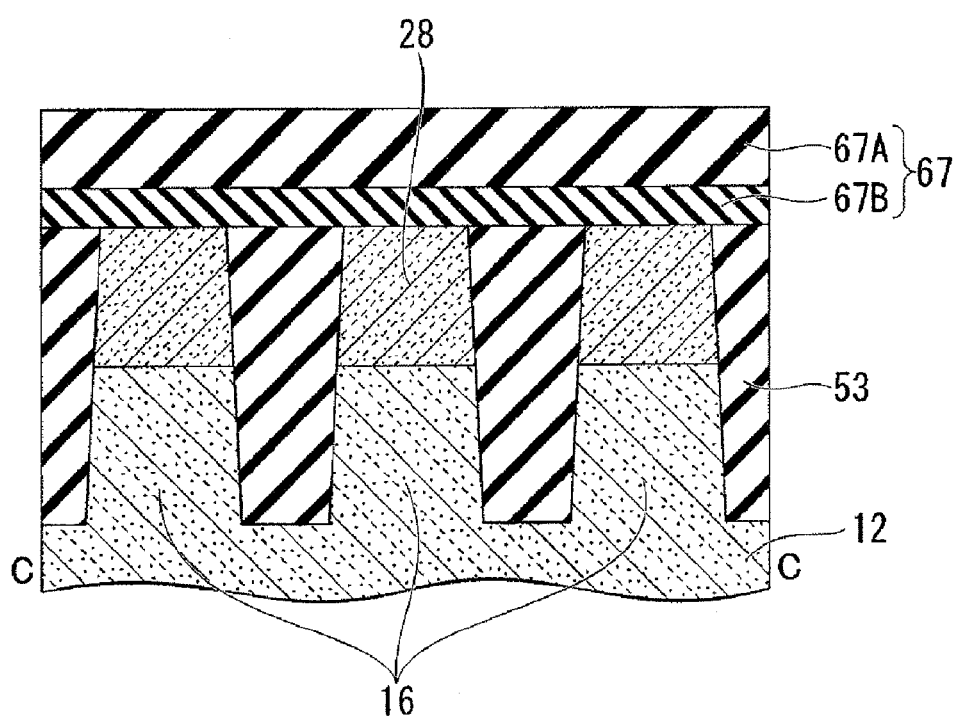
FIG. 6D is a schematic cross-sectional view taken along line C-C of FIG. 6A.

FIG. 6A is a schematic plan view for explaining the manufacturing method of the semiconductor device 10 according to the present embodiment. FIG. 6B is a schematic cross-sectional view taken along line A-A of FIG. 6A. FIG. 6C is a schematic cross-sectional view taken along line B-B of FIG. 6A. FIG. 6D is a schematic cross-sectional view taken along line C-C of FIG. 6A.

After the first anisotropic etching, the first mask 67 having the opening portion 67D is used like above to perform the second anisotropic etching to etch the active region 16 and element isolation insulating film 53 to desired depths, respectively, to further partly remove the active region 16 and element isolation insulating film 53 as illustrated in FIGS. 6B and 6C.

More concretely, the second anisotropic etching in the present embodiment is performed at a higher etching rate for the semiconductor substrate 12 than for the element isolation insulating film 53 as denoted by arrows in FIGS. 6B and 6C. That is, the etching is performed at a higher selection ratio for the semiconductor substrate 12 than for the element isolation insulating film 53. Thus, as illustrated in FIGS. 6B and 6C, the semiconductor substrate 12 is etched more selectively than the element isolation insulating film 53. Further, performing the etching at a higher selection ratio for the semiconductor substrate 12 etches the part (exposed portion 16c) of the active region 16 exposed by the first anisotropic etching with the result that the active region 16 is etched dapper than the element isolation region 14. In this manner, the gate trench 18 can be formed in such a way that the upper surface of the active region 16 exposed at the bottom portion of the gate trench 18 has the first, second, and third protruding portions A1 to A3 which are arranged in the first direction.

The above-described second anisotropic etching is preferably performed using plasma containing a chlorine gas or plasma containing a bromine gas as a mixture gas. More specifically, the second anisotropic etching is preferably performed under conditions that $Cl_2+CF_4+He$ is used as the etching mixture gas, a pressure within an etching chamber is set to 3 Pa to 10 Pa, and an RF bias power is set to a range of 100 W to 300 W.

The second anisotropic etching in the present embodiment is thus performed at a higher selection ratio for the semiconductor substrate 12 than for the element isolation insulating film 53. In this case, however, the etching rate of the exposed portion 16c is slower than that of an upper portion 71ab of the convex 71a. This is because in the second anisotropic etching in which the etching rate of the element isolation region 14 is slower than that of the semiconductor substrate 12, the etching rate of a portion (exposed portion 16c (see FIG. 5C)) closer to the element isolation region 14 is reduced as compared to a portion (active region 16) positioned away from the element isolation region 14. That is, the closer to the element isolation region 14, the more easily influenced by the etching rate of the element isolation region 14.

In the present embodiment, application of the anisotropic etching utilizing the above phenomenon allows formation of the concave 71b having substantially the U-like cross-sectional shape as illustrated in FIG. 6C. Further, application of the anisotropic etching utilizing a difference in the etching rate between the semiconductor substrate 12 and element isolation region 14 makes the etching rate imbalanced in the extending direction of the gate trench 18, thereby allowing the active region 16 to be partly remain in an effective manner between the element isolation region 14 and the side surface 71ba of the concave.

As described above, application of the first anisotropic etching and second anisotropic etching each providing different etching rates for different parts allows a formation position of the upper portion 71ab of the convex 71a to be lowered and allows the exposed portion 16c to be etched in the U-like cross-sectional shape. Thus, it is possible to reduce current leak which has appeared prominently when the height of the channel portion is high and to allow the active region 16 to partly remain between the element isolation region 14 and the side surface 71ba of the concave. As a result, transistor characteristics such as Ion or Vt (threshold voltage) can be improved.

Next, a process of forming the gate insulating film 21 and a process of forming the gate electrode 22 in the gate trench 18 through the gate insulating film 21 will be described with reference to FIGS. 7A to 7D.

Figure 7A:
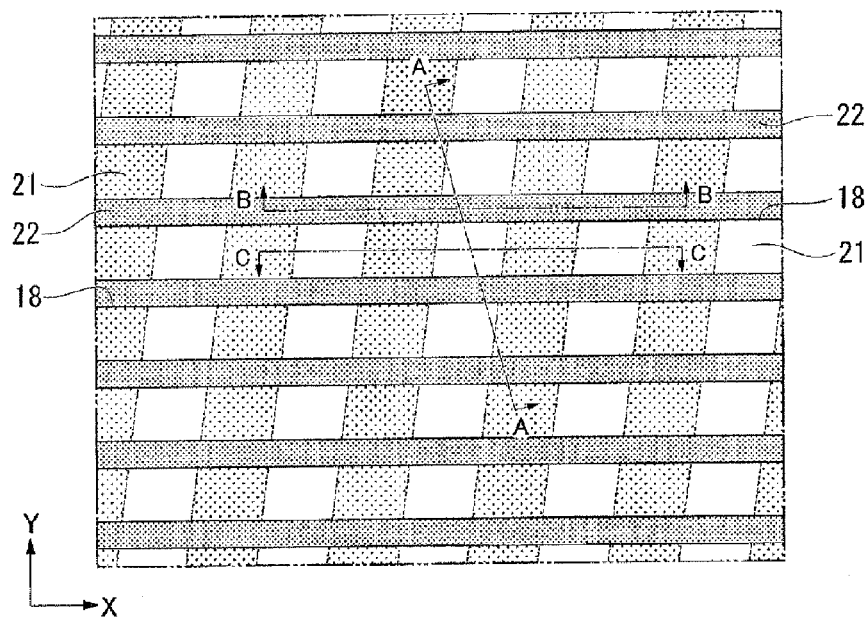
FIG. 7A is a schematic plan view for explaining the manufacturing method of the semiconductor device according to the embodiment of the present invention.
Figure 7B:
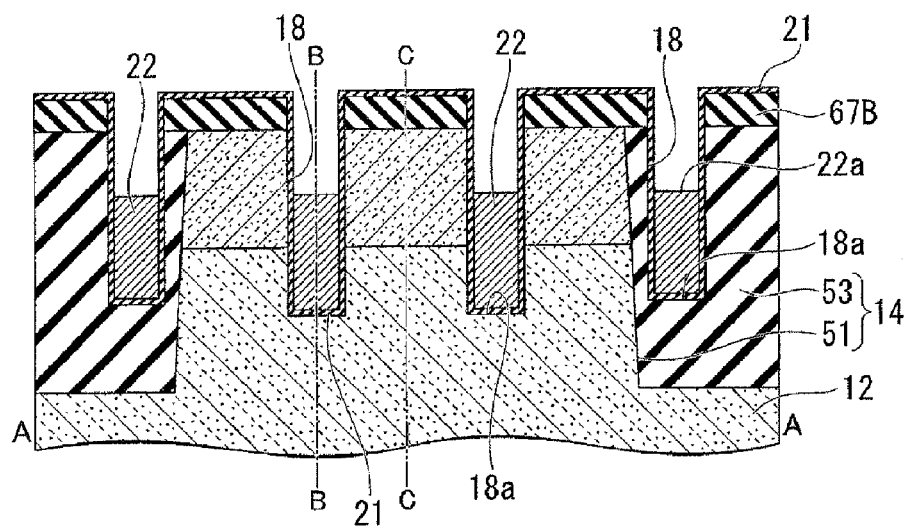
FIG. 7B is a schematic cross-sectional view taken along line A-A of FIG. 7A.
Figure 7C:
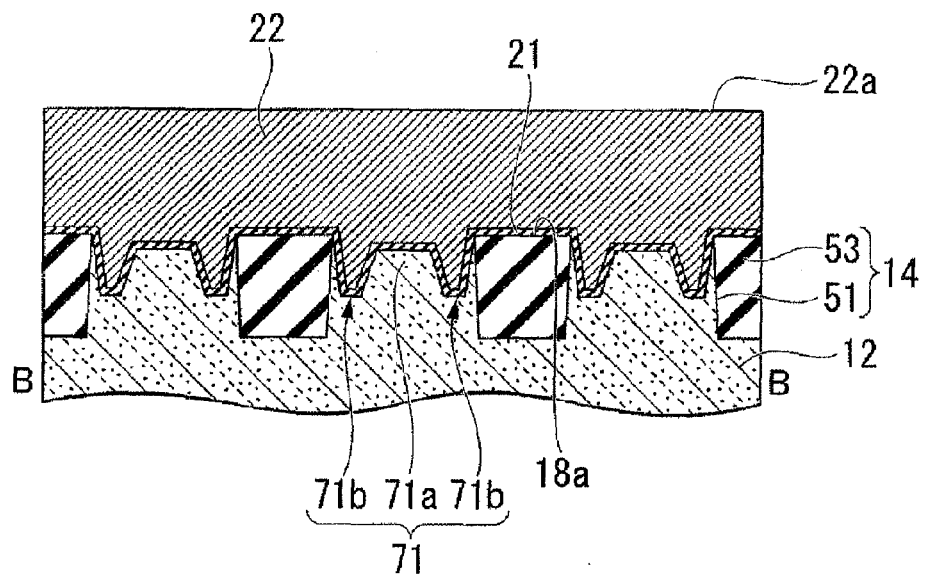
FIG. 7C is a schematic cross-sectional view taken along line B-B of FIG. 7A.
Figure 7D:
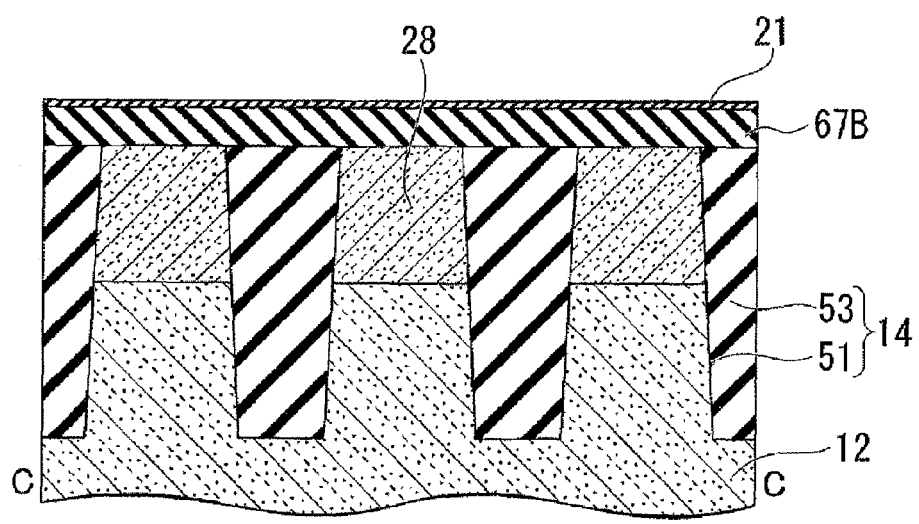
FIG. 7D is a schematic cross-sectional view taken along line C-C of FIG. 7A.

FIG. 7A is a schematic plan view for explaining the manufacturing method of the semiconductor device 10 according to the present embodiment. FIG. 7B is a schematic cross-sectional view taken along line A-A of FIG. 7A. FIG. 7C is a schematic cross-sectional view taken along line B-B of FIG. 7A. FIG. 7D is a schematic cross-sectional view taken along line C-C of FIG. 7A.

After removal of the amorphous carbon film 67A used as the mask, a thermal oxidation method is used to form the gate insulating film 21 so as to cover the bottom surface 18a and side surfaces of the gate trench 18 and silicon nitride film 67B. More specifically, the gate insulating film 21 is formed so as to cover the channel portion 71. The gate insulating film 21 is formed to have a thickness that does not fill completely the gate trench therewith.

As the gate insulating film 21, a single-layered silicon oxide film, a single-layered silicon oxynitride film, a laminated film obtained by laminating the silicon nitride film (SiN film) on the silicon oxide film, or the like may be used. In a case where the single-layered silicon oxide film is used as the gate insulating film 21, the thickness of the gate insulating film 21 may be set to, e.g., 3 nm to 10 nm.

Subsequently, a conductive film is formed so as to fill therewith the gate trench 18 in which the gate insulating film 21 has been formed. The conductive film may be a film obtained by sequentially laminating a first conductive film (not illustrated) and a second conductive film (not illustrated). In a case where such a laminated structure is adopted, the first and second conductive films are sequentially laminated so as to cover the channel portion 71 and fill therewith the gate trench 18 through the gate insulating film 21. That is, the upper surfaces of the silicon nitride film 67B and element isolation region 14 are covered by the first and second conductive films.

More specifically, after formation of a titanium nitride film (having a thickness of, e.g., 5 nm) as the first conductive film by a CVD method, a tungsten film (having a thickness of, e.g., 100 nm) is formed as the second conductive film. As a result, the gate trench 18 is completely filled with the titanium nitride film and tungsten film.

Subsequently, the entire conductive film is etched back to leave only the conductive film serving as a constituent element of the gate electrode 22 to thereby form the gate electrode 22 which is a buried gate electrode. The upper surface 22a of the gate electrode 22 is located at a lower position than the main surface 12a of the semiconductor substrate 12. Note that the conductive film is etched back in such a way that the depth of the upper surface (upper surface of the gate electrode 22) 22a of the conductive film after each-back from the main surface 12a of the semiconductor substrate 12 is 50 nm to 80 nm.

Next, a process of forming the buried insulating film 24 so as to fill therewith the gate trench 18 will be described with reference to FIGS. 8A to 8D.

Figure 8A:
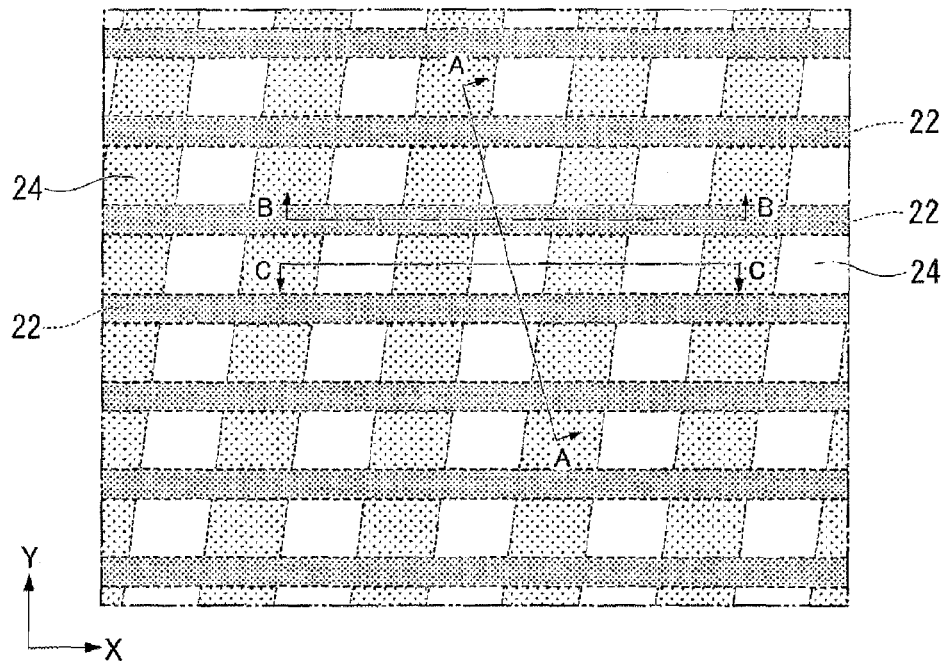
FIG. 8A is a schematic plan view for explaining the manufacturing method of the semiconductor device according to the embodiment of the present invention.
Figure 8B:
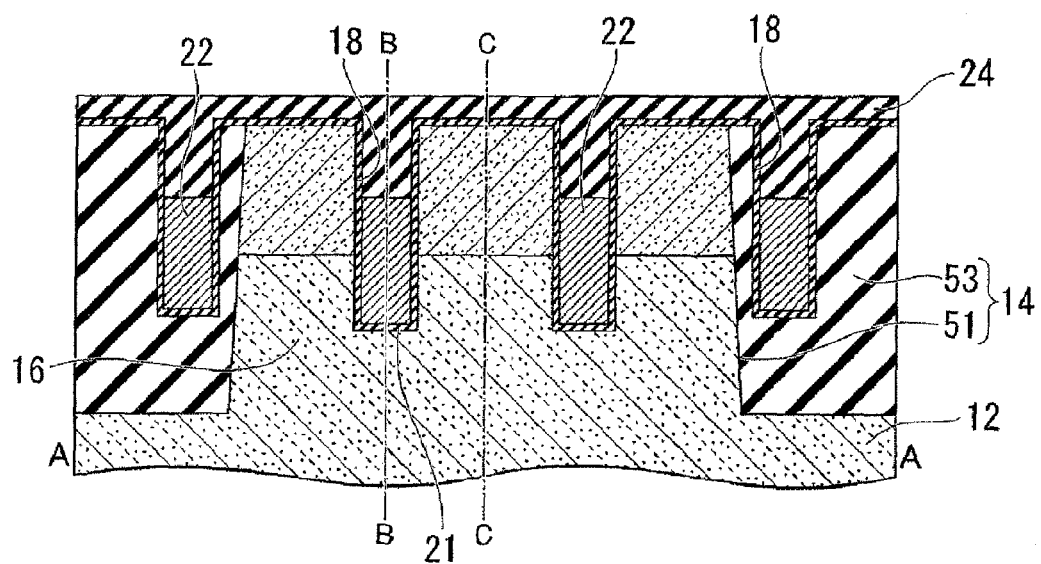
FIG. 8B is a schematic cross-sectional view taken along line A-A of FIG. 8A.
Figure 8C:
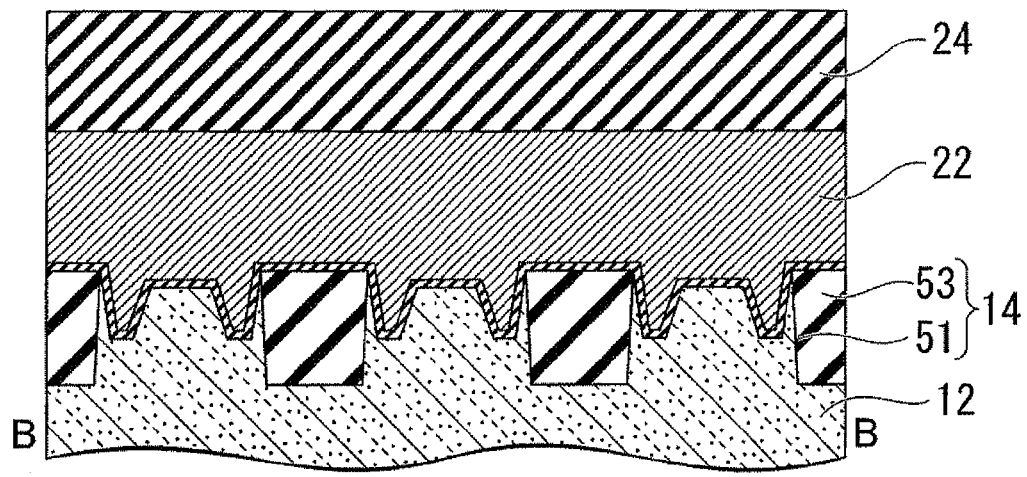
FIG. 8C is a schematic cross-sectional view taken along line B-B of FIG. 8A.
Figure 8D:
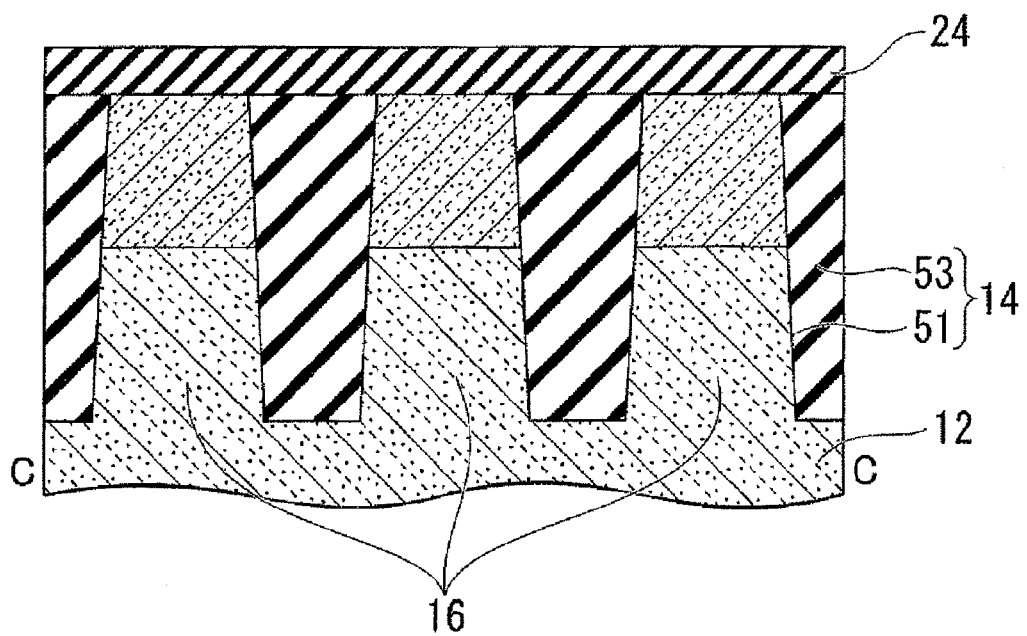
FIG. 8D is a schematic cross-sectional view taken along line C-C of FIG. 8A.

FIG. 8A is a schematic plan view for explaining the manufacturing method of the semiconductor device 10 according to the present embodiment. FIG. 8B is a schematic cross-sectional view taken along line A-A of FIG. 8A. FIG. 8C is a schematic cross-sectional view taken along line B-B of FIG. 8A. FIG. 8D is a schematic cross-sectional view taken along line C-C of FIG. 8A.

After removal of the gate insulating film 21 formed on the silicon nitride film 67B and the silicon nitride film 67B, the buried insulating film 24 is formed so as to fill therewith the gate trench 18 and to cover the element isolation region and active region 16. More specifically, the buried insulating film 24 may be formed by using a CVD method, an HDP method, or an SOG method. As the buried insulating film 24, a silicon oxide film may be used.

Figure 9:
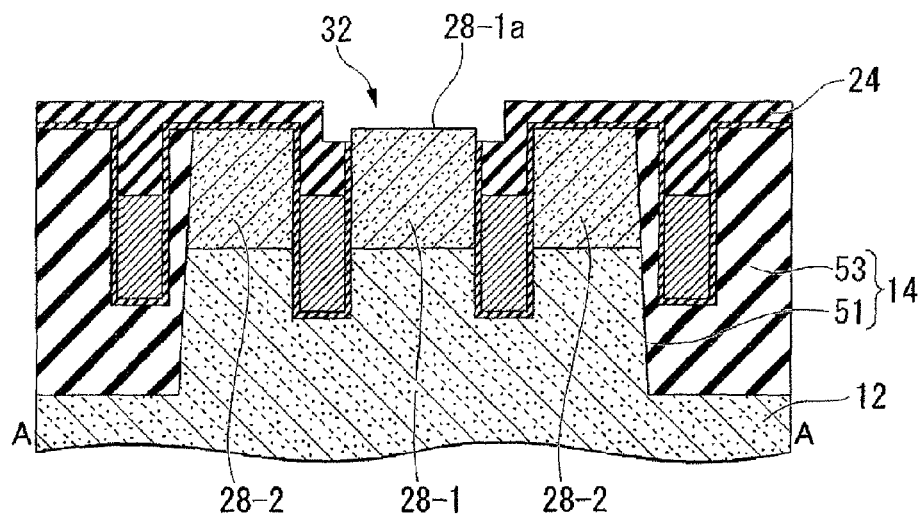
FIG. 9 is a schematic cross-sectional view for explaining the manufacturing method of the semiconductor device according to the first embodiment of the present invention.

Next, a manufacturing process illustrated in FIG. 9 will be described. FIG. 9 is a cross-sectional view corresponding to a cut surface of the semiconductor device 10 according to the present embodiment illustrated in FIG. 1B and is a schematic cross-sectional view for explaining the manufacturing process in the present embodiment.

The buried insulating film 24 formed above the first impurity diffusion region 28-1 is selectively removed to thereby form the opening portion 32 exposing therethrough the upper surface 28-1a of the first impurity diffusion region 28-1.

More specifically, a photoresist (not illustrated) having a trench-shaped opening portion (not illustrated) exposing therethrough only the buried insulating film 24 positioned above the first impurity diffusion region 28-1 is formed on the buried insulating film 24 and, thereafter, the buried insulating film 24 exposed through the trench-shaped opening portion is selectively etched (e.g., wet-etched) to thereby form the opening portion 32 exposing therethrough the upper surface 28-1a of the first impurity diffusion region 28-1. After the above etching, the photoresist (not illustrated) is removed.

Figure 10:
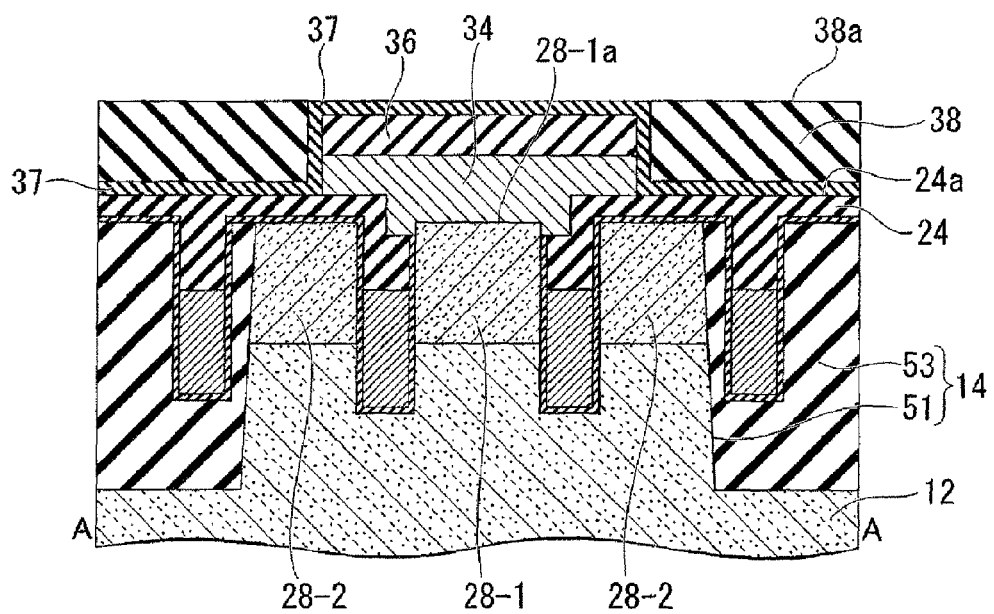
FIG. 10 is a schematic cross-sectional view for explaining the manufacturing method of the semiconductor device according to the first embodiment of the present invention.

Next, a process of forming the bit line 34 to be electrically connected to the first impurity diffusion region 28-1 will be described with reference to FIG. 10. FIG. 10 is a cross-sectional view corresponding to a cut surface of the semiconductor device 10 according to the present embodiment illustrated in FIG. 1B and is a schematic cross-sectional view for explaining the manufacturing process in the present embodiment.

The bit line 34 a part of which constitutes a buried bit line contact and which extends in Y-direction while contacting the upper surface 24a of the buried insulating film 24 and the upper surface of the element isolation insulating film 53 is formed. As a result, the bit line 34 contacting the upper surface of one (first impurity diffusion region 28-1) of the impurity diffusion regions 28 that sandwich the gate trench 18 and electrically connected thereto is formed.

More specifically, a polysilicon film, a titanium silicide film, a titanium nitride film, a tungsten silicide film, and a tungsten film which are not illustrated are sequentially laminated on the upper surface 24a of the buried insulating film 24 so as to fill therewith the opening portion 32 to thereby form a laminated film constituting the bit line 34. The laminated film may be obtained by sequentially laminating the above metal films without forming the polysilicon film.

Subsequently, a silicon nitride film serving as a base material of a cap insulating film 36 to be described later is formed on the tungsten film constituting apart of the bit line 34. Thereafter, a photolithographic technique is used to form, on the silicon nitride film, a photoresist (not illustrated) covering a formation region of the bit line 34.

Subsequently, dry etching is performed using the photoresist as a mask to pattern the silicon nitride film serving as a base material of the cap insulating film 36 and tungsten film, titanium silicide film, titanium nitride film, tungsten silicide film, and polysilicon film constituting the bit line 34 to thereby simultaneously form the cap insulating film 36 formed of the silicon nitride film and the bit line formed of polysilicon film, titanium silicide film, titanium nitride film, tungsten silicide film, and tungsten film.

Subsequently, a silicon nitride film is formed so as to cover the upper surface of the buried insulating film 24, side surfaces of the bit line 34, and cap insulating film 36 to form the liner film 37.

The liner film 37 may be a laminated film obtained by sequentially laminating the silicon nitride film and silicon oxide film. Formation of the liner 37 by sequentially laminating the silicon nitride film and silicon oxide film improves wettability of the silicon oxide film when a silicon oxide film ($SiO_2$ film) obtained by a CVD method or an SOG film (silicon oxide film) obtained by a spin coating method is formed as the interlayer insulating film 38 to be described later, thereby suppressing an occurrence of a void in the silicon oxide film.

Subsequently, the interlayer insulating film 38 covering the liner film 37 is formed so as to be set at substantially the same level as the upper surface of the liner film 37 formed on the upper surface of the cap insulating film 36. More specifically, a silicon oxide film ($SiO_2$ film) is formed by, e.g., a CVD method so as to cover the liner film 37. In place of this, a SOG film (silicon oxide film) may be formed using a spin coating method. In a case where the spin coating method is adopted, heat treatment is performed to make film quality of the SOG film dense. Further, in the case where the spin coating method is used to form the SOG film, a coating liquid containing polysilazane is used. The heat treatment is preferably carried out in a water-vapor atmosphere.

Subsequently, a CMP method is used to polish the silicon oxide film until the liner film 37 formed on the upper surface of the cap insulating film 36 is exposed.

As a result, the interlayer insulating film 38 is formed, and the upper surface 38a thereof is set at substantially the same level as the liner film 37 formed on the upper surface of the cap insulating film 36.

Although not illustrated in the structure of FIG. 10, a silicon oxide film ($SiO_2$ film) covering the upper surface of the liner film 37 and upper surface 38a of the interlayer insulating film 38 may be formed using a CVD method after the polishing of the silicon oxide film.

Figure 11:
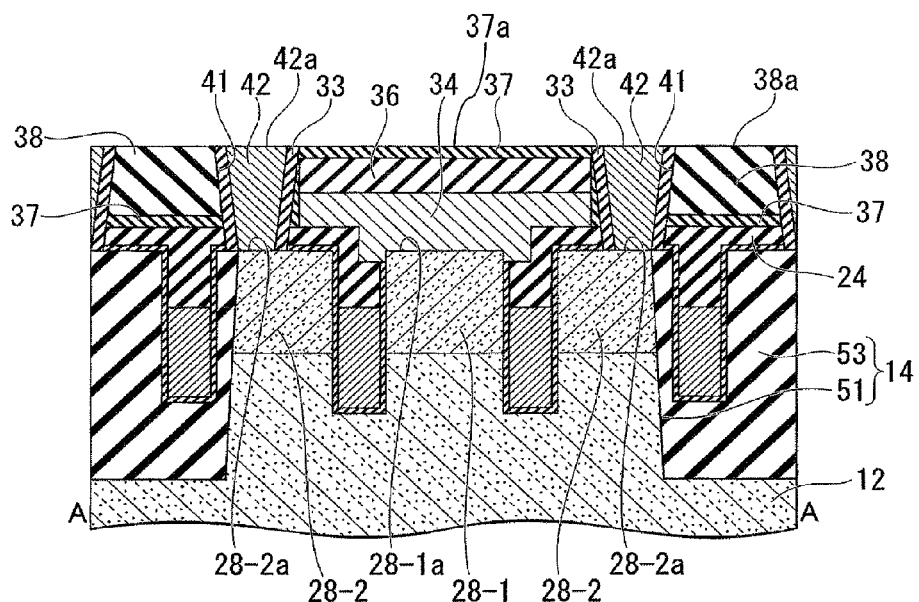
FIG. 11 is a schematic cross-sectional view for explaining the manufacturing method of the semiconductor device according to the first embodiment of the present invention.

Next, a process of forming the capacitive contact plug 42 to be electrically connected to the second impurity diffusion region 28-2 will be described with reference to FIG. 11. FIG. 11 is a cross-sectional view corresponding to a cut surface of the semiconductor device 10 according to the present embodiment illustrated in FIG. 1B and is a schematic cross-sectional view for explaining the manufacturing process in the present embodiment.

A SAC (Self Aligned Contact) method is used to dry-etch the interlayer insulating film 38, buried insulating film 24, and liner film 37 to form the capacitive contact hole 41 exposing therethrough apart of the upper surface of the second impurity diffusion region 28-2.

Subsequently, the capacitive contact plug 42 whose upper surface 42a is set at substantially the same level as the upper surface 38a of the interlayer insulating film 38 and whose bottom surface contacts the upper surface 28-2a of the second impurity diffusion region 28-2 is formed in the capacitive contact hole 41.

More specifically, after formation of a silicon nitride film on the inner surface of the capacitive contact hole 41 to form the side wall nitride film 33, a CVD method is used to sequentially laminate a titanium nitride film (not illustrated) and a tungsten film (not illustrated) so as to fill therewith the capacitive contact hole 41. Then, polishing using a CMP method is applied to remove unnecessary parts of the titanium nitride film and tungsten film formed on the upper surface 38a of the interlayer insulating film 38, thereby forming, in the capacitive contact hole 41, the capacitive contact plug 42 formed of the titanium nitride film and tungsten film. As a result, the capacitive contact plug 42 contacting the upper surface of the other one (second impurity diffusion region 28-2) of the impurity diffusion regions 28 that sandwich the gate trench 18 and electrically connected thereto is formed.

Figure 12:
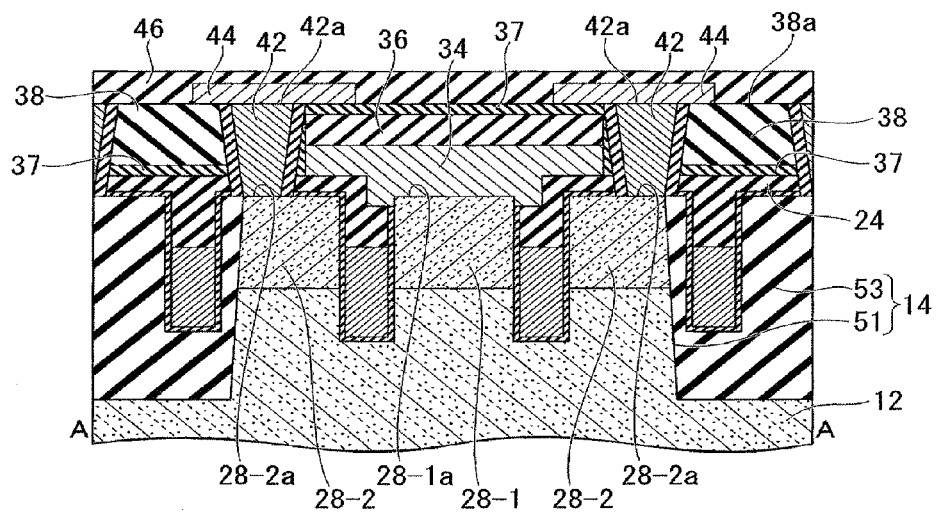
FIG. 12 is a schematic cross-sectional view for explaining the manufacturing method of the semiconductor device according to the first embodiment of the present invention.
Figure 13:
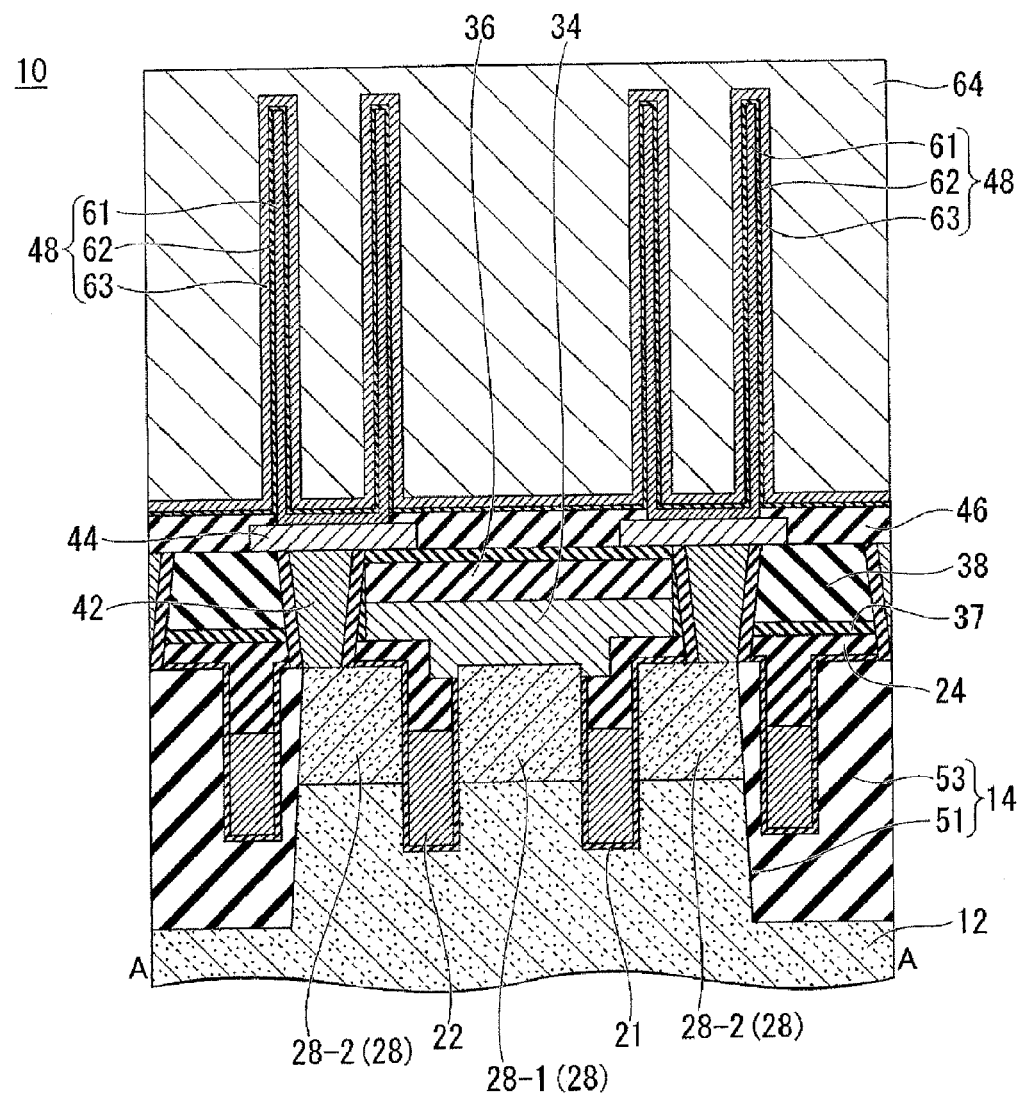
FIG. 13 is a schematic cross-sectional view for explaining the manufacturing method of the semiconductor device according to the first embodiment of the present invention.

Next, a process of forming the capacitor 48 to be electrically connected to the capacitive contact plug 42 will be described with reference to FIGS. 12 and 13. FIGS. 12 and 13 are each a cross-sectional view corresponding to a cut surface of the semiconductor device 10 according to the present embodiment illustrated in FIG. 1B and are each a schematic cross-sectional view for explaining the manufacturing process in the present embodiment.

As illustrated in FIG. 12, the capacitive contact pad 44 contacting apart of the upper surface 42a of the capacitive contact plug 42 is formed on the upper surface 38a of the interlayer insulating film 38. More specifically, a metal film (not illustrated) serving as a base material of the capacitive contact pad 44 is formed so as to cover the upper surface of the liner film 37, upper surface 42a of the capacitive contact plug 42, and upper surface 38a of the interlayer insulating film 38. For example, as the metal film, a tungsten film may be used.

Subsequently, a photolithographic technique is used to form a photoresist (not illustrated) covering only the upper surface of the metal film that corresponds to a formation region of the capacitive contact pad 44. Thereafter, dry-etching is performed using the photoresist as a mask to remove an unnecessary part of the metal film that is exposed through the photoresist to thereby form the capacitive contact pad 44 formed of the metal film. After the formation of the capacitive contact pad 44, the photoresist (not illustrated) is removed.

Subsequently, the etching stopper film 46 covering the capacitive contact pad 44 is formed on an upper surface 37a of the liner film 37, the upper surface 42a of the capacitive contact plug 42, and the upper surface 38a of the interlayer insulating film 38. As the etching stopper film 46, a silicon nitride film may be used.

Subsequently, a silicon oxide film (not illustrated) having a sufficient thickness is formed on the etching stopper film 46. The thickness of the silicon oxide film may be set to, e.g., 1500 nm. Then, a photolithographic technique is used to form a photoresist (not illustrated) patterned on the silicon oxide film.

Subsequently, dry etching using the photoresist as a mask is performed to etch a silicon oxide film (not illustrated) formed on the capacitive contact pad 44 and the etching stopper film 46 to thereby form a cylinder hole (not illustrated) exposing therethrough the capacitive contact pad 44. Thereafter, the photoresist (not illustrated) is removed.

Subsequently, as illustrated in FIG. 13, a conductive film (e.g., a titanium nitride film) is formed on the inner surface of the cylinder hole (not illustrated) and upper surface of the capacitive contact pad 44 to form the lower electrode 61 which is formed of the conductive film and which has a crown shape.

Subsequently, the silicon oxide film (not illustrated) is removed by wet-etching to thereby expose the upper surface of the etching stopper film 46. Thereafter, the capacitive insulating film 62 covering the upper surface of the etching stopper film 46 and surface of the lower electrode 61 is formed.

Subsequently, the upper electrode 63 is formed so as to cover the capacitive insulating film 62, and the plate electrode 64 formed of Si is formed so as to fill therewith between the plurality of upper electrodes 63. At this time, the upper surface of the upper electrode 63 is made to be located above the capacitive insulating film 62. As a result, the capacitor 48 including the lower electrode 61, capacitive insulating film 62, and upper electrode 63 is formed on each capacitive contact pad 44, and the capacitor 48 is electrically connected to the second impurity diffusion region 28-2 through the capacitive contact pad 44.

In the manner as described above, the semiconductor device 10 of the present embodiment is manufactured.

[Manufacturing Method of Semiconductor Device (Second Embodiment)]

The following describes a manufacturing method of the semiconductor device 10 according to a second embodiment of the present invention with reference to FIGS. 14A to 19B.

FIGS. 14A to 19B are process views for explaining an example of the manufacturing method of a semiconductor device 20 according to the second embodiment of the present invention. The semiconductor device illustrated in FIGS. 1A to 1D is manufactured through the processes illustrated in FIGS. 14A to 19B. In FIGS. 14A to 19B, the same reference numerals are given to the same parts as those in the first embodiment.

The manufacturing method of the present embodiment differs from the first embodiment in a formation method of the element isolation trench. Thus, a detailed description will be given with respect to the formation method of the element isolation trench of the present embodiment.

First, a process of forming a first trench 51a in the main surface 12a of the semiconductor substrate 12 so as to form a narrow portion 16a which is formed of the semiconductor substrate, whose upper surface is the main surface 12a of the semiconductor substrate, and which has a first width W1 will be described with reference to FIGS. 14A to 14D.

Figure 14A:
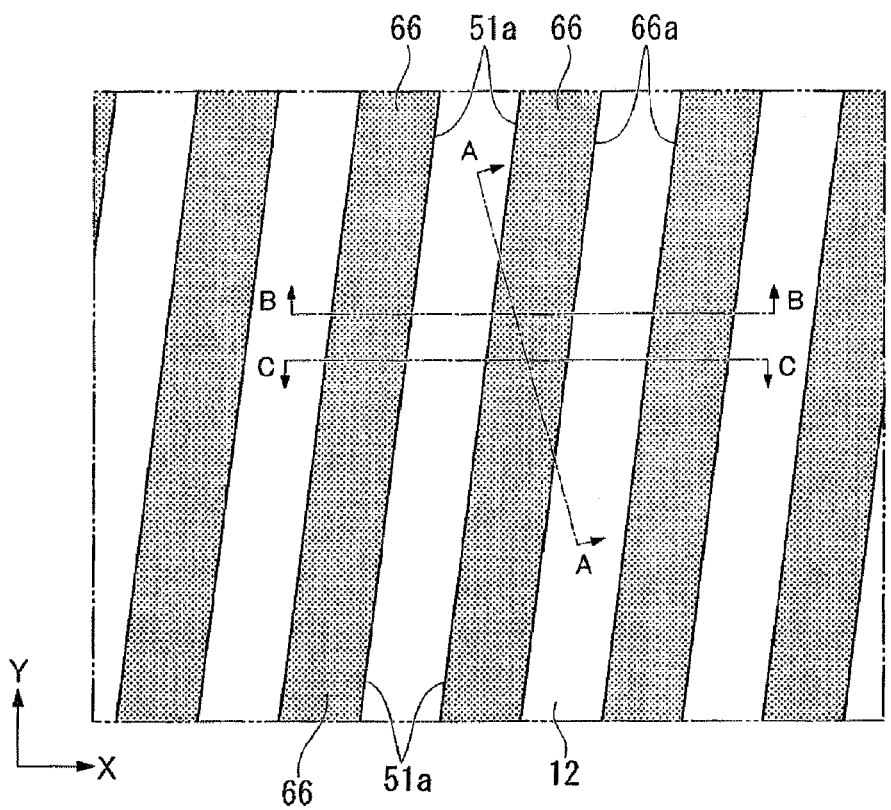
FIG. 14A is a schematic plan view for explaining the manufacturing method of the semiconductor device according to the second embodiment of the present invention.
Figure 14B:
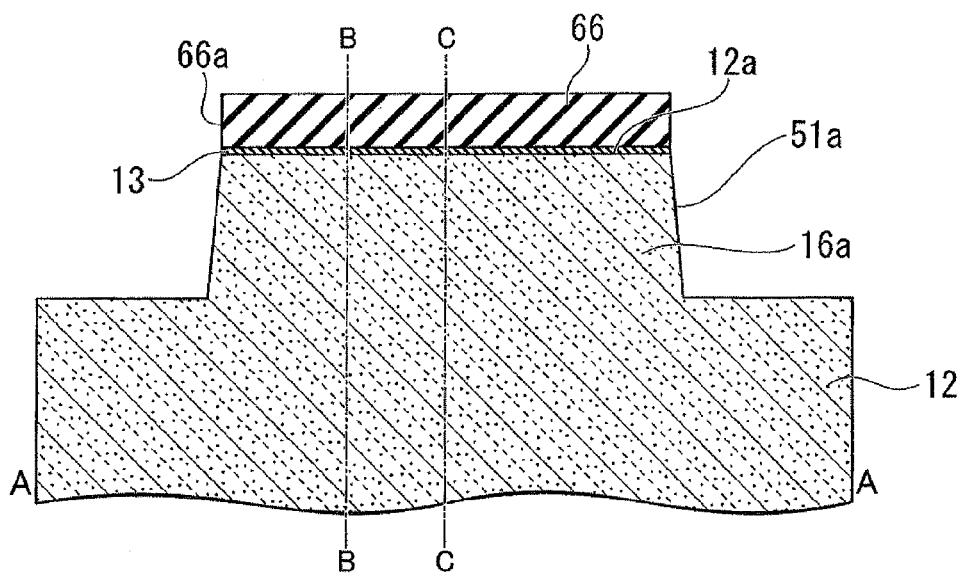
FIG. 14B is a schematic cross-sectional view taken along line A-A of FIG. 14A.
Figure 14C:
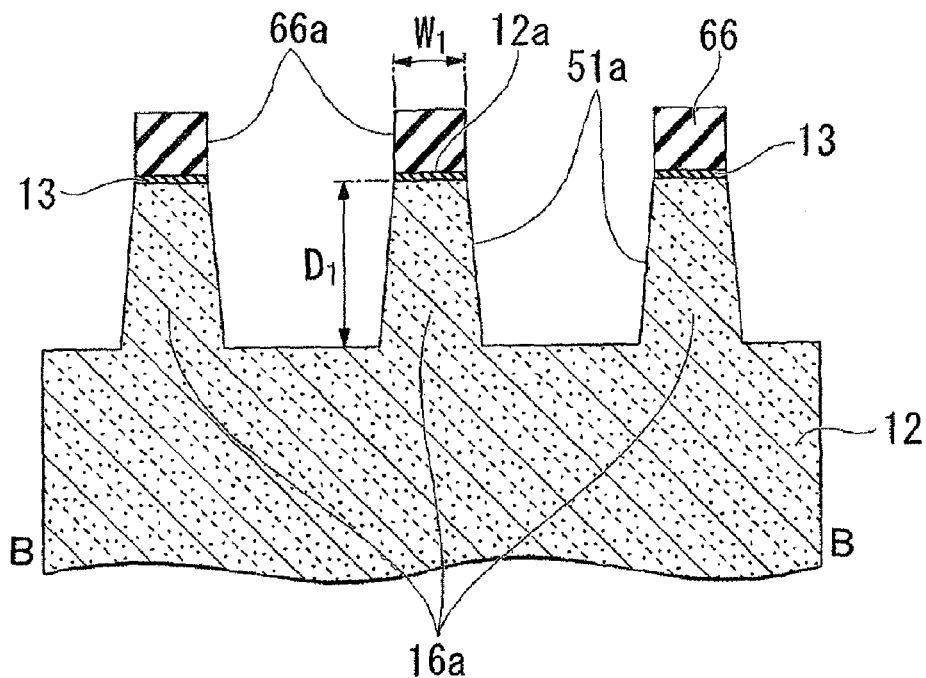
FIG. 14C is a schematic cross-sectional view taken along line B-B of FIG. 14A.
Figure 14D:
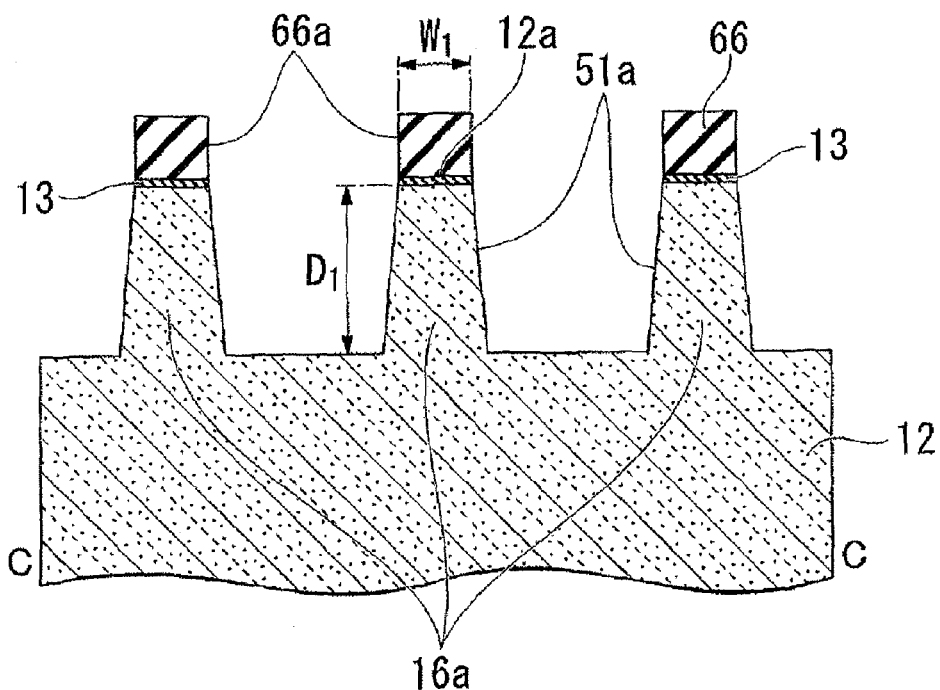
FIG. 14D is a schematic cross-sectional view taken along line C-C of FIG. 14A.

FIG. 14A is a schematic plan view for explaining the manufacturing method of the semiconductor device 20 according to the present embodiment. FIG. 14B is a schematic cross-sectional view taken along line A-A of FIG. 14A. FIG. 14C is a schematic cross-sectional view taken along line B-B of FIG. 14A. FIG. 14D is a schematic cross-sectional view taken along line C-C of FIG. 14A.

First, according to the same method as in the first embodiment, the pad oxide film 13 and field nitride film 66 having the opening portion 66a are formed. As in the first embodiment, the opening portion 66a is formed in multiple numbers so as to extend in a band in a direction (first direction) inclined at a predetermined angle relative to Y-direction and to be arranged at predetermined intervals in X-direction. The opening portion 66a is formed so as to expose therethrough the upper surface of the pad oxide film 13 corresponding to a formation region of an element isolation trench 51'.

Subsequently, anisotropic dry etching is applied to the semiconductor substrate 12 using the field nitride film 66 having the opening portion 66a as a mask. As a result, the first trench 51a extending in the first direction is formed as illustrated in FIGS. 14A to 14D. A depth D1 (depth from the main surface 12a of the semiconductor substrate 12) of the first trench 51a is, e.g., 50 nm to 80 nm.

Forming the first trench 51a extending in the first direction as illustrated in FIGS. 14A, 14C, and 14D allows formation of the narrow portion 16a which is a part of the semiconductor substrate 12 that has the first width W1 in a direction perpendicular to the first direction and protrudes toward the main surface 12a side from the bottom surface of the first trench 51a. The first width W1 refers to a width of the upper surface of the narrow portion 16a, as illustrated in FIGS. 14C and 14D.

Next, a process of forming a side wall insulating film 68 and a process in which a second trench 51b is formed in the bottom surface of the first trench 51a to form a wide portion 16b having a second width W2 greater than the first width W1 below the narrow portion 16a so as to define an active region 16' including the narrow portion 16a and wide portion 16b will be described with reference to FIGS. 15A to 15D.

Figure 15A:
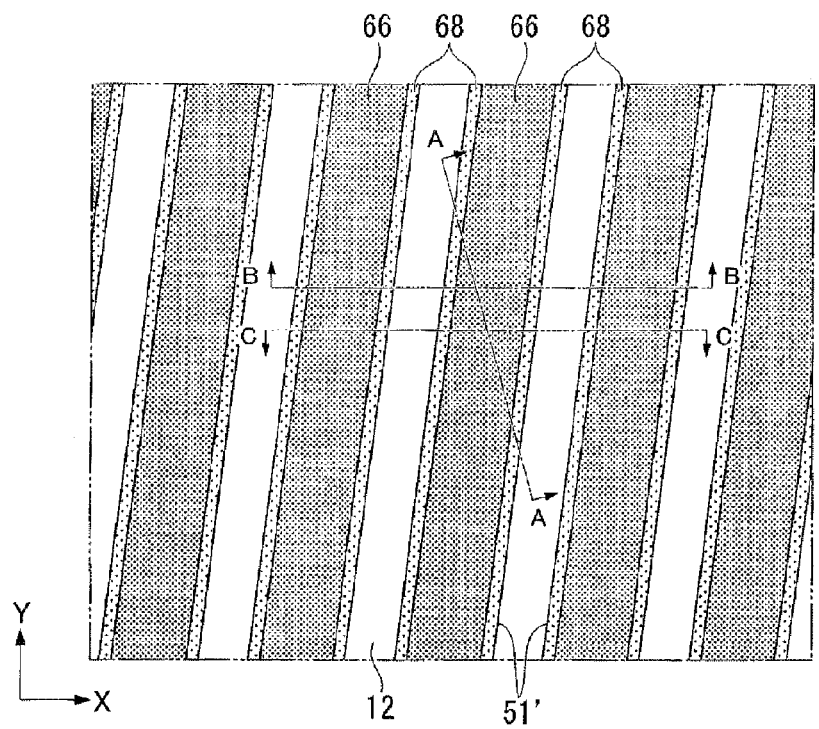
FIG. 15A is a schematic plan view for explaining the manufacturing method of the semiconductor device according to the second embodiment of the present invention.
Figure 15B:
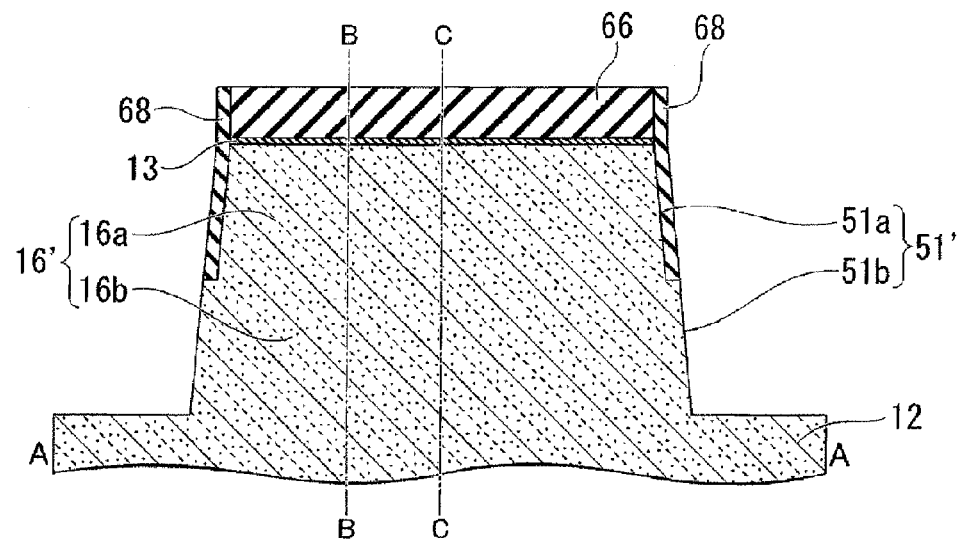
FIG. 15B is a schematic cross-sectional view taken along line A-A of FIG. 15A.
Figure 15C:
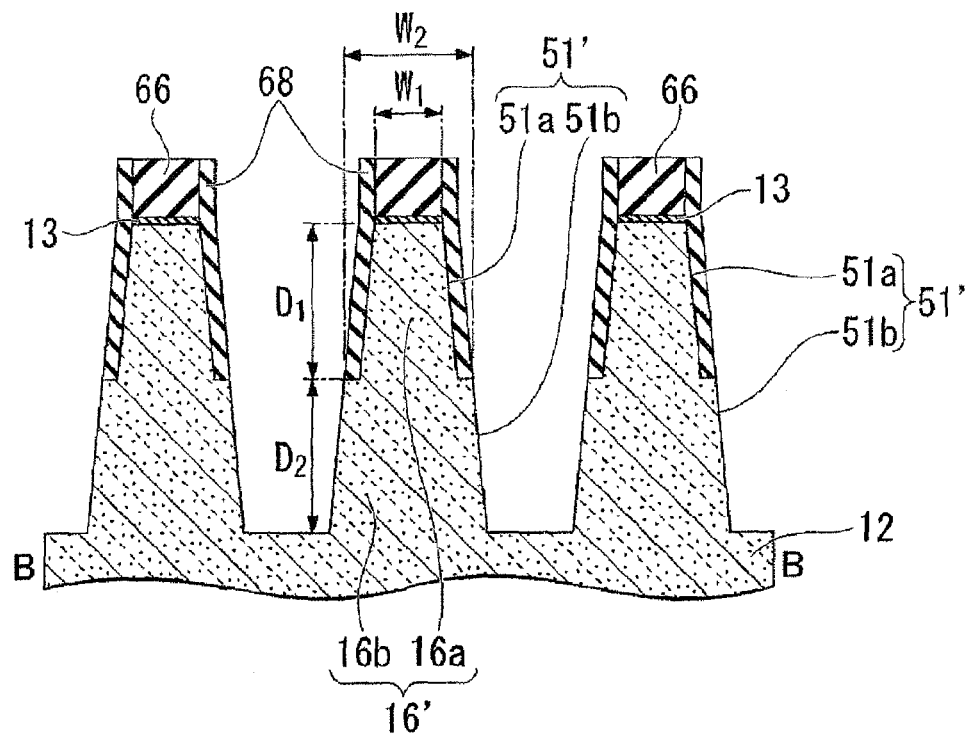
FIG. 15C is a schematic cross-sectional view taken along line B-B of FIG. 15A.
Figure 15D:
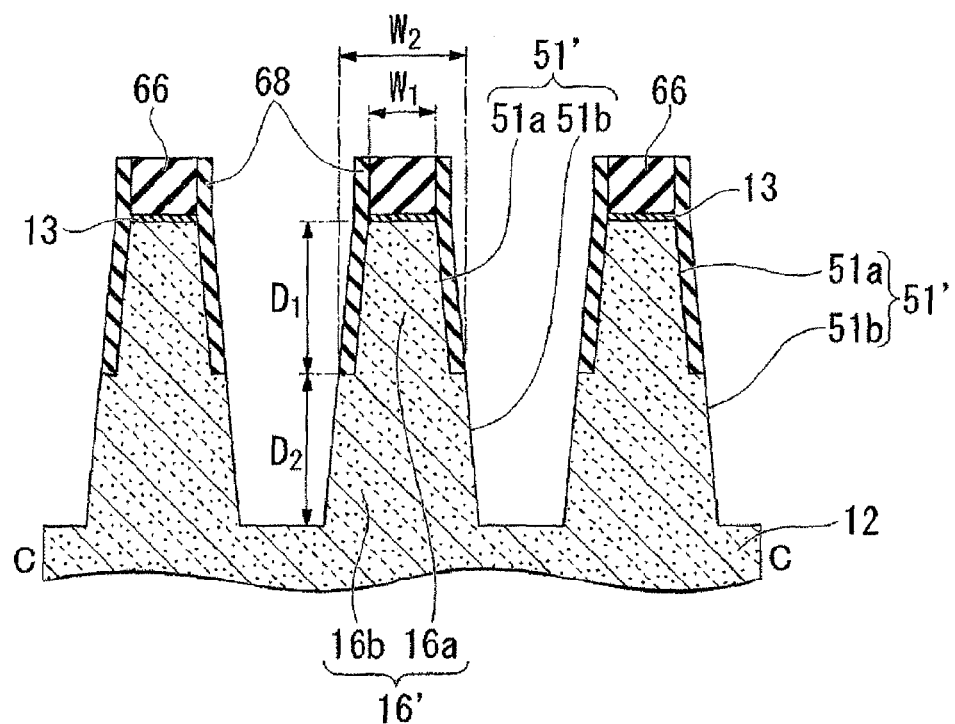
FIG. 15D is a schematic cross-sectional view taken along line C-C of FIG. 15A.

FIG. 15A is a schematic plan view for explaining the manufacturing method of the semiconductor device 20 according to the present embodiment. FIG. 15B is a schematic cross-sectional view taken along line A-A of FIG. 15A. FIG. 15C is a schematic cross-sectional view taken along line B-B of FIG. 15A. FIG. 15D is a schematic cross-sectional view taken along line C-C of FIG. 15A.

A silicon oxide film is formed so as to cover the inner surface of the first trench 51a and upper surface of the field nitride film 66. The silicon oxide film is formed by, e.g., a CVD method.

Subsequently, dry etching is performed to etch the silicon oxide film formed on the bottom surface of the first trench 51a and upper surface of the field nitride film 66 as illustrated in FIGS. 15C and 15D. As a result, the silicon oxide film remains on the side surface of the narrow portion 16a which is the inner wall of the first trench 51a to thereby form the side wall insulating film 68. The thickness of the side wall insulating film 68 is set so as not to fill therewith the first trench 51a. A preferable thickness is, e.g., 5 nm to 10 nm.

Then, as illustrated in FIGS. 15A to 15D, anisotropic dry etching is performed using the side wall insulating film 68 as a mask to etch the semiconductor substrate 12 lying below the first trench 51a. As a result, the second trench 51b having a trench width smaller than that of the first trench 51a is formed in the bottom surface of the first trench 51a. A depth D2 (depth from the bottom surface of the first trench 51a) of the second trench 51b is, e.g., 120 nm to 230 nm.

As illustrated in FIGS. 15C and 15D, the formation of the second trench 51b results in formation of the element isolation trench 51' including the first trench 51a and second trench 51b and having a depth of D1+D2 (250 nm to 300 nm). The formation of the second trench 51b further results in formation of the wide portion 16b having the second width W2 greater than the first width W1 below the narrow portion 16a. The second width W2 refers to a width of the upper surface of the wide portion 16b, as illustrated in FIGS. 15C and 15D.

In this manner, the active region 16' including the narrow portion 16a and wide portion 16b is defined.

In the manner as described above, the element isolation trench 51' according to the present embodiment can be formed. The processes after the formation of the element isolation trench 51', i.e., those from the formation of the element isolation region to formation of the capacitor can be the same as those of the first embodiment.

The following describes a process of forming the element isolation region 14 in the present embodiment, a process of performing the first anisotropic etching therein, and a process of performing the second anisotropic etching to form the channel portion 71 therein.

First, a process of forming the element isolation region 14 so as to cover the outer wall of the active region 16' will be described with reference to FIGS. 16A to 16D.

Figure 16A:
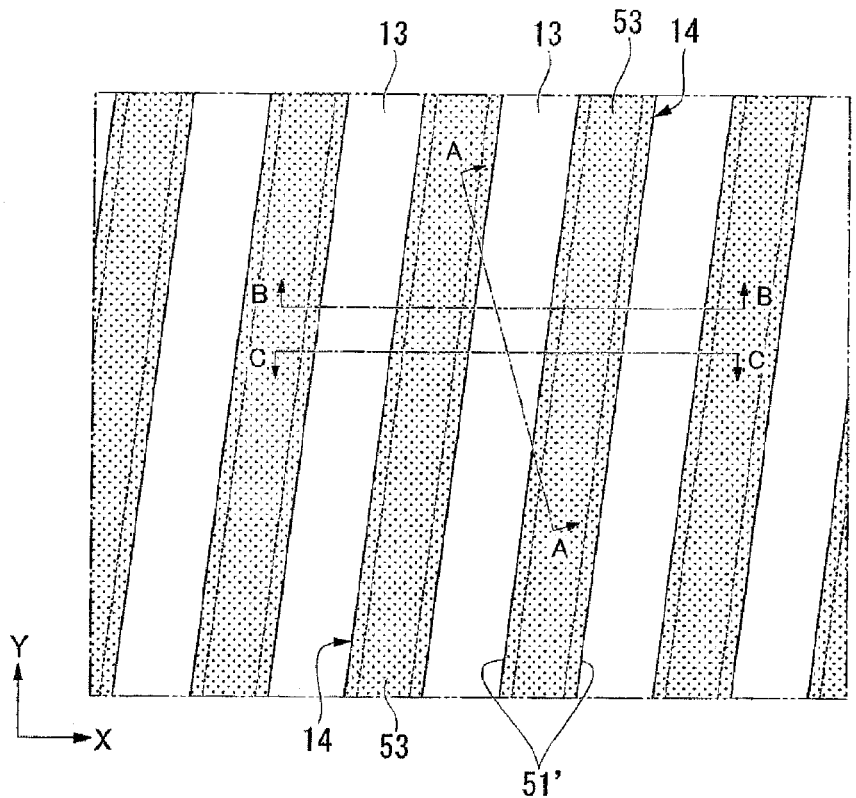
FIG. 16A is a schematic plan view for explaining the manufacturing method of the semiconductor device according to the second embodiment of the present invention.
Figure 16B:
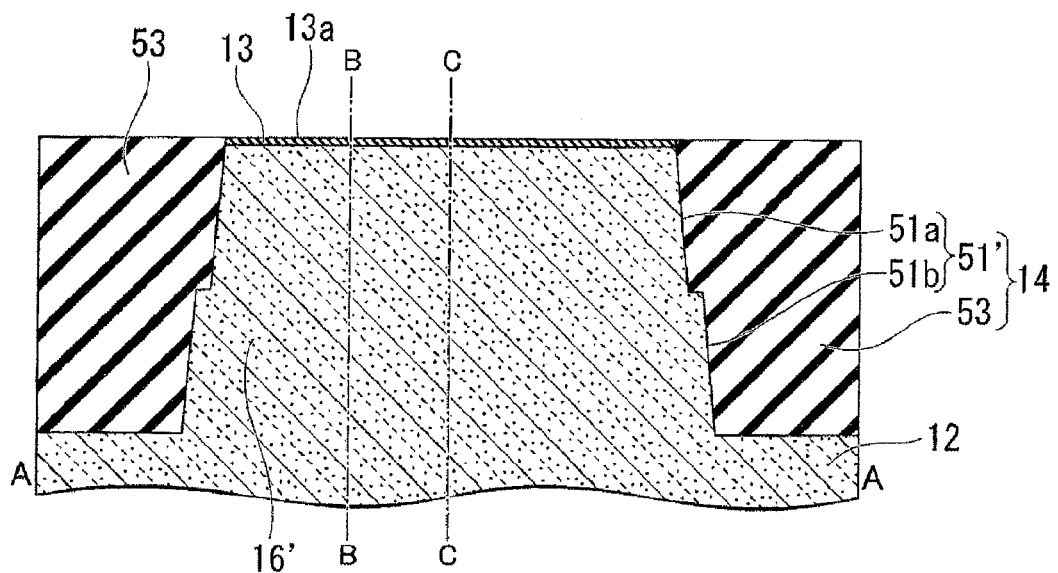
FIG. 16B is a schematic cross-sectional view taken along line A-A of FIG. 16A.
Figure 16C:
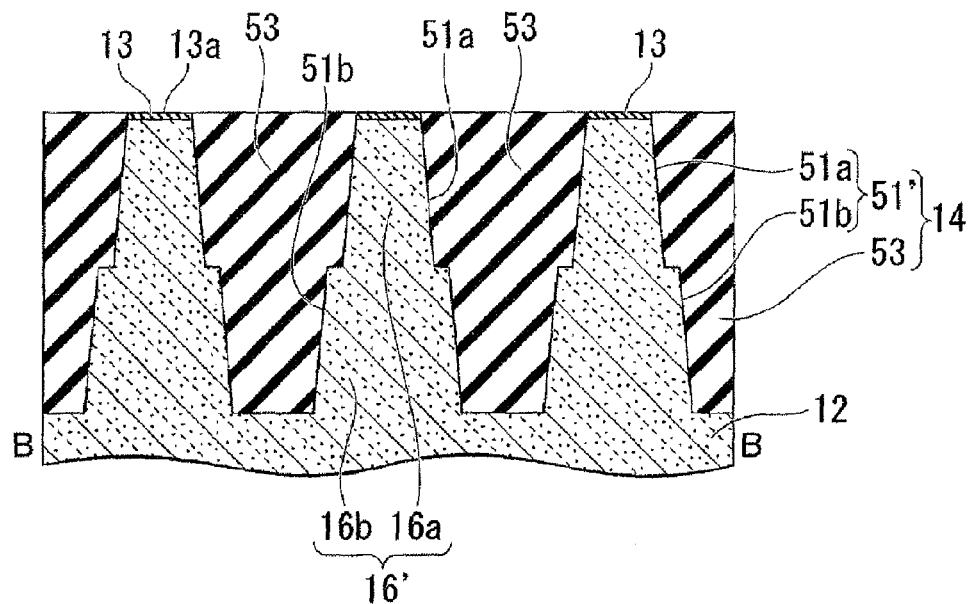
FIG. 16C is a schematic cross-sectional view taken along line B-B of FIG. 16A.
Figure 16D:
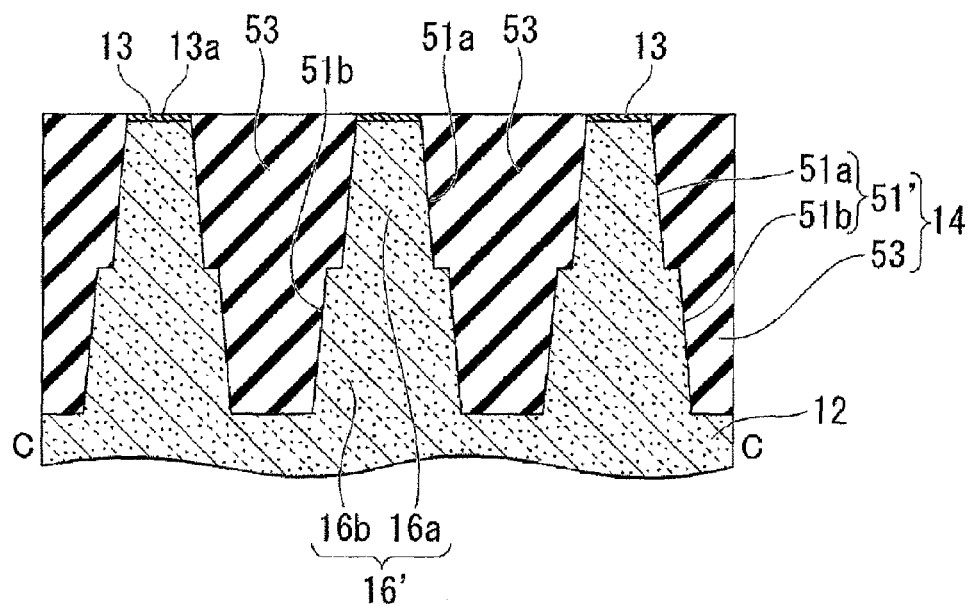
FIG. 16D is a schematic cross-sectional view taken along line C-C of FIG. 16A.

FIG. 16A is a schematic plan view for explaining the manufacturing method of the semiconductor device 20 according to the present embodiment. FIG. 16B is a schematic cross-sectional view taken along line A-A of FIG. 16A. FIG. 16C is a schematic cross-sectional view taken along line B-B of FIG. 16A. FIG. 16D is a schematic cross-sectional view taken along line C-C of FIG. 16A.

First, an insulating film is buried in the element isolation trench 51' including the first trench 51a and second trench 51b, and the element isolation insulating film 53 is formed in such a way that the upper surface of the insulating film is set at substantially the same level as the upper surface 13a of the pad oxide film 13. As a result, the element isolation region 14 including the element isolation insulating film 53 which is an insulating film, side wall insulating film 68, and element isolation trench 51' is formed. The concrete formation method of the element isolation region 14 is the same as that in the first embodiment.

Next, a process of removing a part of the active region 16' and a part of the element isolation insulating film 53 by the first anisotropic etching after formation of the impurity diffusion region 28 in the upper layer portion of the active region 16' will be described with reference to FIGS. 17A to 17D.

Figure 17A:
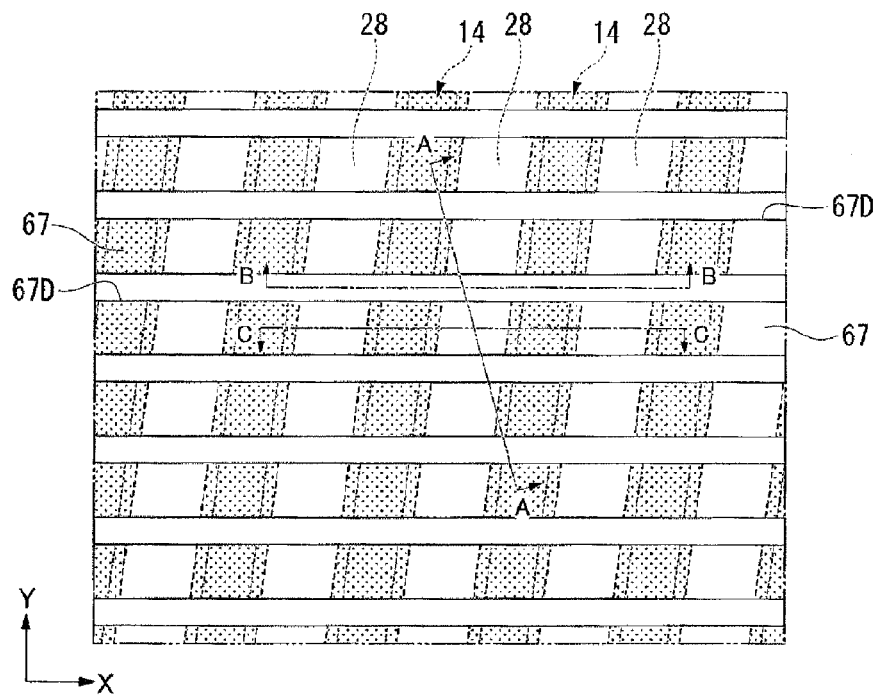
FIG. 17A is a schematic plan view for explaining the manufacturing method of the semiconductor device according to the second embodiment of the present invention.
Figure 17B:
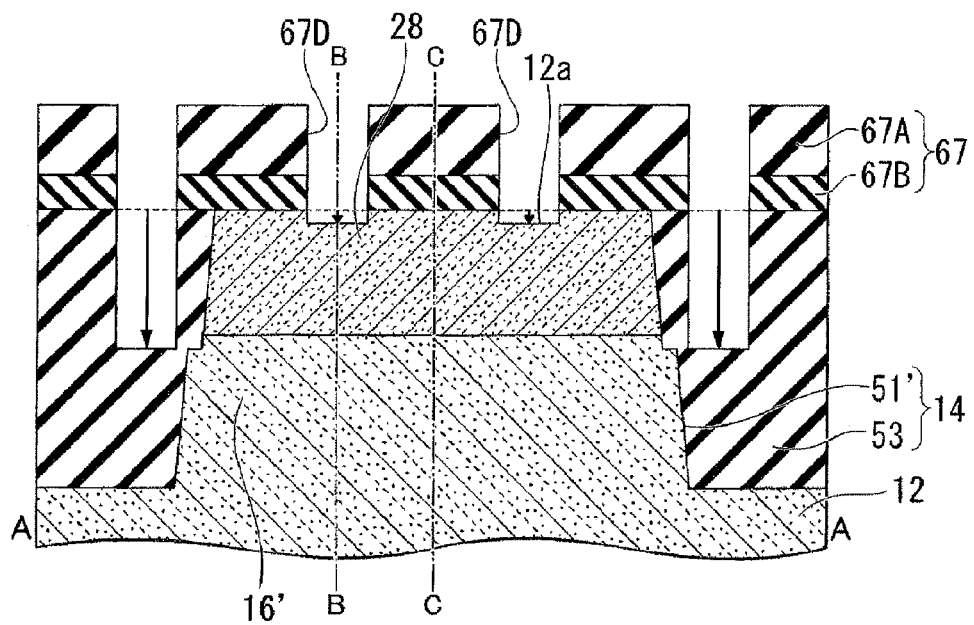
FIG. 17B is a schematic cross-sectional view taken along line A-A of FIG. 17A.
Figure 17C:
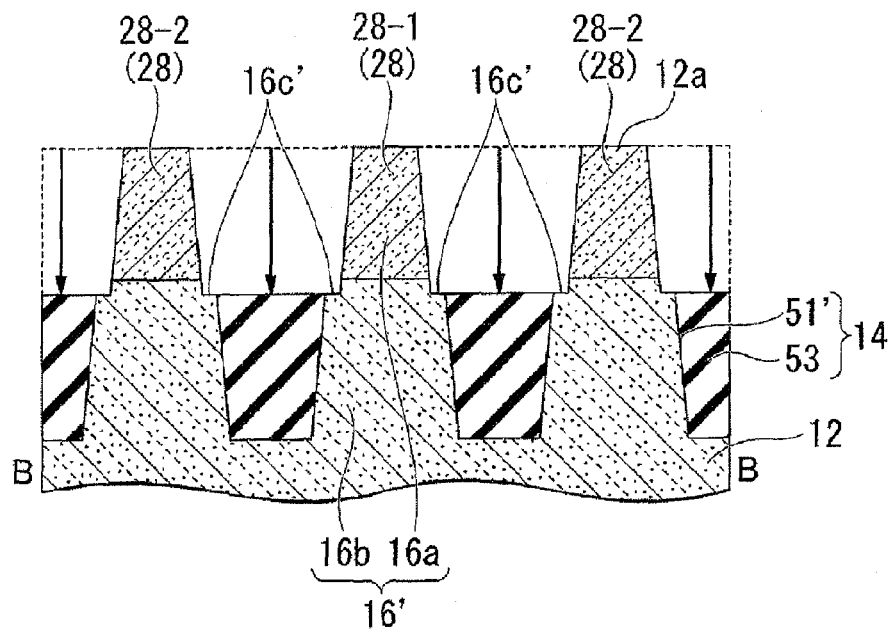
FIG. 17C is a schematic cross-sectional view taken along line B-B of FIG. 17A.
Figure 17D:
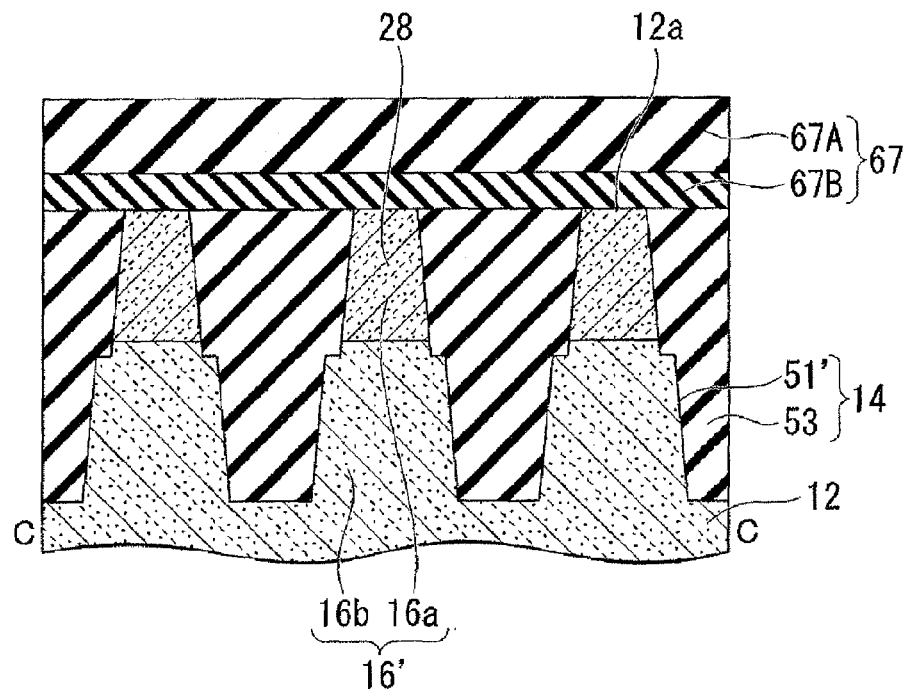
FIG. 17D is a schematic cross-sectional view taken along line C-C of FIG. 17A.

FIG. 17A is a schematic plan view for explaining the manufacturing method of the semiconductor device 20 according to the present embodiment. FIG. 17B is a schematic cross-sectional view taken along line A-A of FIG. 17A. FIG. 17C is a schematic cross-sectional view taken along line B-B of FIG. 17A. FIG. 17D is a schematic cross-sectional view taken along line C-C of FIG. 17A.

The upper surface of the element isolation region 14 is oxidized to form the silicon oxide film 17. Note that the pad oxide film 13 formed on the main surface 12a of the semiconductor substrate 12 is formed of the same material (silicon oxide), so that the pad oxide film 13 is included in the silicon oxide film 17 in this and subsequent processes as in the first embodiment.

An impurity (n-type impurity, in the present embodiment) having a conductivity type different from that of the semiconductor substrate 12 is ion-implanted into the main surface 12a of the semiconductor substrate 12 through the silicon oxide film 17. As a result, the impurity diffusion region 28 whose upper surface has been set at substantially the same level as the main surface 12a of the semiconductor substrate 12 is formed. Thereafter, the silicon oxide film 17 including the pad oxide film 13 is removed by etching.

Then, as in the first embodiment, the first mask 67 including the silicon nitride film 67B and resist mask (amorphous carbon film) 67A having a line-and-space pattern is formed, and then the silicon nitride film 67B is etched using the amorphous carbon film 67A as a mask to form the opening portion 67D in the first mask 67.

Then, the first mask 67 having the opening portion 67D is used to perform the first anisotropic etching to etch the active region 16' and element isolation insulating film 53 to desired depths, respectively, while removing a part of the active region 16' and a part of the element isolation insulating film 53 as illustrated in FIGS. 17B and 17C. As in the first embodiment, the first anisotropic etching in the present embodiment is performed at a higher etching rate for the element isolation insulating film 53 than for the semiconductor substrate 12.

The element isolation insulating film 53 is etched by the first anisotropic etching by a depth corresponding to the depth D1 of the first trench 51a (see arrows in FIGS. 17B and 17C). Etching the element isolation insulating film 53 by a depth corresponding to the depth D1 of the first trench 51a allows a part of the semiconductor substrate 12 that corresponds to a stepped portion between the narrow portion 16a and wide portion 16b to be exposed. That is, in the present embodiment, it is possible to expose a part of the semiconductor substrate without performing the side etching which is performed in the first anisotropic etching of the first embodiment. Hereinafter, the exposed part is referred to as an exposed portion 16c'.

Following the first anisotropic etching, the first mask 67 is used to perform the second anisotropic etching to remove a part of the active region 16' and a part of the element isolation insulating film 53 to thereby form the gate trench in such a way that the upper surface of the active region 16 has the first, second, and third protruding portions A1 to A3 which are arranged in the first direction. This formation process will be described with reference to FIGS. 18A to 18D.

Figure 18A:
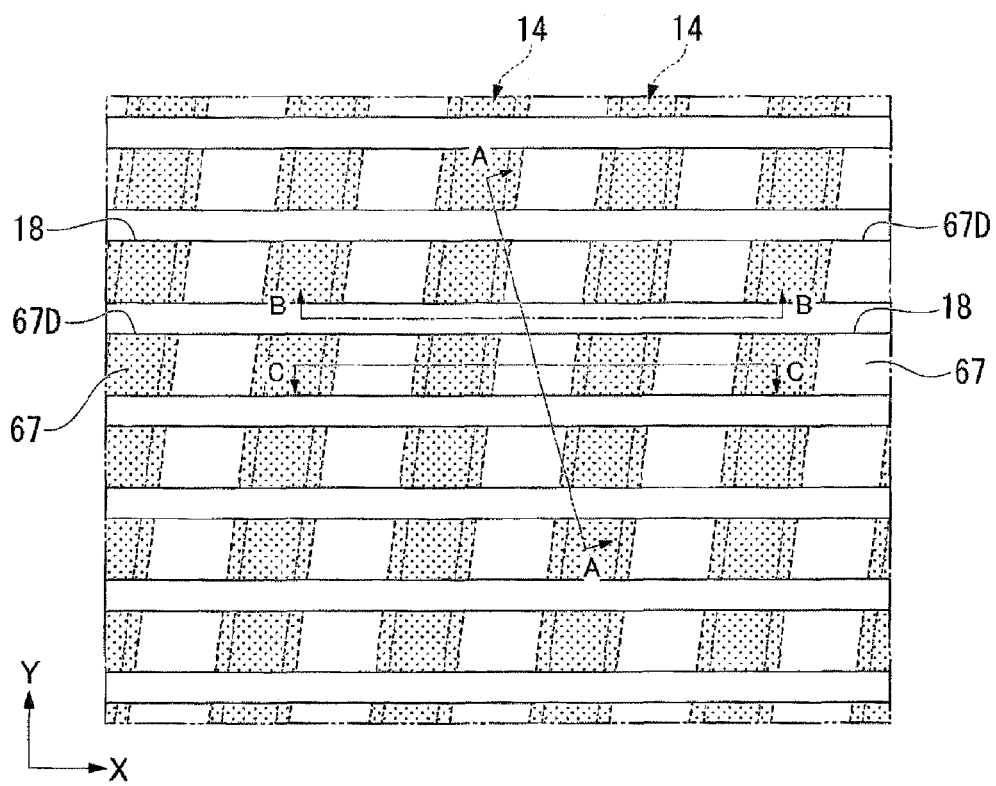
FIG. 18A is a schematic plan view for explaining the manufacturing method of the semiconductor device according to the second embodiment of the present invention.
Figure 18B:
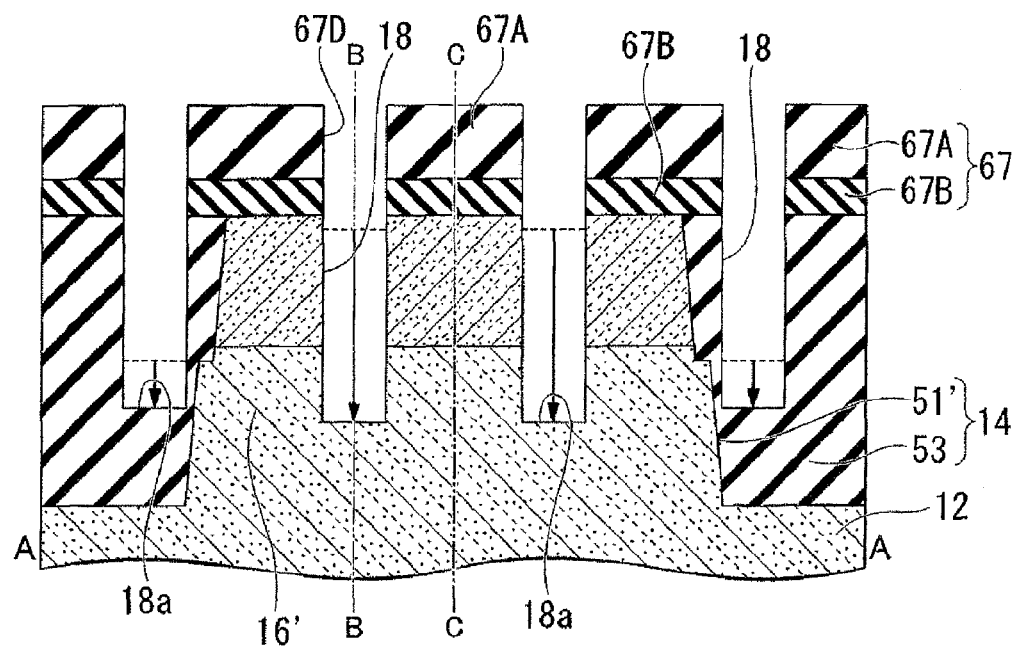
FIG. 18B is a schematic cross-sectional view taken along line A-A of FIG. 18A.
Figure 18C:
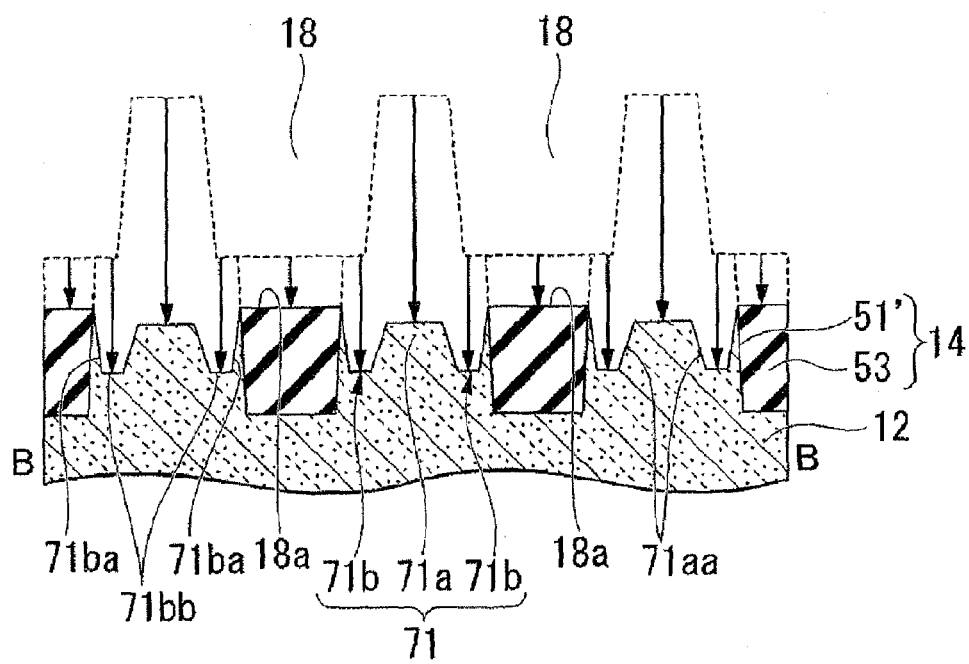
FIG. 18C is a schematic cross-sectional view taken along line B-B of FIG. 18A.
Figure 18D:
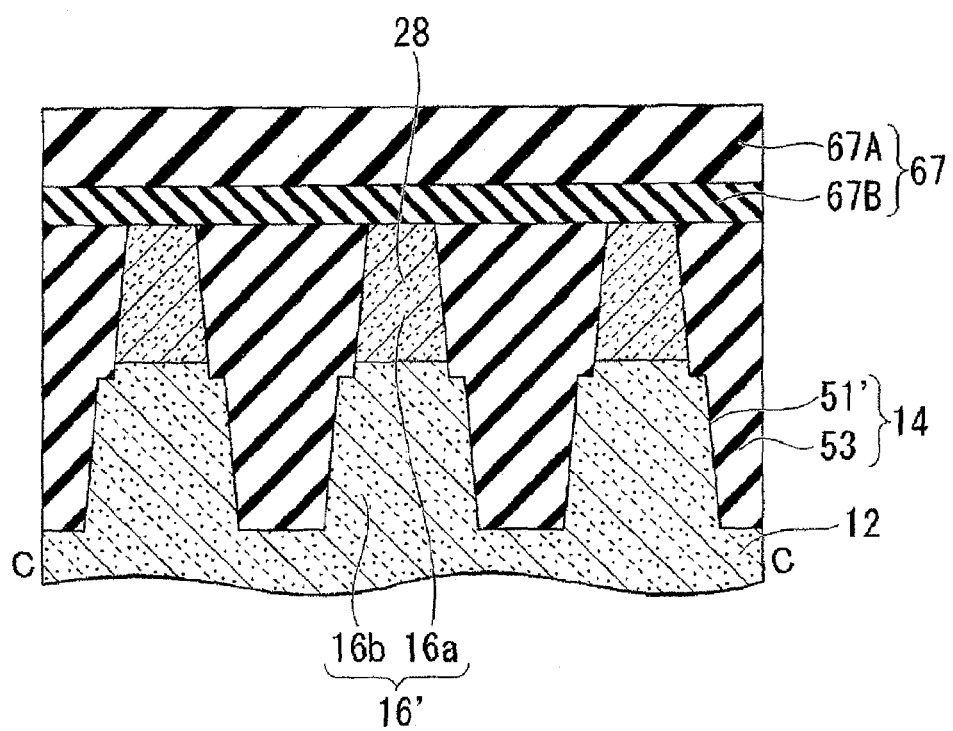
FIG. 18D is a schematic cross-sectional view taken along line C-C of FIG. 18A.

FIG. 18A is a schematic plan view for explaining the manufacturing method of the semiconductor device 20 according to the present embodiment. FIG. 18B is a schematic cross-sectional view taken along line A-A of FIG. 18A. FIG. 18C is a schematic cross-sectional view taken along line B-B of FIG. 18A. FIG. 18D is a schematic cross-sectional view taken along line C-C of FIG. 18A.

After the first anisotropic etching, the first mask 67 having the opening portion 67D is used like above to perform the second anisotropic etching to etch the active region 16' and element isolation insulating film 53 to desired depths, respectively, while further partly removing the active region 16' and element isolation insulating film 53 as illustrated in FIGS. 18B and 18C. As in the first embodiment, the second anisotropic etching in the present embodiment is performed at a higher etching rate for the semiconductor substrate 12 than for the element isolation insulating film 53. Performing the second anisotropic etching etches the exposed portion 16c' which is an exposed part of the semiconductor substrate 12 with the result that the active region 16' is etched dapper than the element isolation region 14.

In this manner, the gate trench 18 can be formed in such a way that the upper surface of the active region 16 exposed at the bottom portion of the gate trench 18 has the first, second, and third protruding portions A1 to A3 which are arranged in the first direction.

Figure 19A:
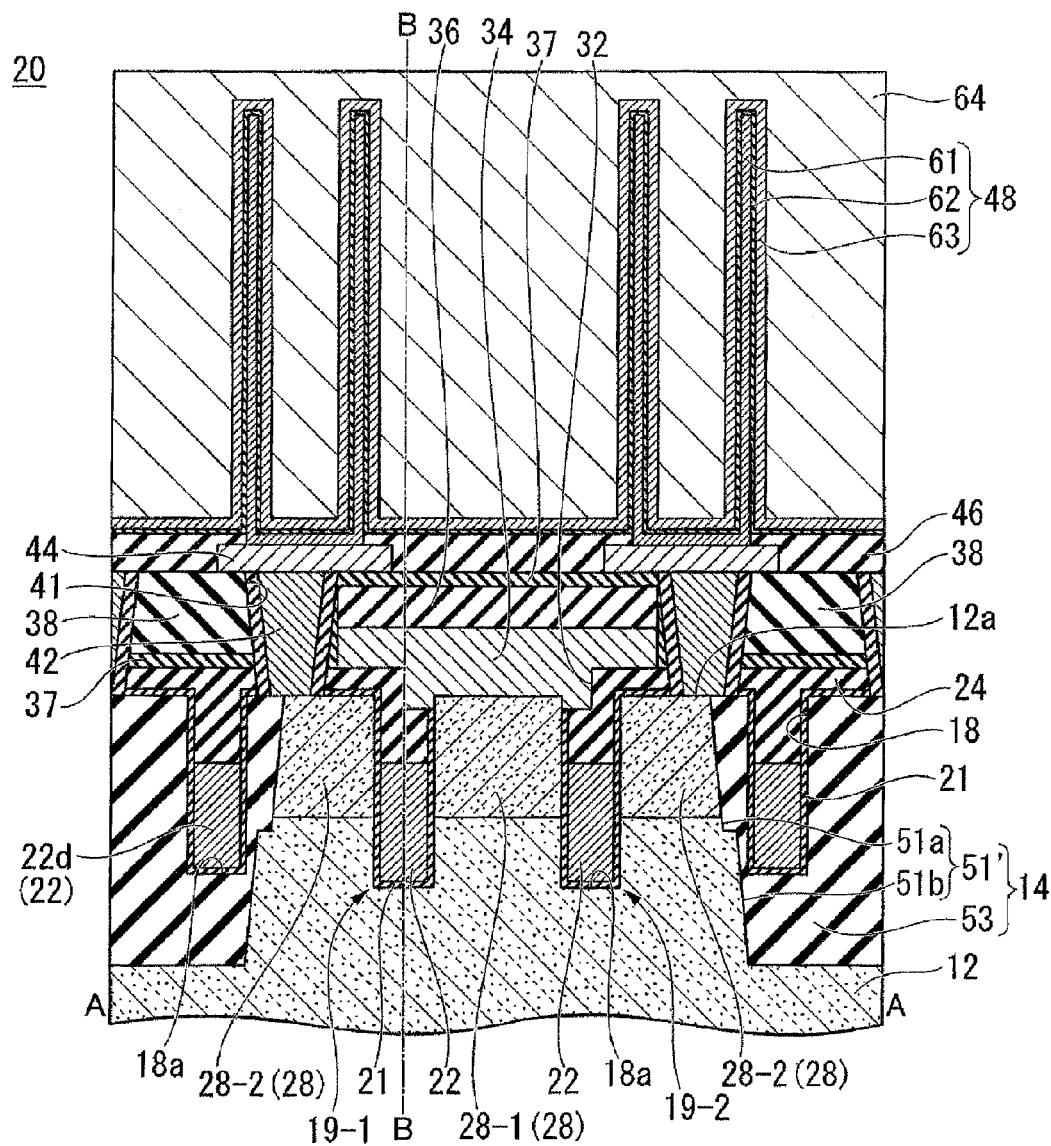
FIG. 19A is a schematic cross-sectional view for explaining the manufacturing method of the semiconductor device according to the second embodiment of the present invention.
Figure 19B:
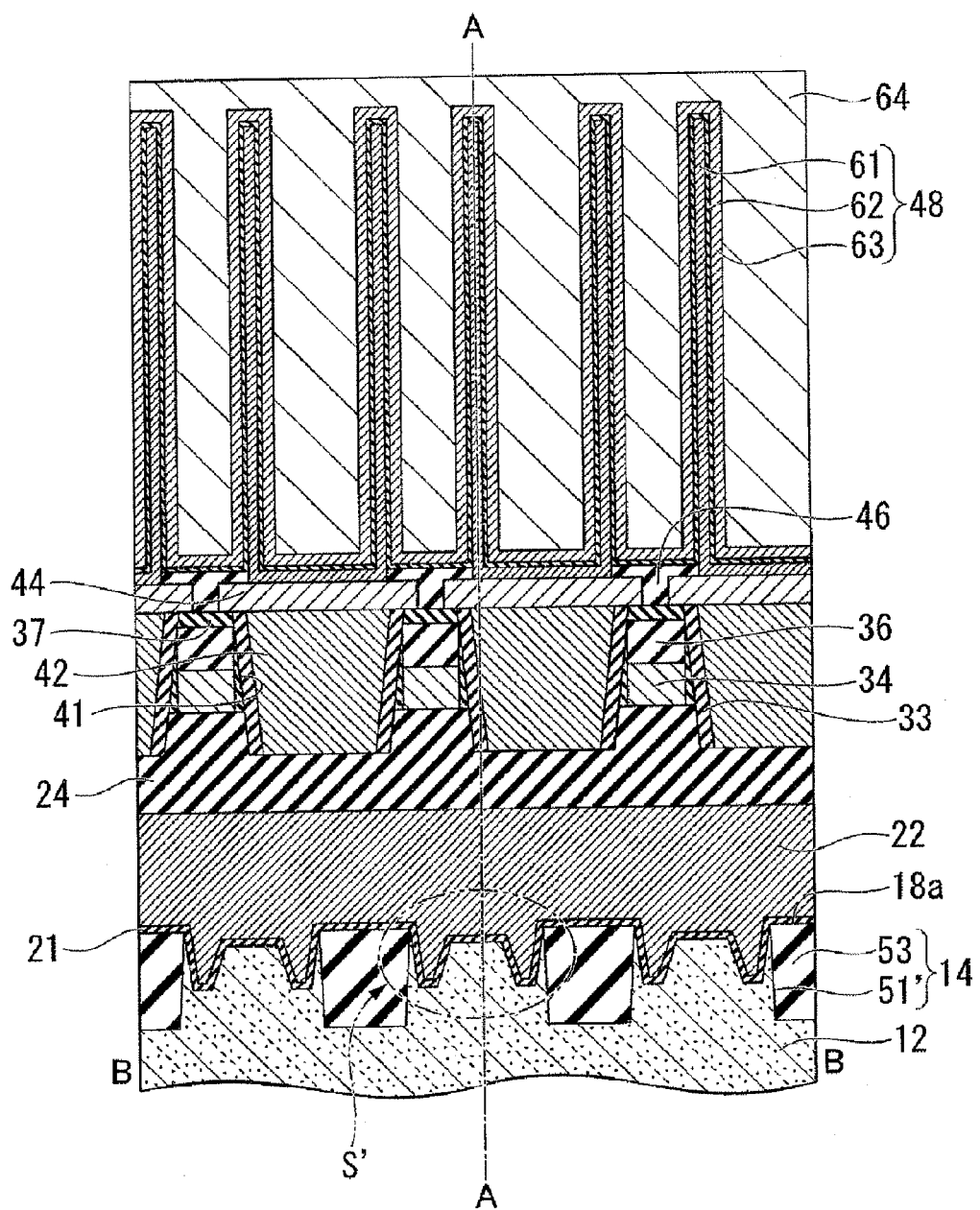
FIG. 19B is a schematic cross-sectional view for explaining the manufacturing method of the semiconductor device according to the second embodiment of the present invention.

A structure of a portion enclosed by circle S' of FIG. 19B is the same as the portion enclosed by circle S of FIG. 1C. That is, the structure of the channel portion 71 obtained in the present embodiment is the same as that of the first embodiment, so that the same effects as those in the first embodiment can be obtained.

The width of the exposed portion 16c' in the present embodiment is an important factor for forming the channel portion 71 as illustrated in FIG. 18C, particularly, the concave 71b. That is, controlling the width of the exposed portion 16c' allows the concave 71b to be formed into a desired shape.

Such a width of the exposed portion 16c' corresponds to a step between the first trench 51a and second trench 51b. A size of the step is determined by the film thickness of the side wall insulating film 68 to be formed on the inner wall of the first trench 51a as illustrated in FIG. 15B, so that it is possible to control the width of the exposed portion 16c' by controlling the film thickness of the side wall insulating film 68. That is, in the present embodiment, effect of the side etching in the first embodiment can be achieved by the control of the film thickness of the side wall insulating film 68.

After the formation of the gate trench 18, the processes after the formation of the gate trench 18, i.e., the process of forming the gate electrode and subsequent processes can be the same as those of the first embodiment.

With the processes described above, the semiconductor device 20 according to the present embodiment as illustrated in FIGS. 19A and 19B can be manufactured.

What is claimed is:

1. A semiconductor device comprising:
   an active region defined by an element isolation region;
   a gate trench crossing the active region to define source and drain regions on both sides thereof, respectively, and to define a channel region between the source and drain regions, the channel region having a first, second, and third protruding portions arranged in a gate width direction, the third protruding portion being between the first and second protruding portions to define a fin-shaped channel portion and giving the channel region a substantially W-shape; and
   a gate electrode formed in the gate trench so as to cover the channel region with an intervention of a gate insulating film.

2. The semiconductor device as claimed in claim 1, wherein
   each of the first and second protruding portions of the channel region is in contact with the element isolation region.

3. The semiconductor device as claimed in claim 2, wherein each of the first and second protruding portions of the channel region has a side wall that is inclined.

4. The semiconductor device as claimed in claim 2, wherein a distance between an upper surface of the active region and a top portion of the third protruding portion of the channel region is greater than a distance between the upper surface of the active region and a top portion of the first protruding portion of the channel region.

5. The semiconductor device as claimed in claim 1, wherein an upper surface of the gate electrode is disposed at a position deeper than an upper surface of the active region.

6. The semiconductor device as claimed in claim 1, wherein the source and drain regions are impurity diffusion regions having a conductivity type different from that of the active region.

7. The semiconductor device as claimed in claim 1 further comprising a capacitive element electrically connected to one of the source and drain regions,
   wherein a field-effect transistor constituted by the active region, the gate insulating film, the gate electrode, and the source and drain regions and the capacitive element constitute a memory cell.

8. The semiconductor device as claimed in claim 1 further comprising:
   a plurality of field-effect transistors each of which is constituted by the active region, the gate insulating film, the gate electrode, and the source and drain regions;
   a plurality of capacitive elements each of which is electrically connected to one of the source and drain regions of an associated one of the field-effect transistors; and
   a conductive wire electrically connected to the other of the source and drain regions of each of the field-effect transistors so that the conductive wire is shared by the field-effect transistors.

9. A semiconductor device comprising a field-effect transistor, the field-effect transistor including:
   an active region defined in a semiconductor substrate by an element isolation region;
   a gate trench crossing the active region to define source and drain regions on both sides thereof, respectively, the gate trench having a bottom portion whose cross-sectional shape in an extending direction of the gate trench has a downward protruding portion and an upward protruding portion to define a fin-shaped channel portion and giving the bottom portion a substantially W-shape; and
   a gate electrode buried in the gate trench included in the active region with intervention with a gate insulating film,
   wherein the downward protruding portion and upward protruding portion of the gate trench share one side wall, the active region being buried between the other side wall of the downward protruding portion and the element isolation region closest to the other side wall thereof and between the one side wall of the upward protruding portion and the other side wall thereof.

10. The semiconductor device as claimed in claim 9, wherein the gate trench has one upward protruding portion and two downward protruding portions which are arranged in the order of the downward protruding portion, the upward protruding portion, and the downward protruding portion along the extending direction of the gate trench.

11. The semiconductor device as claimed in claim 9, wherein the other side wall of the downward protruding portion of the gate trench is in contact with the element isolation region.

12. The semiconductor device as claimed in claim 9, wherein the other side wall of the downward protruding portion of the gate trench is inclined.

13. The semiconductor device as claimed in claim 9, wherein the active region located below the gate insulating film covering the downward protruding portion and the upward protruding portion of the gate trench serves as a channel region of the field-effect transistor.

14. The semiconductor device as claimed in claim 9, wherein
   each of the source and drain regions includes an impurity diffusion region extending in a depth direction from an upper surface of the active region and having a conductivity type opposite to that of the active region, and
   a top portion of the upward protruding portion of the gate trench that is closest to a main surface of the semiconductor substrate is disposed at a position more away from the main surface of the semiconductor substrate than lower surfaces of the impurity diffusion regions.

15. The semiconductor device as claimed in claim 9, wherein an upper surface of the gate electrode is positioned lower than a main surface of the semiconductor substrate.

16. The semiconductor device according to claim 1, wherein the first, second and third protruding portions allow an increase in the channel region while maintaining a channel length without reducing depths of the protruding portions from a substrate surface.

17. The semiconductor device according to claim 9, wherein the protruding portions allow an increase in a channel region while maintaining a channel length without reducing depths of the protruding portions from a substrate surface.

* * * * *